(12) United States Patent
Kambe et al.

(10) Patent No.: US 12,402,428 B2
(45) Date of Patent: Aug. 26, 2025

(54) METHOD FOR MANUFACTURING LIGHT DETECTION DEVICE, LIGHT DETECTION DEVICE, AND ELECTRONIC DEVICE

(71) Applicant: SONY SEMICONDUCTOR SOLUTIONS CORPORATION, Kanagawa (JP)

(72) Inventors: Terumi Kambe, Kanagawa (JP); Takeshi Matsunuma, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 366 days.

(21) Appl. No.: 17/999,845

(22) PCT Filed: Jun. 3, 2021

(86) PCT No.: PCT/JP2021/021233
§ 371 (c)(1),
(2) Date: Nov. 23, 2022

(87) PCT Pub. No.: WO2021/251270
PCT Pub. Date: Dec. 16, 2021

(65) Prior Publication Data
US 2023/0300492 A1 Sep. 21, 2023

(30) Foreign Application Priority Data
Jun. 10, 2020 (JP) ................... 2020-100844

(51) Int. Cl.
*H10F 39/00* (2025.01)
*H01L 21/304* (2006.01)
(Continued)

(52) U.S. Cl.
CPC ..... *H10F 39/8063* (2025.01); *H01L 21/3043* (2013.01); *H01L 21/30604* (2013.01);
(Continued)

(58) Field of Classification Search
CPC .. H10F 39/807; H10F 39/802; H10F 39/8063; H10F 39/014; H10F 39/18
See application file for complete search history.

(56) References Cited

U.S. PATENT DOCUMENTS

2019/0378865 A1\* 12/2019 Zhang ............... H10F 39/151

FOREIGN PATENT DOCUMENTS

| JP | 2011-086709 A | 4/2011 |
| JP | 2012-028459 A | 2/2012 |

(Continued)

OTHER PUBLICATIONS

International Search Report and Written Opinion of PCT Application No. PCT/JP2021/021233, issued on Aug. 24, 2021, 08 pages of ISRWO.

*Primary Examiner* — Reema Patel
(74) *Attorney, Agent, or Firm* — CHIP LAW GROUP

(57) ABSTRACT

Provided is a method for manufacturing a light detection device capable of suppressing optical color mixing while improving sensitivity. On a substrate in which a plurality of photoelectric conversion units is formed, anisotropic etching is performed from one surface side of the substrate to form a plurality of openings arranged in a lattice shape at predetermined intervals on the substrate to surround each photoelectric conversion unit. Subsequently, isotropic etching is performed from one surface side of the substrate to connect adjacent openings to each other, to form a lattice-shaped trench part on the substrate to surround each photoelectric conversion unit.

20 Claims, 47 Drawing Sheets

(51) Int. Cl.
*H01L 21/306* (2006.01)
*H01L 21/308* (2006.01)

(52) U.S. Cl.
CPC ......... *H01L 21/308* (2013.01); *H10F 39/802* (2025.01); *H10F 39/807* (2025.01)

(56) References Cited

FOREIGN PATENT DOCUMENTS

| | | | |
|---|---|---|---|
| JP | 2013-175494 | A | 9/2013 |
| JP | 2015-099862 | A | 5/2015 |
| JP | 2016-187007 | A | 10/2016 |
| JP | 2019-087659 | A | 6/2019 |
| JP | 2020-077650 | A | 5/2020 |

\* cited by examiner

METHOD FOR MANUFACTURING LIGHT DETECTION DEVICE, LIGHT DETECTION DEVICE, AND ELECTRONIC DEVICE

CROSS REFERENCE TO RELATED APPLICATIONS

This application is a U.S. National Phase of International Patent Application No. PCT/JP2021/021233 filed on Jun. 3, 2021, which claims priority benefit of Japanese Patent Application No. JP 2020-100844 filed in the Japan Patent Office on Jun. 10, 2020. Each of the above-referenced applications is hereby incorporated herein by reference in its entirety.

TECHNICAL FIELD

The present technology relates to a method for manufacturing a light detection device, a light detection device, and an electronic device.

BACKGROUND ART

Conventionally, there has been proposed a light detection device including a substrate, a plurality of photoelectric conversion units formed in the substrate, and a lattice-shaped trench part formed on the substrate to surround each photoelectric conversion unit, in which an insulating film or metal is embedded in the trench part to reduce optical color mixing (see, for example, Patent Document 1).

In such a light detection device, the trench part is usually formed by performing etching using an etching mask having a lattice-shaped opening corresponding to a shape of the trench part.

CITATION LIST

Patent Document

Patent Document 1: Japanese Patent Application Laid-Open No. 2013-175494

SUMMARY OF THE INVENTION

Problems to be Solved by the Invention

However, in a case where etching is performed using the etching mask having a lattice-shaped opening at the time of forming the trench part, there is a possibility that a corner part of an intersection part of the trench part is rounded and an area of the corner part is reduced. Therefore, there is a possibility that vignetting of incident light occurs at the intersection part, and sensitivity is reduced.

An object of the present disclosure is to provide a method for manufacturing a light detection device capable of suppressing optical color mixing while improving sensitivity, a light detection device, and an electronic device.

Solutions to Problems

A method for manufacturing a light detection device according to the present disclosure includes: (a) performing, on a substrate in which a plurality of photoelectric conversion units is formed, anisotropic etching from one surface side of the substrate to form a plurality of openings arranged in a lattice shape at predetermined intervals on the substrate to surround each photoelectric conversion unit; and (b) performing isotropic etching from one surface side of the substrate to connect the openings adjacent to each other, to form a lattice-shaped trench part on the substrate to surround each photoelectric conversion unit.

Furthermore, a light detection device according to the present disclosure includes: (a) a substrate; (b) a plurality of photoelectric conversion units formed in the substrate; and (c) a lattice-shaped trench part formed on the substrate to surround each photoelectric conversion unit, in which (d) a cross-sectional shape of a side wall surface of the trench part in a cross section parallel to a light incident surface of the substrate is a concavo-convex shape in which concavity and convexity are repeated along a longitudinal direction of a linear trench part constituting the trench part.

Furthermore, an electronic device of the present disclosure includes: (a) a light detection device including a substrate, a plurality of photoelectric conversion units formed in the substrate, and a lattice-shaped trench part formed on the substrate to surround each photoelectric conversion unit, in which a cross-sectional shape of a side wall surface of the trench part in a cross section parallel to a light incident surface of the substrate is a concavo-convex shape in which concavity and convexity are repeated along a longitudinal direction of a linear trench part constituting the trench part; (b) an optical lens configured to form an image of image light from a subject, on an imaging surface of the light detection device; and (c) a signal processing circuit configured to perform signal processing on a signal outputted from the light detection device.

MODE FOR CARRYING OUT THE INVENTION

Hereinafter, an example of a light detection device and an electronic device according to an embodiment of the present disclosure will be described with reference to FIGS. 1, 2, 3, 4A, 4B, 5A, 5B, 6A, 6B, 7, 8A, 8B, 9, 10, 11A, 11B, 12A, 12B, 13A, 13B, 14A, 14B, 15, 16, 17, 18, 19, 20, 21A, 21B, 22A, 22B, 23, 24, 25, 26A, 26B, 27, 28, 29, 30, 31A, 31B, 32A, 32B, 33, 34A, 34B, 35A, 35B, 36, 37A, 37B, 37C, 38A, 38B, 38C, 39A, 39B, 39C, and 40. Embodiments of the present disclosure will be described in the following order. Note that the present disclosure is not limited to the following examples. Furthermore, the effects described in this specification are merely examples and are not limited, and other effects may be present.

Figure 1:
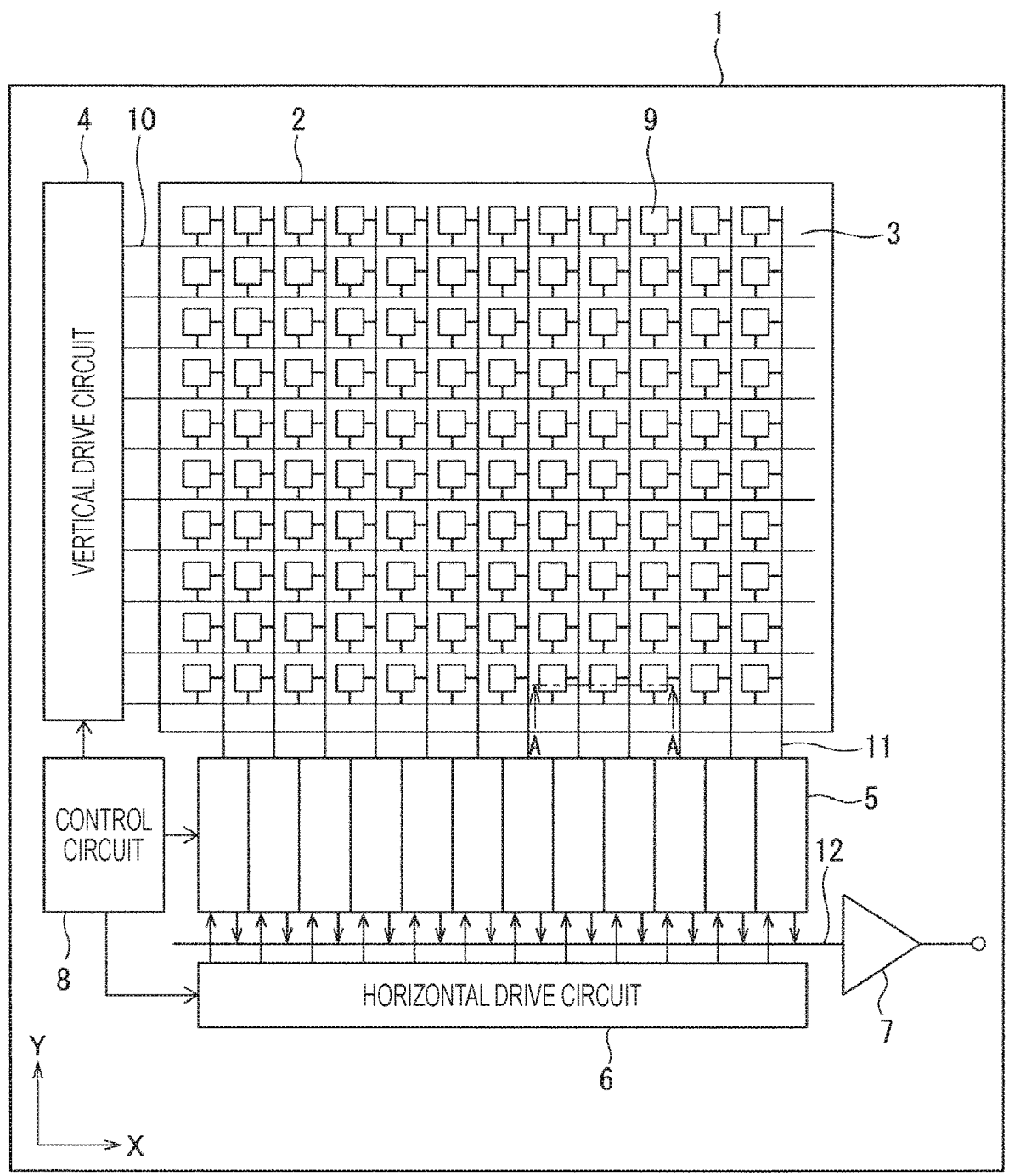
FIG. 1 is a diagram illustrating an overall configuration of a solid-state imaging device according to a first embodiment.

1. First embodiment: solid-state imaging device
1-1 Overall configuration of solid-state imaging device
1-2 Configuration of main part
1-3 Method for manufacturing solid-state imaging device
1-4 Modification
2. Second embodiment: solid-state imaging device
2-1 Configuration of main part
2-2 Method for manufacturing solid-state imaging device
2-3 Modification
3. Third Embodiment: application to electronic device 1. First Embodiment: Solid-State Imaging Device 1-1 Overall Configuration of Solid-State Imaging Device A solid-state imaging device 1 (in a broad sense, a "light detection device") according to a first embodiment of the present disclosure will be described. FIG. 1 is a schematic configuration diagram illustrating the entire solid-state imaging device 1 according to the first embodiment.

Figure 40:
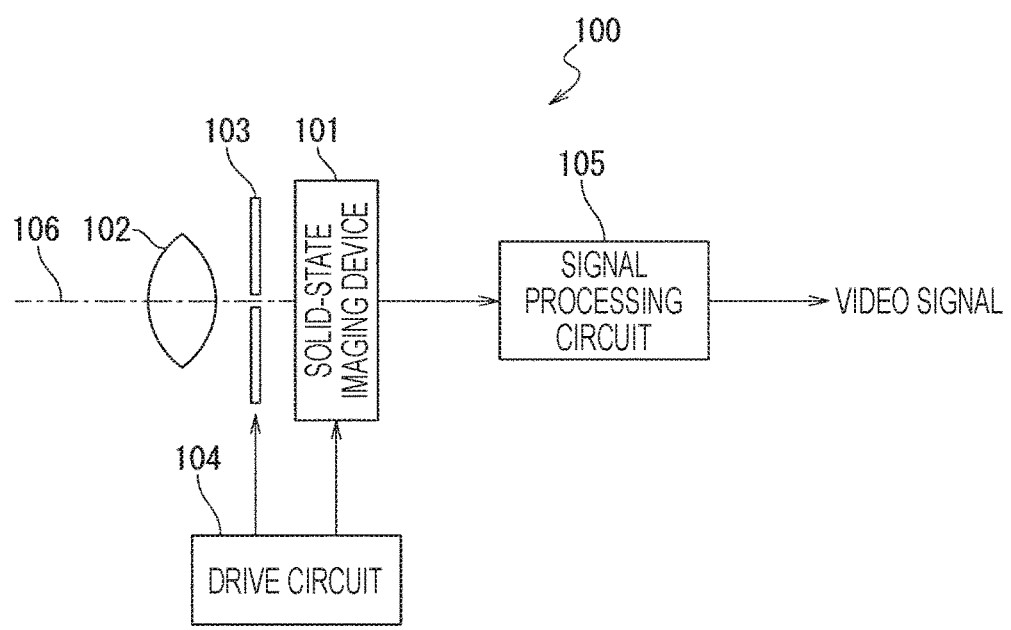
FIG. 40 is a diagram illustrating an overall configuration of an electronic device according to a third embodiment.

The solid-state imaging device 1 in FIG. 1 is a back-illuminated complementary metal oxide semiconductor (CMOS) image sensor. As illustrated in FIG. 40, the solid-state imaging device 1 (101) captures image light (incident light 106) from a subject via an optical lens 102, converts a light amount of the incident light 106 formed on an imaging surface into an electrical signal on a pixel basis, and outputs as a pixel signal.

As illustrated in FIG. 1, the solid-state imaging device 1 includes a substrate 2, a pixel region 3, a vertical drive circuit 4, a column signal processing circuit 5, a horizontal drive circuit 6, an output circuit 7, and a control circuit 8.

The pixel region 3 has a plurality of pixels 9 arranged in a two-dimensional matrix shape on the substrate 2. The pixel 9 includes a photoelectric conversion unit 23 illustrated in FIG. 2 and a plurality of pixel transistors (not illustrated). Examples of the pixel transistor include four transistors of a transfer transistor, a reset transistor, a selection transistor, and an amplification transistor.

The vertical drive circuit 4 includes, for example, a shift register, selects a desired pixel drive wiring 10, supplies a pulse for driving the pixels 9 to the selected pixel drive wiring 10, and drives each pixel 9 on a row basis. That is, the vertical drive circuit 4 selectively scans each pixel 9 in the pixel region 3 sequentially in a vertical direction on a row basis, and supplies a pixel signal based on a signal charge generated in accordance with an amount of received light in the photoelectric conversion unit 23 of each pixel 9, to the column signal processing circuit 5 through a vertical signal line 11.

The column signal processing circuit 5 is disposed, for example, for each column of the pixels 9, and performs signal processing such as noise removal on signals outputted from the pixels 9 of one line for each pixel column. For example, the column signal processing circuit 5 performs signal processing such as correlated double sampling (CDS) for removing fixed pattern noise unique to pixels, and analog-digital (AD) conversion.

The horizontal drive circuit 6 includes, for example, a shift register, sequentially outputs a horizontal scanning pulse to the column signal processing circuit 5, sequentially selects each of the column signal processing circuits 5, and causes each of the column signal processing circuits 5 to output a pixel signal subjected to signal processing to a horizontal signal line 12.

The output circuit 7 performs signal processing on pixel signals sequentially supplied from each of the column signal processing circuits 5 through the horizontal signal line 12, and outputs the pixel signals. As the signal processing, for example, buffering, black level adjustment, column variation correction, various types of digital signal processing, and the like can be used.

The control circuit 8 generates a clock signal and a control signal serving as a reference of operations of the vertical drive circuit 4, the column signal processing circuit 5, the horizontal drive circuit 6, and the like, on the basis of a vertical synchronization signal, a horizontal synchronization signal, and a master clock signal. Then, the control circuit 8 outputs the generated clock signal and control signal to the vertical drive circuit 4, the column signal processing circuit 5, the horizontal drive circuit 6, and the like.

1-2 Configuration of Main Part

Figure 2:
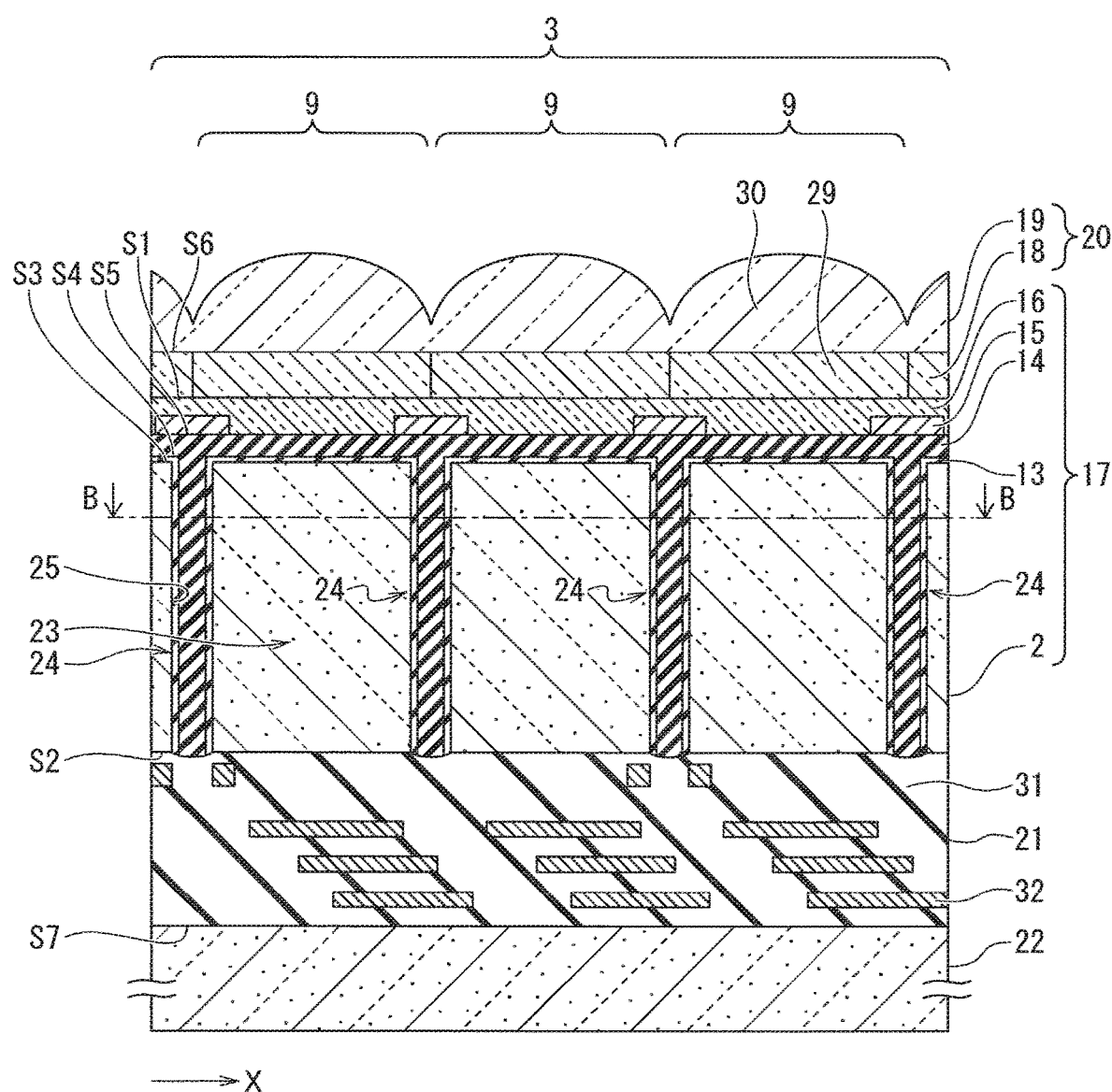
FIG. 2 is a view illustrating a cross-sectional configuration of a pixel region in a case of being cut along line A-A in FIG. 1.

Next, a detailed structure of the solid-state imaging device 1 in FIG. 1 will be described. FIG. 2 is a view illustrating a cross-sectional configuration of the solid-state imaging device 1 (the pixel region 3) in a case of being cut along line A-A in FIG. 1.

As illustrated in FIG. 2, the solid-state imaging device 1 includes a light receiving layer 17 formed by layering the substrate 2, a fixed charge film 13, an insulating film 14, a light shielding film 15, and a planarization film 16 in this order. Furthermore, a light condensing layer 20 in which a color filter layer 18 and a microlens array 19 are layered in this order is formed on a surface of the light receiving layer 17 on the planarization film 16 side (hereinafter, also referred to as a "back surface S1 side"). Moreover, a wiring layer 21 and a support substrate 22 are layered in this order on a surface of the light receiving layer 17 on the substrate 2 side (hereinafter, also referred to as a "front surface S2 side"). Note that, since the back surface S1 of the light receiving layer 17 and a back surface of the planarization film 16 are the same surface, the back surface of the planarization film 16 is also referred to as the "back surface S1" in the following description. Furthermore, since the front surface S2 of the light receiving layer 17 and a front surface of the substrate 2 are the same surface, the front surface of the substrate 2 is also referred to as the "front surface S2" in the following description.

The substrate 2 includes, for example, a semiconductor substrate made by silicon (S1), and is formed with the pixel region 3. In the pixel region 3, a plurality of pixels 9 is disposed in a two-dimensional matrix shape. Each pixel 9 includes the photoelectric conversion unit 23 and a plurality of pixel transistors (not illustrated). The photoelectric conversion unit 23 includes a p-type semiconductor region and an n-type semiconductor region, and a pn junction between the p-type semiconductor region and the n-type semiconductor region constitutes a photodiode. As a result, each of the photoelectric conversion units 23 generates a signal charge corresponding to an amount of incident light on the photoelectric conversion unit 23, and accumulates the generated signal charge in the n-type semiconductor region (a charge accumulation region).

Figure 3:
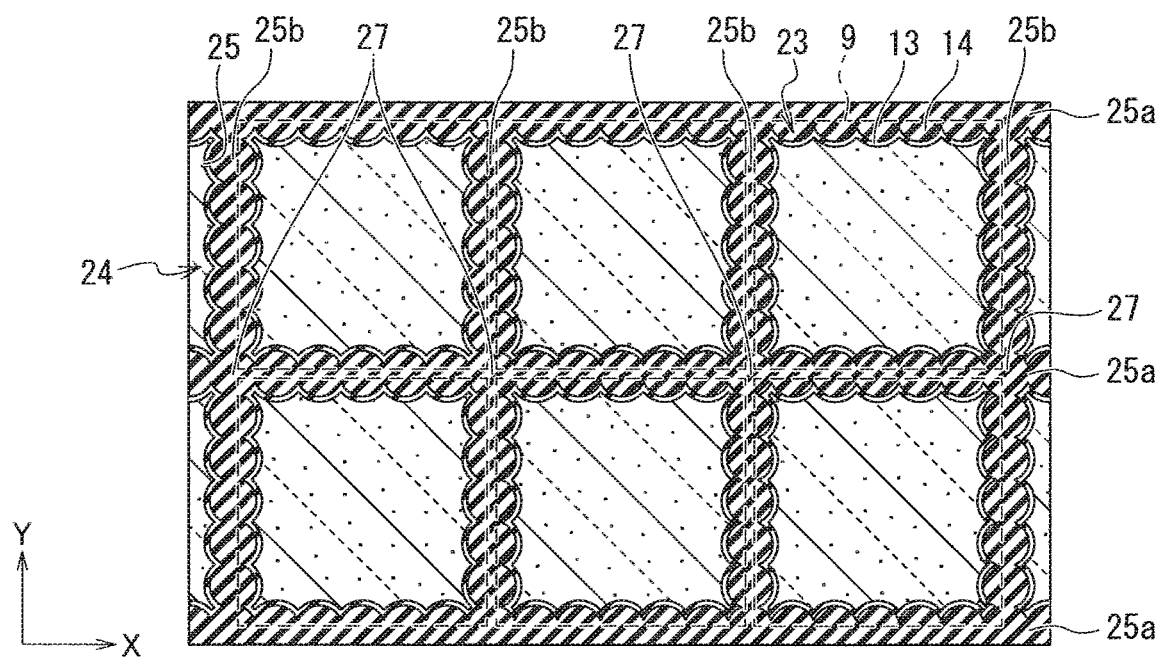
FIG. 3 is a view illustrating a planar configuration of the pixel region in a case of being cut along line B-B in FIG. 2.
Figure 4A:
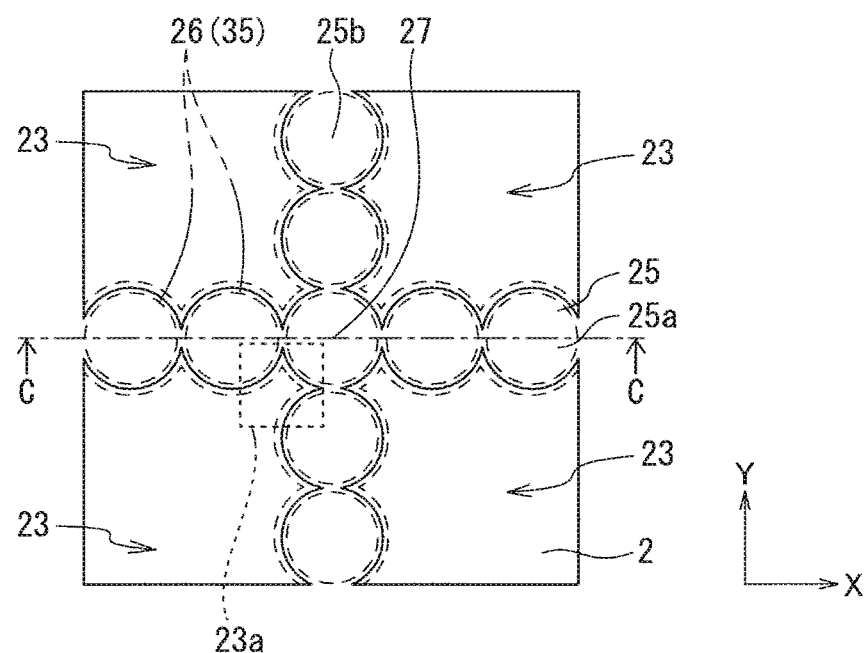
FIG. 4A is an enlarged view illustrating a planar configuration of an intersection part of a trench part illustrated in FIG. 3.

Furthermore, a pixel separation part 24 is formed between adjacent photoelectric conversion units 23. As illustrated in FIG. 3, the pixel separation part 24 is formed in a lattice shape on the substrate 2 so as to surround the individual pixels 9 (the photoelectric conversion units 23). The pixel separation part 24 has a trench part 25 penetrating in a thickness direction of the substrate 2. A side wall surface of the trench part 25 forms an outer shape of the pixel separation part 24. That is, the trench part 25 is formed in a lattice shape on the substrate 2 so as to surround the individual photoelectric conversion units 23. The lattice-shaped trench part 25 includes a plurality of linear trench parts 25a extending in a row direction of the pixels 9 and a plurality of linear trench parts 25b extending in a column direction of the pixels 9. As illustrated in FIG. 4A, each of the linear trench parts 25a and 25b is formed such that a plurality of vertical holes 26 extending in the thickness direction of the substrate 2 is aligned in a longitudinal direction of each of the linear trench parts 25a and 25b and adjacent vertical holes 26 are connected to each other.

FIG. 4A is an enlarged view illustrating an intersection part 27 (a portion where the linear trench part 25a and the linear trench part 25b intersect) of the trench part 25 of FIG. 3. In FIG. 4A, the fixed charge film 13 and the insulating film 14 are omitted for the intersection part 27. Due to the plurality of vertical holes 26, a cross-sectional shape of a side wall surface of the trench part 25 in a cross section parallel to a light incident surface (a back surface S3) of the substrate 2 is made a concavo-convex shape in which concavity and convexity are repeated along the longitudinal direction (a direction in which the trench part 25 extends) of each of the linear trench parts 25a and 25b constituting the trench part 25. Furthermore, a corner part 23a of the photoelectric conversion unit 23 at the intersection part 27 protrudes into a space in the intersection part 27.

By forming the concavo-convex shape, for example, as compared with a method of using the trench part 25 having a same trench width as a maximum width of the trench part 25 of the first embodiment and having a flat surface without concavity and convexity as a side wall surface, an area on a light incident surface side of the photoelectric conversion unit 23 can be increased by an amount of a convex part of the concavo-convex surface, and sensitivity can be increased. Furthermore, transmission of incident light can be blocked by the trench part 25, and optical color mixing can be suppressed. Furthermore, due to the concavity and convexity of the side wall surface of the trench part 25, for example, a reflection direction of incident light by the side wall surface can be made complicated as compared with a case where the side wall surface is a flat surface. Therefore, an optical path length of incident light entering the photoelectric conversion unit 23 can be extended, and sensitivity to a long-wavelength component (for example, infrared light or the like) can be improved.

As the vertical hole 26, for example, a cylindrical hole having a circular cross-sectional shape in the cross section parallel to the light incident surface (the back surface S3) of the substrate 2 can be adopted. In a case where the cylindrical hole is adopted, the cross-sectional shape (the concavo-convex shape) of the side wall surface of the trench part 25 is to be a wave shape in which arcs are continuous. A radius of the arc is preferably, for example, 50 nm or more and 150 nm or less. By forming the wave shape in which arcs having a radius of 50 nm or more and 150 nm or less are continuous, a reflection direction of incident light by the side wall surface of the trench part 25 can be made complicated, an optical path length of incident light can be further extended, and sensitivity to a long-wavelength component can be improved. In a case where metal is embedded in the trench part 25, the radius of the arc is preferably made 250 nm or more.

Figure 4B:
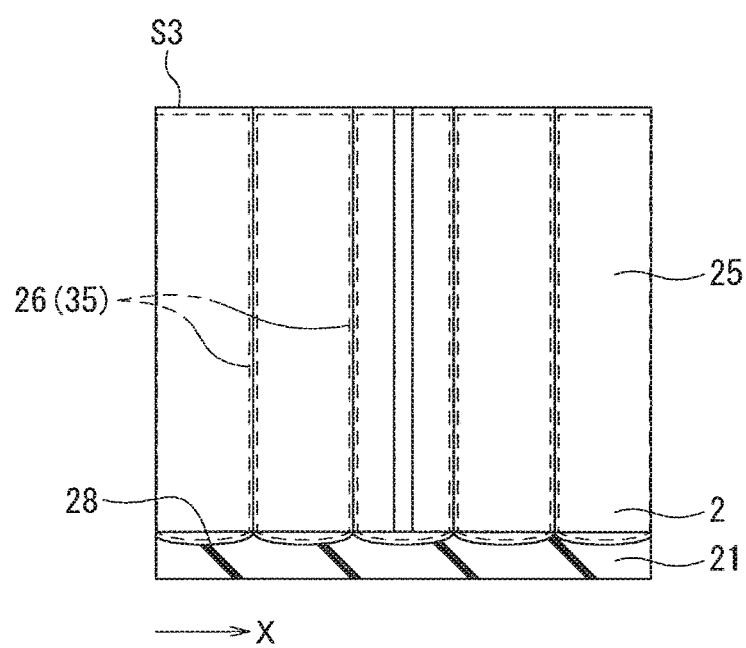
FIG. 4B is a view illustrating a cross-sectional configuration of a substrate in a case of being cut along line C-C in FIG. 4A.

Furthermore, due to the plurality of vertical holes 26, a plurality of concave parts 28 is formed on a bottom surface of the trench part 25 so as to be aligned in a longitudinal direction of each of the linear trench parts 25a and 25b constituting the trench part 25, as illustrated in FIG. 4B. Due to the plurality of concave parts 28, a cross-sectional shape of the bottom surface of the trench part 25 in a cross section perpendicular to the light incident surface (the back surface S3) of the substrate 2 is made a concavo-convex shape in which concavity and convexity are repeated along the longitudinal direction of each of the linear trench parts 25a and 25b constituting the trench part 25. As the concave part 28, for example, a parabolic concave part with a concave center can be adopted.

Furthermore, the fixed charge film 13 and the insulating film 14 that cover the back surface S3 side of the substrate 2 are embedded inside the trench part 25. Furthermore, a metal film that reflects light may be embedded in the insulating film 14. As the metal film, for example, tungsten (W) or aluminum (Al) can be adopted.

By adopting the pixel separation part 24, each photoelectric conversion unit 23 can be shielded from light, and optical color mixing can be suppressed.

The fixed charge film 13 continuously covers the entire back surface S3 side (the entire light incident surface side) of the substrate 2 and the inside of the trench part 25. As a material of the fixed charge film 13, for example, hafnium (Hf), aluminum (Al), zirconium (Zr), tantalum (Ta), or titanium (Ti) can be adopted. Furthermore, the insulating film 14 continuously covers an entire back surface S4 side (the entire light incident surface side) of the fixed charge film 13 and the inside of the trench part 25. As a material of the insulating film 14, for example, silicon oxide ($SiO_2$), silicon nitride ($Si_3N_4$), or silicon oxynitride (SiON) can be adopted.

The light shielding film 15 is formed in a lattice shape that opens the light incident surface side of each of the plurality of photoelectric conversion units 23, in a part of the insulating film 14 on a back surface S5 side so that light does not leak into the adjacent pixels 9. Furthermore, the planarization film 16 continuously covers the entire back surface S5 side (the entire light incident surface side) of the insulating film 14 including the light shielding film 15 such that the back surface S1 of the light receiving layer 17 is a flat surface without concavity and convexity.

The color filter layer 18 has a color filter 29 for each pixel 9 on the back surface S1 side (the light incident surface side) of the planarization film 16. Each of the color filters 29 is configured to transmit wavelengths of red light, green light, blue light, and the like, and cause the transmitted incident light to be incident on the photoelectric conversion unit 23.

The microlens array 19 includes a microlens 30 for the each pixel 9 on a back surface S6 side (the light incident surface side) of the color filter layer 18. Each of the microlenses 30 is configured to condense image light (incident light) from a subject into the photoelectric conversion unit 23.

The wiring layer 21 is formed on the front surface S2 side of the substrate 2, and includes an interlayer insulating film 31 and a wiring 32 that is layered in a plurality of layers with the interlayer insulating film 31 interposed in between. Then, the wiring layer 21 drives a pixel transistor constituting each pixel 9 via the plurality of layers of the wiring 32.

The support substrate 22 is formed on a surface of the wiring layer 21 on a side opposite to a side facing the substrate 2. The support substrate 22 is a substrate for securing strength of the substrate 2 at a manufacturing stage of the solid-state imaging device 1. As a material of the support substrate 22, for example, silicon (S1) can be used.

In the solid-state imaging device 1 having the above configuration, light is emitted from the back surface S1 side of the substrate 2 (the back surface S1 side of the light receiving layer 17), the emitted light passes through the microlens 30 and the color filter 29, and the transmitted light is photoelectrically converted by the photoelectric conversion unit 23 to generate a signal charge. Then, the generated signal charge is outputted as a pixel signal by the vertical signal line 11 illustrated in FIG. 1, which is formed by the wiring 32, via the pixel transistor or the like formed on the front surface S2 side of the substrate 2.

Furthermore, the solid-state imaging device 1 according to the first embodiment has been made to have a back-illuminated structure, that is, a structure in which incident light is incident from the back surface S3 side of the substrate 2 with, as a light incident surface, the back surface S3 of the substrate 2 opposite to the front surface S2 of the substrate 2 in which the wiring layer 21 is formed. Therefore, incident light is incident on the photoelectric conversion unit 23 without being restricted by the wiring layer 21. Therefore, the opening of the photoelectric conversion unit 23 can be made wide, and for example, higher sensitivity can be achieved than that of a front-illuminated type.

1-3 Method for Manufacturing Solid-State Imaging Device

Next, a method for manufacturing the solid-state imaging device 1 according to the first embodiment will be described. Here, a case of manufacturing the solid-state imaging device 1 in which a width of the trench part 25 is 160 nm will be exemplified.

Figure 5A:
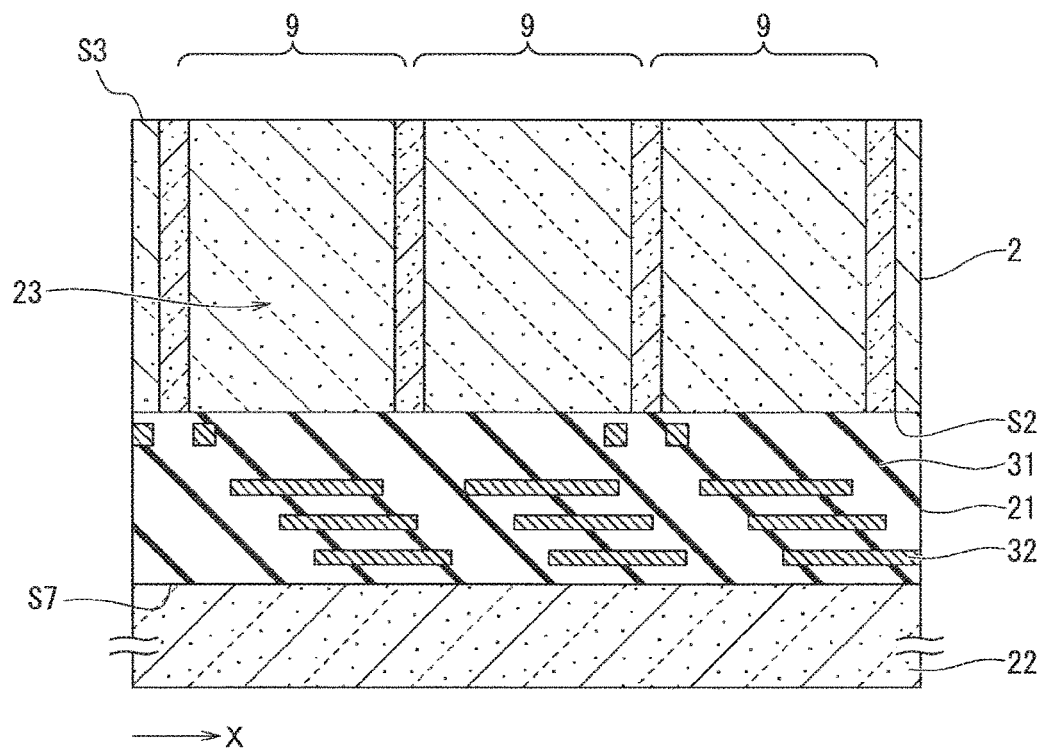
FIG. 5A is a view illustrating each step of a method for manufacturing a solid-state imaging device according to the first embodiment.

First, as illustrated in FIG. 5A, ion implantation of impurities is performed from the front surface S2 side (another surface side) of the substrate 2 to form the photoelectric conversion unit 23, a pixel transistor (not illustrated), and the like in the substrate 2. Subsequently, the interlayer insulating film 31 and the wiring 32 are alternately formed on the front surface S2 of the substrate 2 to form the wiring layer 21. Subsequently, the support substrate 22 is bonded to an outermost surface S7 of the wiring layer 21, and a layered body including the substrate 2, the wiring layer 21, and the support substrate 22 is formed. Subsequently, the formed layered body is inverted, and the inverted substrate 2 is polished from the back surface S3 side (one surface side) to be thinned to a desired thickness.

Figure 5B:
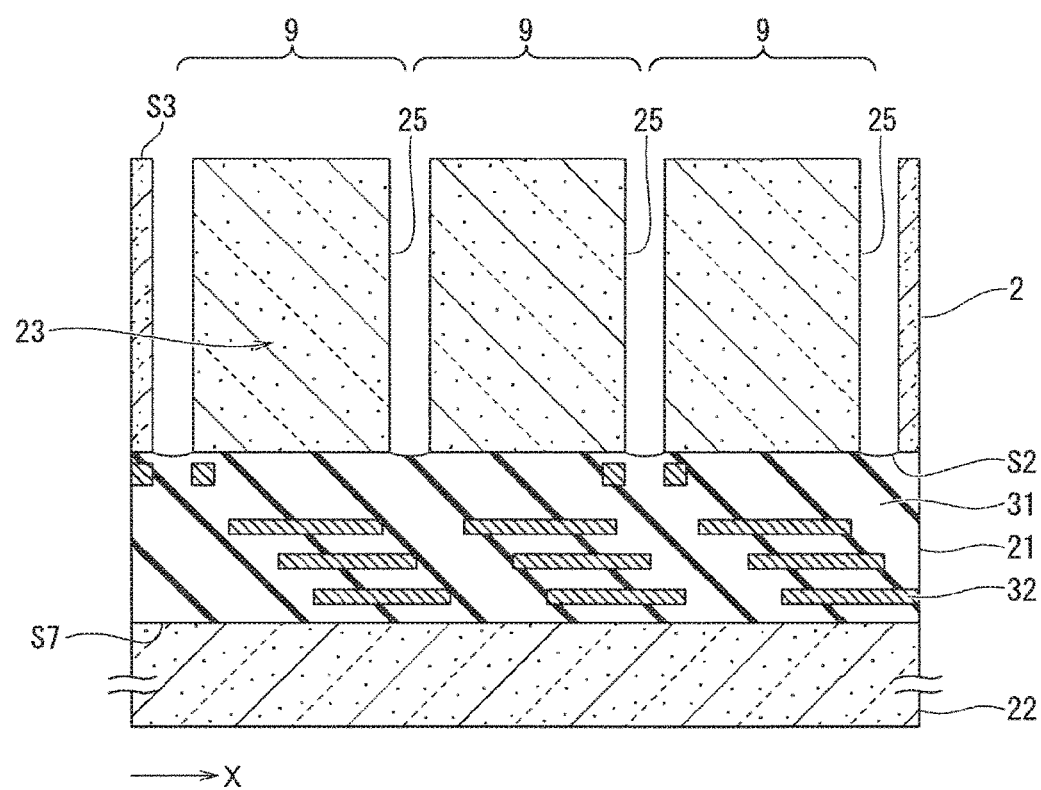
FIG. 5B is a view illustrating each step of the method for manufacturing the solid-state imaging device according to the first embodiment.
Figure 6A:
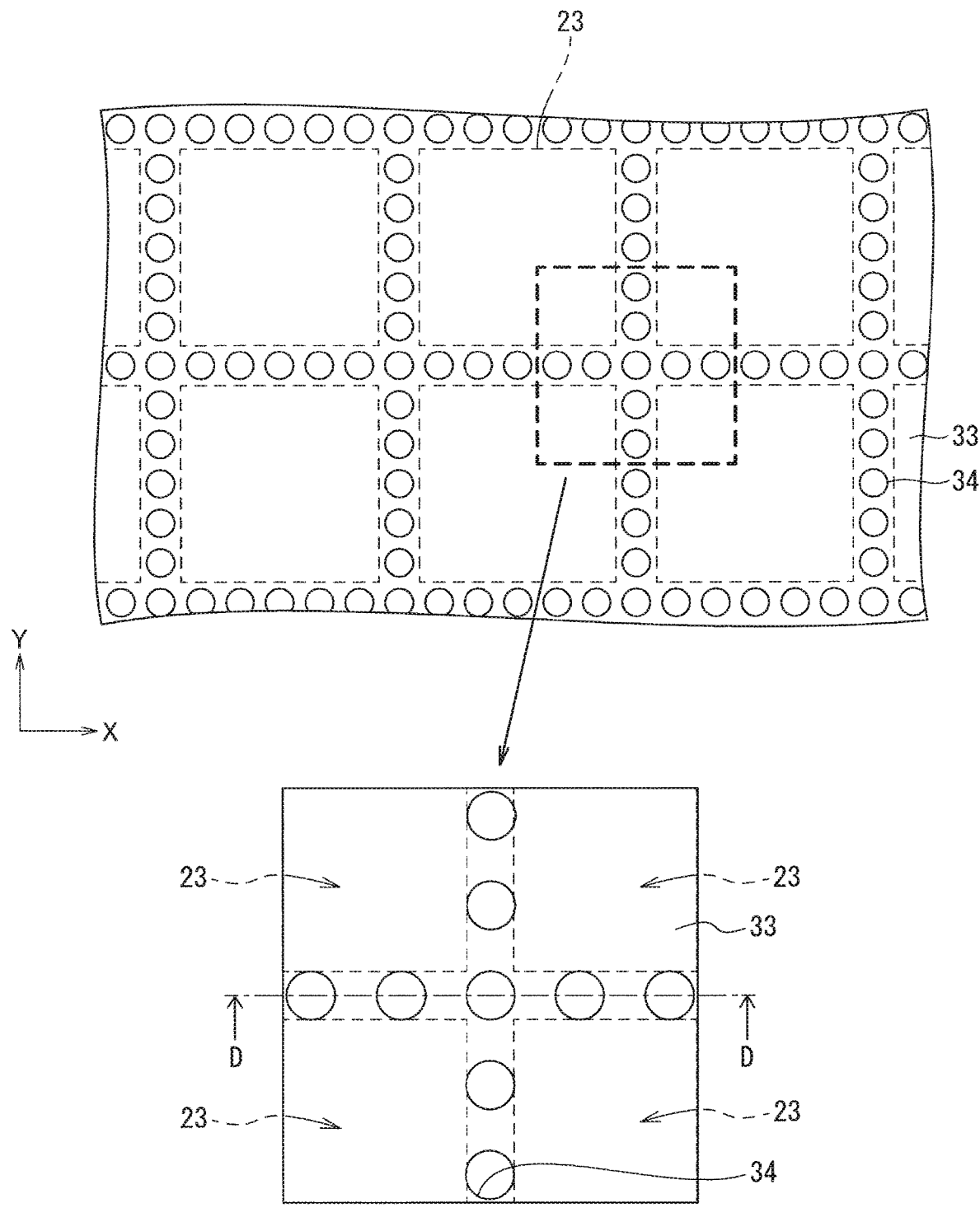
FIG. 6A is a view illustrating a planar configuration of an etching mask formed on a back surface of the substrate.
Figure 6B:
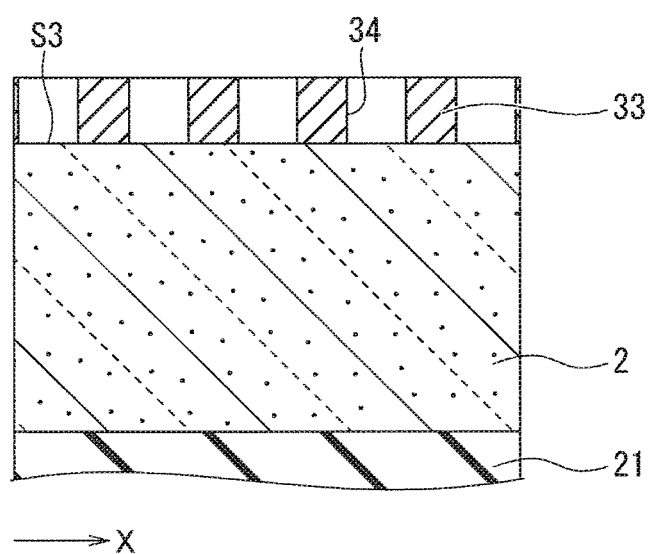
FIG. 6B is a view illustrating a cross-sectional configuration of the substrate in a case of being cut along line D-D in FIG. 6A.
Figure 7:
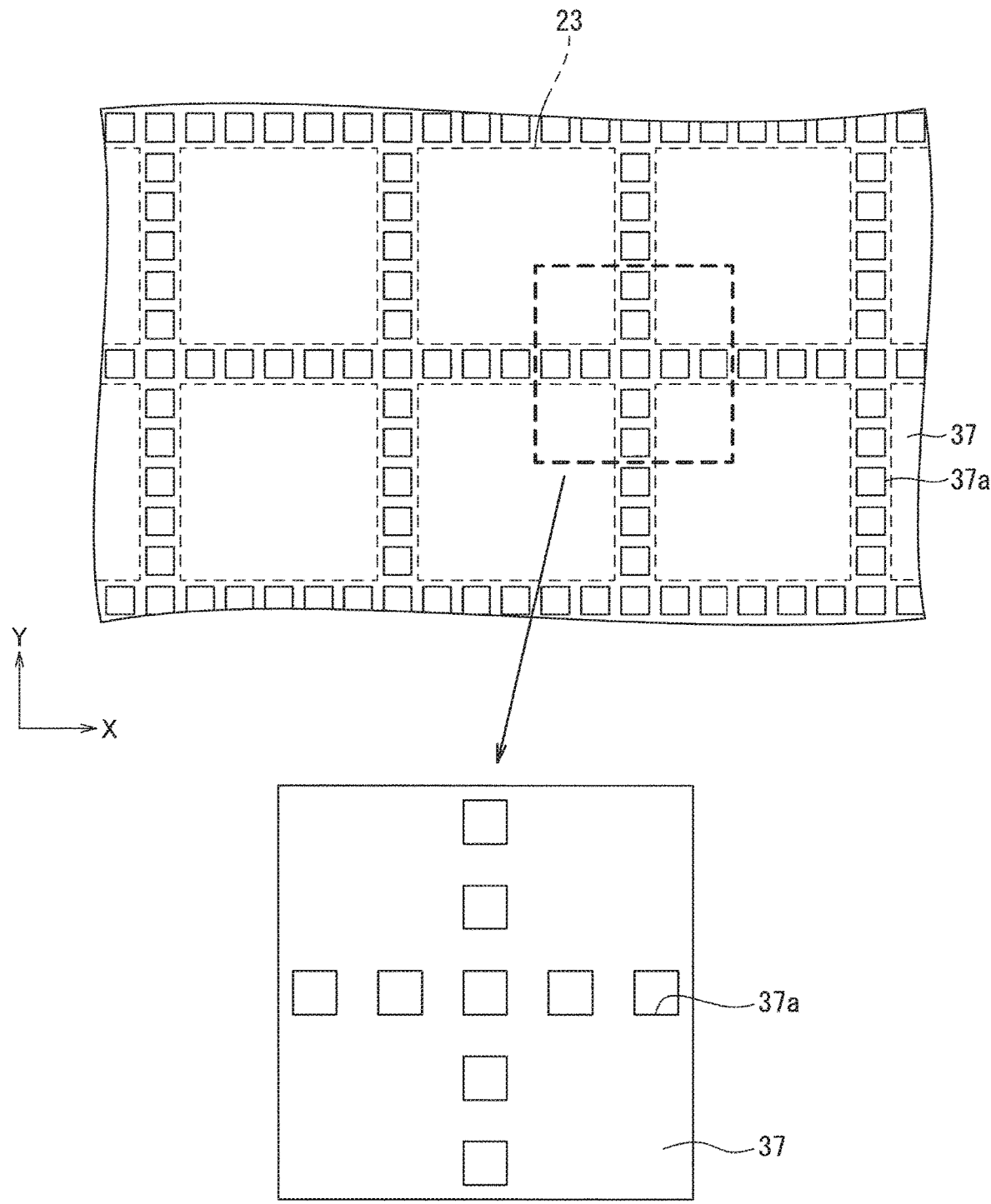
FIG. 7 is a view illustrating a photomask for forming a resist mask illustrated in FIG. 6A.

Subsequently, as illustrated in FIG. 5B, at a boundary of the individual pixels 9 of the substrate 2, the substrate 2 is selectively etched from the back surface S3 side of the substrate 2, thereby forming the lattice-shaped trench part 25 surrounding the individual photoelectric conversion units 23. Specifically, first, as illustrated in FIGS. 6A and 6B, a resist film 33 is formed on the back surface S3 of the substrate 2, and a pattern is formed on the formed resist film 33 by a photolithography method. FIG. 6B is a view illustrating a cross section of the substrate 2 cut along line D-D in FIG. 6A. In the pattern formation, the plurality of openings 34 is formed at intervals from one another along a position where the trench part 25 is formed on the resist film 33. That is, when viewed from the back surface S3 side of the substrate 2, the plurality of openings 34 arranged in a lattice shape at predetermined intervals is formed on the resist film 33 so as to surround the individual photoelectric conversion units 23. In FIG. 6A, a case where a shape of the opening 34 is made circular is exemplified. In a case where the opening 34 of the resist film 33 is circular, the resist film 33 is exposed using a photomask 37 having a polygonal pattern 37a, as illustrated in FIG. 7. In FIG. 7, a case where a square pattern is used as the polygonal pattern 37a is exemplified. In a case where exposure is performed using the photomask 37 having the polygonal pattern 37a (for example, a square pattern), a circular pattern in which corner parts of the polygonal pattern 37a (the square pattern) are rounded is transferred to the resist film 33. Furthermore, in FIG. 6A, the opening 34 is formed at a position corresponding to a center of the intersection part 27 of the trench part 25. A diameter of the opening 34 (a circle) is 100 nm, and a distance between the openings 34 is 100 nm.

Figure 8A:
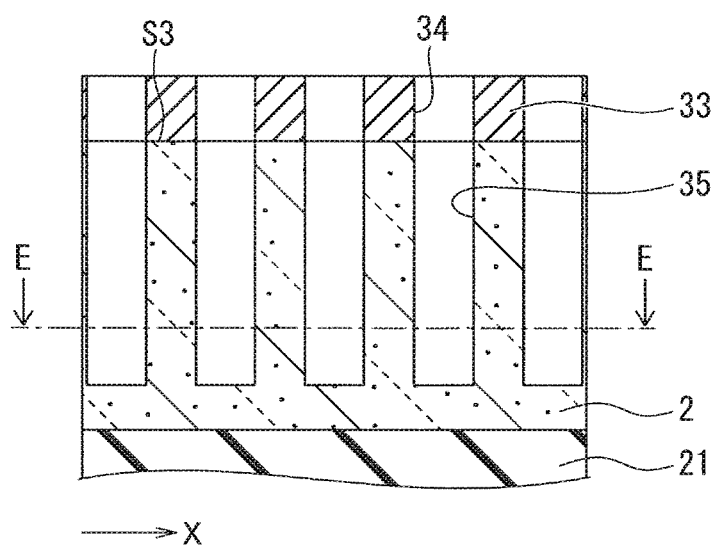
FIG. 8A is a view illustrating a cross-sectional configuration of the substrate after anisotropic etching.
Figure 8B:
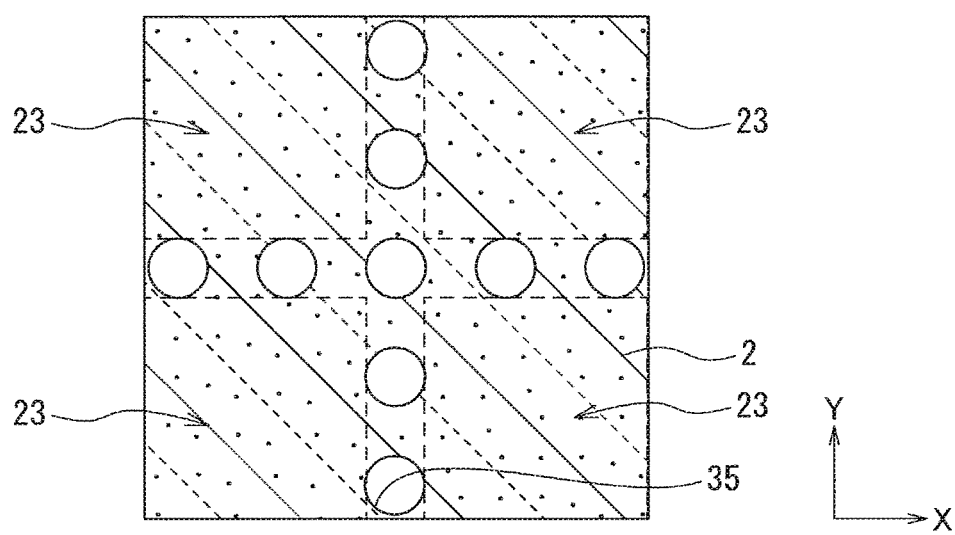
FIG. 8B is a view illustrating a cross-sectional configuration of the substrate in a case of being cut along line E-E in FIG. 8A.

Subsequently, as illustrated in FIG. 8A, anisotropic etching is performed on the substrate 2 from the back surface S3 side of the substrate 2, by using, as an etching mask, the resist film 33 in which the plurality of openings 34 is formed. As the anisotropic etching, for example, anisotropic etching using a reactive ion etching (RIE) device can be adopted. By the anisotropic etching, an opening 35 (a cylindrical opening 35) having the same cross-sectional shape as the shape of the opening 34 of the etching mask (the resist film 33) is formed on the substrate 2. A depth of the opening 35 is shallower by about 50 nm than a depth reaching an interface between the substrate 2 and the wiring layer 21. That is, the depth is reduced by a half of a distance between the openings 35. As a result, as illustrated in FIG. 8B, a plurality of openings 35 arranged in a lattice shape at predetermined intervals is formed on the substrate 2 so as to surround the individual photoelectric conversion units 23. FIG. 8B is a view illustrating a cross section of the substrate 2 cut along line E-E in FIG. 8A.

Figure 9:
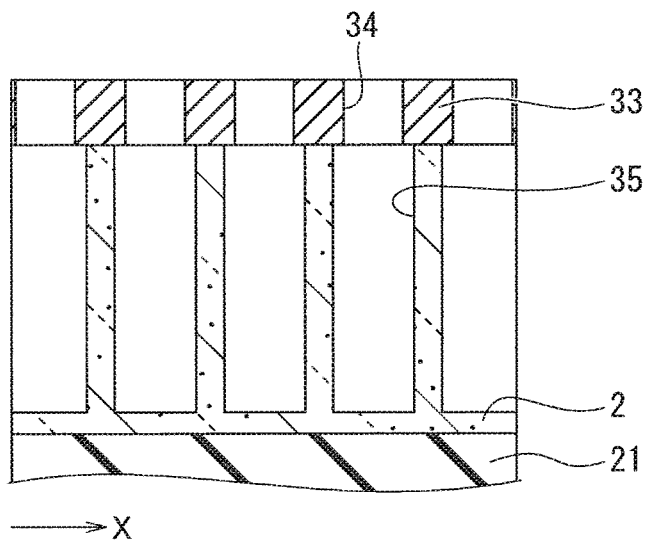
FIG. 9 is a view illustrating a cross-sectional configuration of the substrate after isotropic etching.

Subsequently, as illustrated in FIG. 9, isotropic etching is performed on the substrate 2 from the back surface S3 side of the substrate 2, by using, as an etching mask, the etching mask (the resist film 33) used for the anisotropic etching as it is. As an etching agent for isotropic etching, for example, hydrofluoric acid can be adopted. By the isotropic etching, a side wall surface and a bottom surface of the opening 35 are etched in the substrate 2. An etching amount of the side wall surface of the opening 35 and an etching amount of the bottom surface of the opening 35 are 50 nm+over-etching of 20%. As a result, as illustrated in FIGS. 4A and 4B, adjacent openings 35 (vertical holes 26) are connected to each other, so that the lattice-shaped trench part 25 is formed on the substrate 2 so as to surround the photoelectric conversion units 23. The trench part 25 is formed such that the plurality of openings 35 (vertical holes 26) extending in the thickness direction of the substrate 2 is aligned in the longitudinal direction of each of the linear trench parts 25a and 25b constituting the trench part 25, and adjacent vertical holes 26 are connected to each other. Therefore, for example, as compared with a method of using the trench part 25 having the same trench width as the maximum width of the trench part 25 of the first embodiment and having a flat surface without concavity and convexity as a side wall surface, an area on the light incident surface side of the photoelectric conversion unit 23 can be increased by an amount of the convex part of the concavo-convex surface, and the sensitivity can be further increased. Furthermore, a reflection direction of incident light by the side wall surface of the trench part 25 can be made complicated, an optical path length of incident light entering the photoelectric conversion unit 23 can be extended, and sensitivity to a long-wavelength component (for example, infrared light or the like)

can be improved. Note that, since an over-etching amount of the bottom surface of the trench part 25 is 20% of 50 nm, it is about 10 nm.

Subsequently, the etching mask is removed from the substrate 2, the fixed charge film 13 and the insulating film 14 are formed so as to continuously cover the side wall surface and the bottom surface of the trench part 25 and the entire back surface S3 side (the light receiving surface side) of the substrate 2, and the pixel separation part 24 having the trench part 25 is formed. Subsequently, after a light-shielding material layer is formed on the entire back surface S5 side of the insulating film 14, the light-shielding material layer is patterned into a desired shape. Thereafter, by forming the planarization film 16, the color filter layer 18, and the microlens array 19 on the back surface S3 side of the substrate 2, the solid-state imaging device 1 illustrated in FIG. 2 is completed.

As described above, in the method for manufacturing the solid-state imaging device 1 according to the first embodiment, first, by performing anisotropic etching from the back surface S3 side (one surface side) of the substrate 2, the plurality of openings 35 arranged at predetermined intervals from one another is formed on the substrate 2 so as to surround each photoelectric conversion unit 23. Subsequently, by performing isotropic etching from the back surface S3 side (one surface side) of the substrate 2 to connect the adjacent openings 35, the trench part 25 is formed along an arrangement direction of the openings 35 on the substrate 2 so as to surround the individual photoelectric conversion units 23.

In other words, it can be said that the plurality of openings 35 arranged at predetermined intervals from one another is formed on the substrate 2 by performing anisotropic etching from one surface side of the substrate 2, and then the trench part 25 is formed along the arrangement direction of the openings 35 on the substrate 2 by performing isotropic etching from one surface side of the substrate 2 to connect the adjacent openings 35 to each other.

As a result, the corner part 23a of the intersection part 27 of the trench part 25 can be suppressed from being rounded, and an area of the corner part 23a can be increased. Therefore, vignetting of incident light by the intersection part 27 can be suppressed, and sensitivity can be improved. Furthermore, transmission of incident light can be blocked by the trench part 25, and optical color mixing can be suppressed. Therefore, it is possible to manufacture the solid-state imaging device 1 capable of suppressing optical color mixing while improving sensitivity. That is, it is possible to manufacture the solid-state imaging device 1 capable of improving characteristics such as improvement of sensitivity and reduction of optical color mixing.

Figure 10:
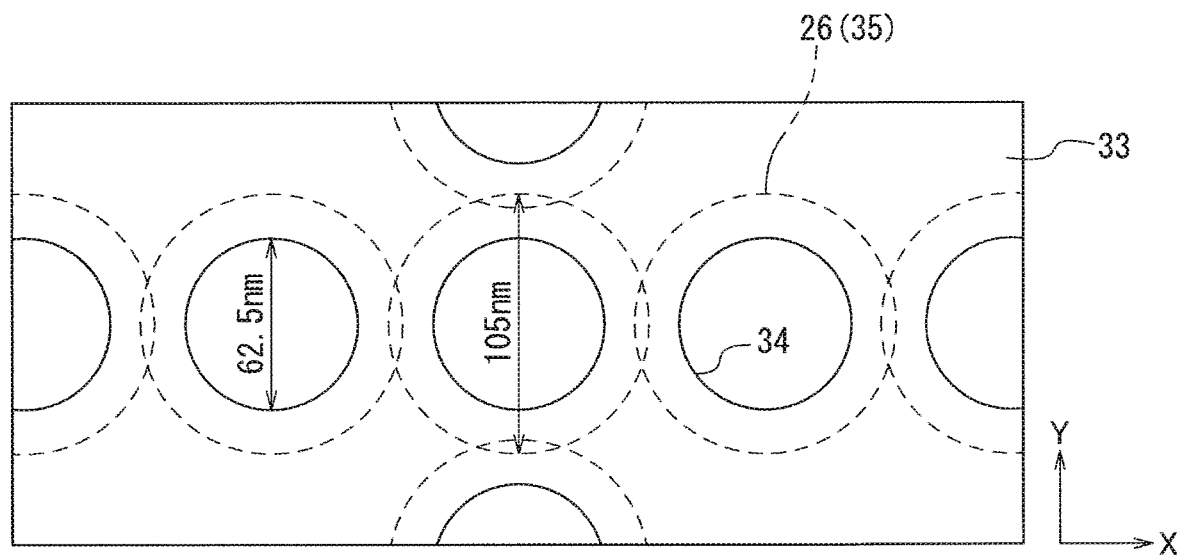
FIG. 10 is a view illustrating a width of a trench part obtained by the method for manufacturing the solid-state imaging device according to the first embodiment.

Furthermore, according to Rayleigh's equation: resolution (minimum pattern)=k1·λ/NA, a resolution of a transfer image by a light exposure device is to be resolution (minimum pattern)=35.7 nm, in a case where k1=0.25, λ=193, and NA=1.35 are assumed. However, in practice, 35.7 nm is difficult to achieve by the current process technology, and a current guaranteed minimum line width is 55 nm for a line and 90 nm for a hole in a case where an ArF laser is used, and 35 nm for a line and 62.5 nm for a hole in a case where immersion is used. Therefore, in the method for manufacturing the solid-state imaging device 1 according to the first embodiment, in a case where the width of the trench part 25 is minimized, as illustrated in FIG. 10, an etching mask (the resist film 33) is used in which the opening 34 is a hole (a circle) having a diameter of 62.5 nm and a distance between the openings 34 is 35 nm. In this case, when the openings 35 come into contact with each other by the isotropic etching, the diameter of the opening 35 is to be 97.5 nm. Furthermore, when the over-etching of 20% is finished, the diameter of the opening 35 is to be about 105 nm. In FIG. 10, the opening 35 after the over-etching of 20% is finished is indicated by a broken line. Here, for example, according to a conventional method of forming the trench part 25 by using an etching mask having lattice-shaped openings, the minimum line width of the trench part 25 is 100 nm to 110 nm. Therefore, according to the solid-state imaging device 1 according to the first embodiment, it is possible to increase an area of the photoelectric conversion unit 23 on the light incident surface side while achieving a width similar to the minimum line width by the conventional method, and it is possible to improve the sensitivity.

Furthermore, in a case where a metal such as tungsten (W) is embedded in the trench part 25, a width of 500 nm or more is required, but the sensitivity can be similarly improved even in a case where the width is 500 nm or more.

Furthermore, since the trench part 25 is formed by connecting the openings 35 after the openings 35 are formed, a microloading effect can be prevented, excessive etching of the intersection part 27 can be prevented, and the depth of the trench part 25 can be made uniform. Therefore, for example, in a case where the substrate 2 is etched by an amount of a thickness of the substrate 2, the excessive depth of the intersection part 27 can be prevented.

In this regard, for example, according to a method of forming the trench part 25 by using the etching mask having lattice-shaped openings, etching in a depth direction of the intersection parts 27 becomes excessive due to the microloading effect. Specifically, for example, in a case where over-etching of 5 nm is performed on portions other than the intersection part 27, over-etching of 15 nm is performed on the intersection part 27. Therefore, for example, if an etching time is reduced in consideration of the etching amount of the intersection part 27, a portion other than the intersection part 27 is not etched to a sufficient depth, and a structure disadvantageous for suppressing optical color mixing and the like is obtained.

Furthermore, in the method for manufacturing the solid-state imaging device 1 according to the first embodiment, anisotropic etching and isotropic etching have been performed by using the etching mask formed on the back surface S3 (one surface) of the substrate 2 and having the plurality of openings 34 arranged in a lattice shape at predetermined intervals so as to surround the individual photoelectric conversion units 23 when viewed from the one surface side of the substrate 2. As a result, a photolithography step and an etching step (a step including both anisotropic etching and isotropic etching) only need to be performed once, so that an increase in the number of steps can be suppressed. Furthermore, rectangularity of the corner part 23a of the intersection part 27 of the trench part 25 and a shape of the side wall surface of the trench part 25 can be easily changed by a shape (a pattern shape) of the opening 34 of the etching mask.

In this regard, for example, in a method of forming the linear trench parts 25a with anisotropic etching by using an etching mask having only openings corresponding to the linear trench parts 25a extending in the row direction of the pixels 9, and then forming the linear trench parts 25b with anisotropic etching by using an etching mask having only openings corresponding to the linear trench parts 25b extending in the column direction, the corner part 23a of the intersection part 27 of the trench part 25 can be suppressed from being rounded, but it is necessary to perform each of the photolithography step and the etching step twice, and the number of steps increases.

Furthermore, in the solid-state imaging device 1 according to the first embodiment, the cross-sectional shape of the side wall surface of the trench part 25 in the cross section parallel to the back surface S3 (the light incident surface) of the substrate 2 has been made a concavo-convex shape in which concavity and convexity are repeated along the longitudinal direction of each of the linear trench parts 25*a* and 25*b* constituting the trench part 25. As a result, for example, as compared with a method of using the trench part 25 having the same trench width as the maximum width of the trench part 25 of the first embodiment and having a flat surface without concavity and convexity as a side wall surface, an area on the light incident surface side of the photoelectric conversion unit 23 can be increased by an amount of the convex part of the concavo-convex surface, and the sensitivity can be increased. Furthermore, transmission of incident light can be blocked by the trench part 25, and optical color mixing can be suppressed. Therefore, it is possible to provide the solid-state imaging device 1 capable of suppressing optical color mixing while improving sensitivity. That is, it is possible to provide the solid-state imaging device 1 capable of improving characteristics such as improvement of sensitivity and reduction of optical color mixing.

1-4 Modification (1) Note that, in the first embodiment, an example has been described in which the etching mask (the resist film 33) is removed after isotropic etching, but other configurations can also be adopted. For example, a configuration may also be adopted in which isotropic etching and removal of the etching mask (the resist film 33) are performed simultaneously. That is, the step of removing the resist film 33 may be immediately started after the anisotropic etching is finished, and the isotropic etching of the substrate 2 may be performed together with the removal of the resist film 33.

Furthermore, an example has been described in which a resist mask made with the resist film 33 is used as the etching mask, but other configurations can also be adopted. For example, a hard mask may be used.

Figure 11A:
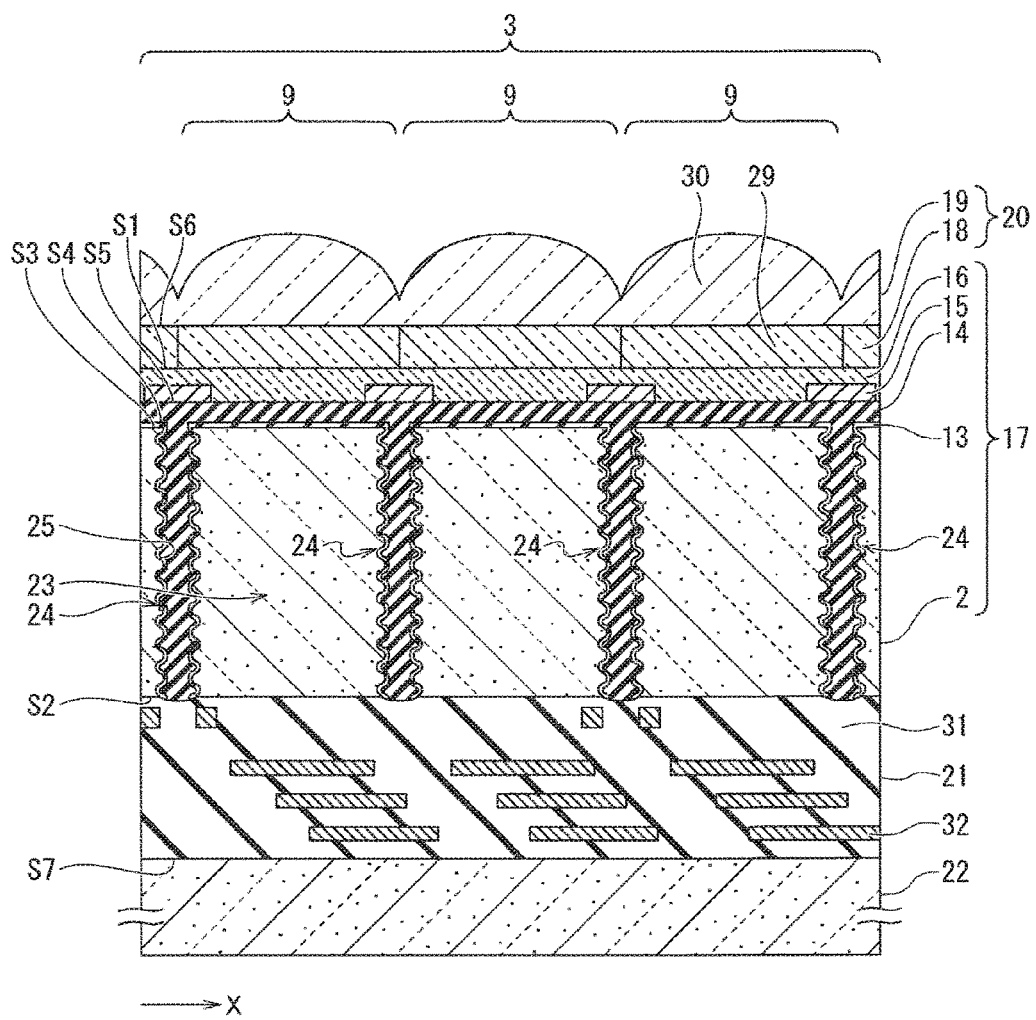
FIG. 11A is a view illustrating a cross-sectional configuration of a pixel region of a solid-state imaging device according to a modification.

(2) Furthermore, in the first embodiment, an example has been described in which the cross-sectional shape of the side wall surface of the trench part 25 in the cross section parallel to the light incident surface (the back surface S3) of the substrate 2 is made a concavo-convex shape (hereinafter, also referred to as a "first concavo-convex shape") in which concavity and convexity are repeated along the longitudinal direction of each of the linear trench parts 25*a* and 25*b* constituting the trench part 25, but other configurations may also be adopted. For example, as illustrated in FIG. 11A, in addition to the first concavo-convex shape, the cross-sectional shape of the side wall surface of the trench part 25 in the cross section perpendicular to the light incident surface (the back surface S3) of the substrate 2 may be made a concavo-convex shape (hereinafter, also referred to as a "second concavo-convex shape") in which concavity and convexity are repeated along a depth direction of the trench part 25. With the configuration having the second concavo-convex shape, a reflection direction of incident light by the side wall surface of the trench part 25 can be made further complicated, an optical path length of incident light can be further extended, and the sensitivity to a long-wavelength component can be improved.

Figure 11B:
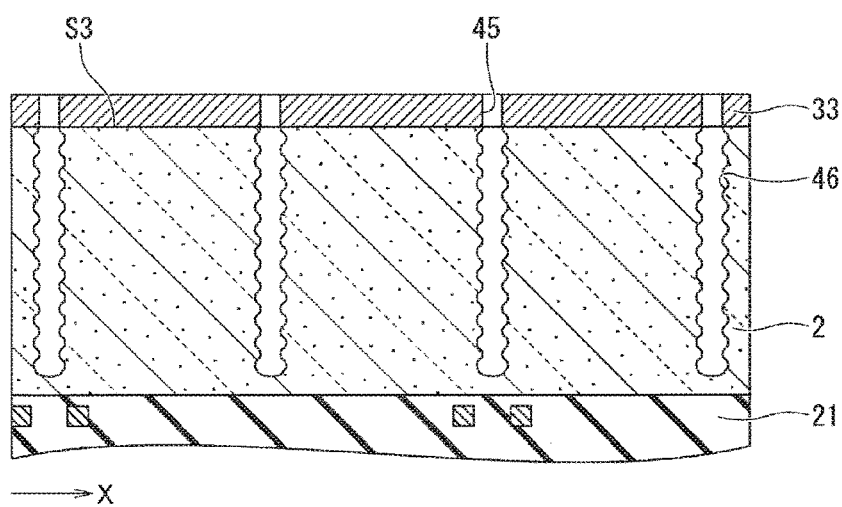
FIG. 11B is a view illustrating a step of forming the trench part illustrated in FIG. 11A.

As a method of forming the second concavo-convex shape, for example, a method can be adopted in which a concave part called a scallop is formed on the side wall surface of the opening 35 as illustrated in FIG. 11B, by performing anisotropic etching performed in the step of forming the trench part 25 by using a Bosch process. The Bosch process is a method of forming a deep and narrow groove on the substrate 2 by repeating etching of the substrate 2, formation of a protective film in a concave part formed by the etching, and removal of the protective film from a bottom surface of the concave part. Since the etching selectively proceeds in a depth direction of the substrate 2, the etching by the Bosch process can be said to be substantially anisotropic etching. By forming the scallop on the side wall surface of the opening 35, as illustrated in FIG. 11A, the opening 35 is widened while concavity and convexity of the scallop are maintained in isotropic etching, and the second concavo-convex shape can be formed.

Figure 12A:
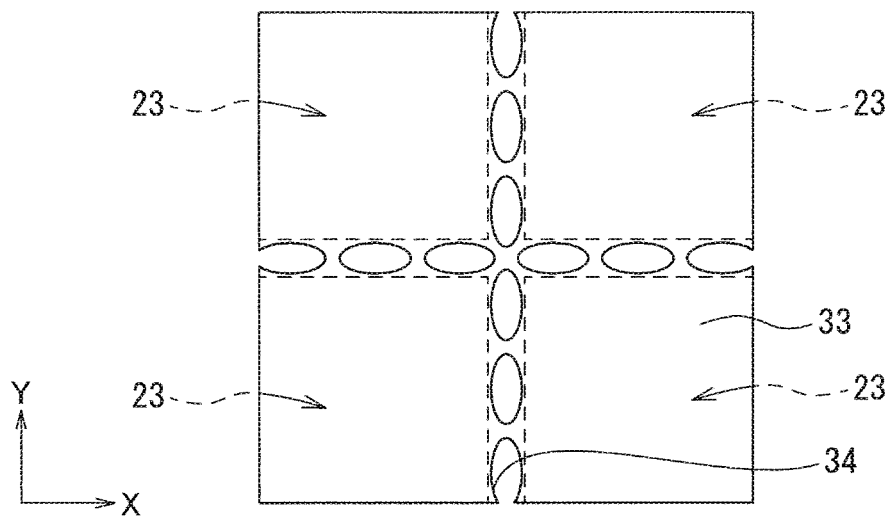
FIG. 12A is a view illustrating a planar configuration of an etching mask according to a modification.
Figure 12B:
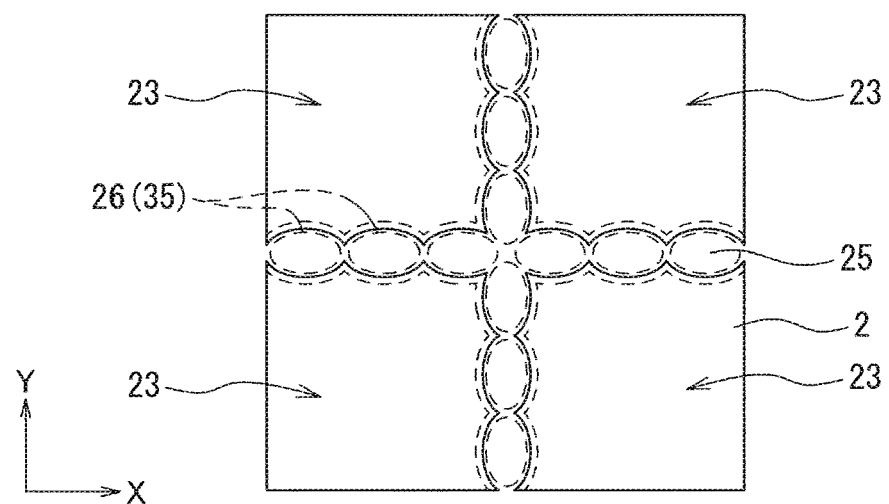
FIG. 12B is an enlarged view illustrating a planar configuration of an intersection part of a trench part formed by the etching mask illustrated in FIG. 12A.
Figure 13A:
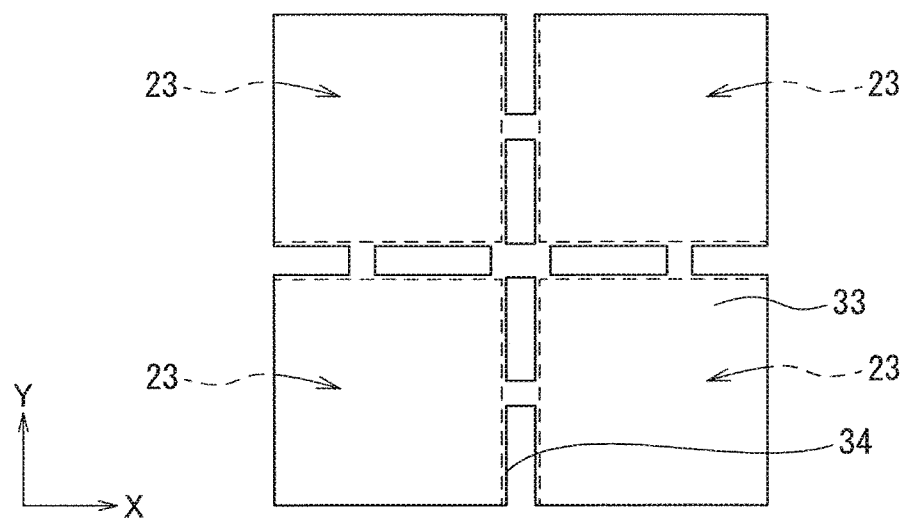
FIG. 13A is a view illustrating a planar configuration of an etching mask according to a modification.
Figure 13B:
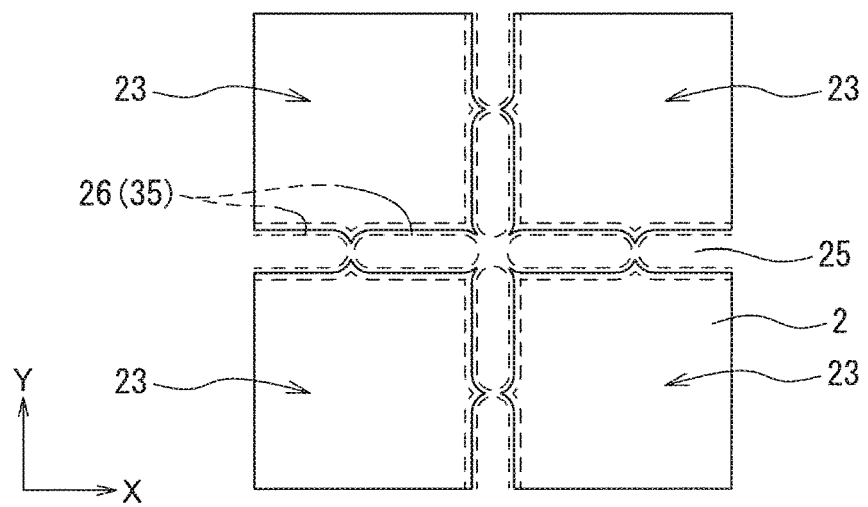
FIG. 13B is an enlarged view illustrating a planar configuration of an intersection part of a trench part formed by the etching mask illustrated in FIG. 13A.
Figure 14A:
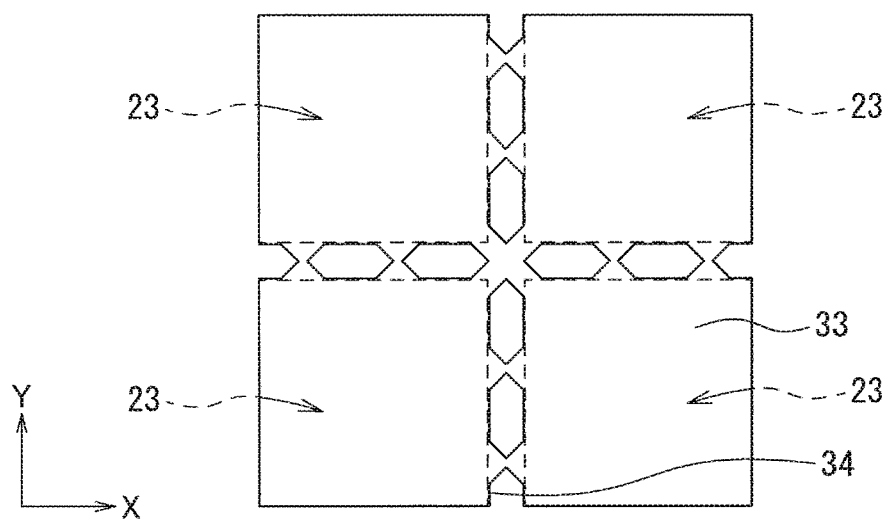
FIG. 14A is a view illustrating a planar configuration of an etching mask according to a modification.

(3) Furthermore, in the first embodiment, an example has been described in which the shape of the opening 34 of the etching mask (the resist film 33) is made circular, but other configurations can also be adopted. For example, the shape may be an elliptical shape as illustrated in FIG. 12A, or may be a polygonal shape such as a rectangular shape or a hexagonal shape as illustrated in FIGS. 13A and 14A. In FIGS. 12A, 13A, and 14A, a case is exemplified in which the elliptical or polygonal openings 34 extend along an arrangement direction of the openings 34. Furthermore, in FIGS. 12A, 12B, 13A, 13B, and 14A, the opening 34 is not formed at a position corresponding to a center of the intersection part 27.

Figure 14B:
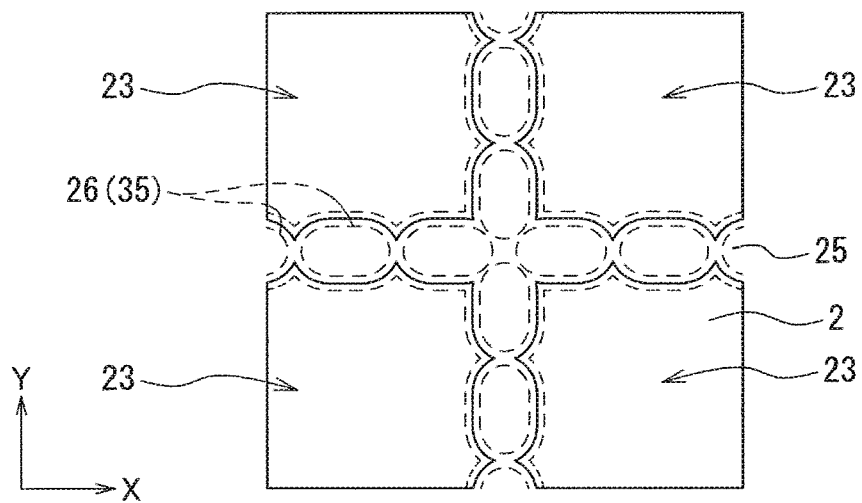
FIG. 14B is an enlarged view illustrating a planar configuration of an intersection part of a trench part formed by the etching mask illustrated in FIG. 14A.
Figure 15:
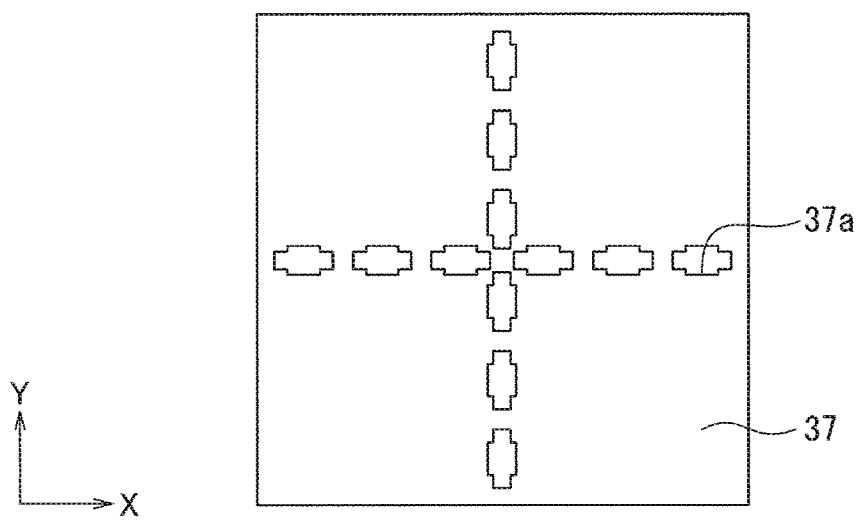
FIG. 15 is a view illustrating a photomask for forming a resist mask illustrated in FIG. 12A.

Note that, in a case where the opening 34 of the resist film 33 has an elliptical shape, as illustrated in FIG. 15, the resist film 33 is exposed by using the photomask 37 having the polygonal pattern 37*a* in which a square and a rectangle are superimposed on each other. In a case where exposure is performed using the photomask 37 having the polygonal pattern 37*a* illustrated in FIG. 15, as illustrated in FIG. 12A, an elliptical pattern in which corner parts of polygonal pattern 37*a* are rounded is transferred to the resist film 33. Furthermore, in a case where the opening 34 of the resist film 33 has a polygonal shape such as a rectangular or a hexagon, the resist film 33 is exposed using the photomask 37 having the polygonal pattern 37*a* having the same shape as the opening 34. Here, a guaranteed minimum line width of the opening 34 that can be formed on the resist film 33 is a line of 35 nm and a hole of 62.5 nm in a case where immersion is used. Therefore, as illustrated in FIGS. 12B, 13B, and 14B, for example, when an elliptical shape, a rectangular shape, or a hexagonal shape is used as the shape of the opening 34 of the resist film 33, a maximum width of the trench part 25 can be narrowed as compared with a case of using a circular shape.

Figure 16:
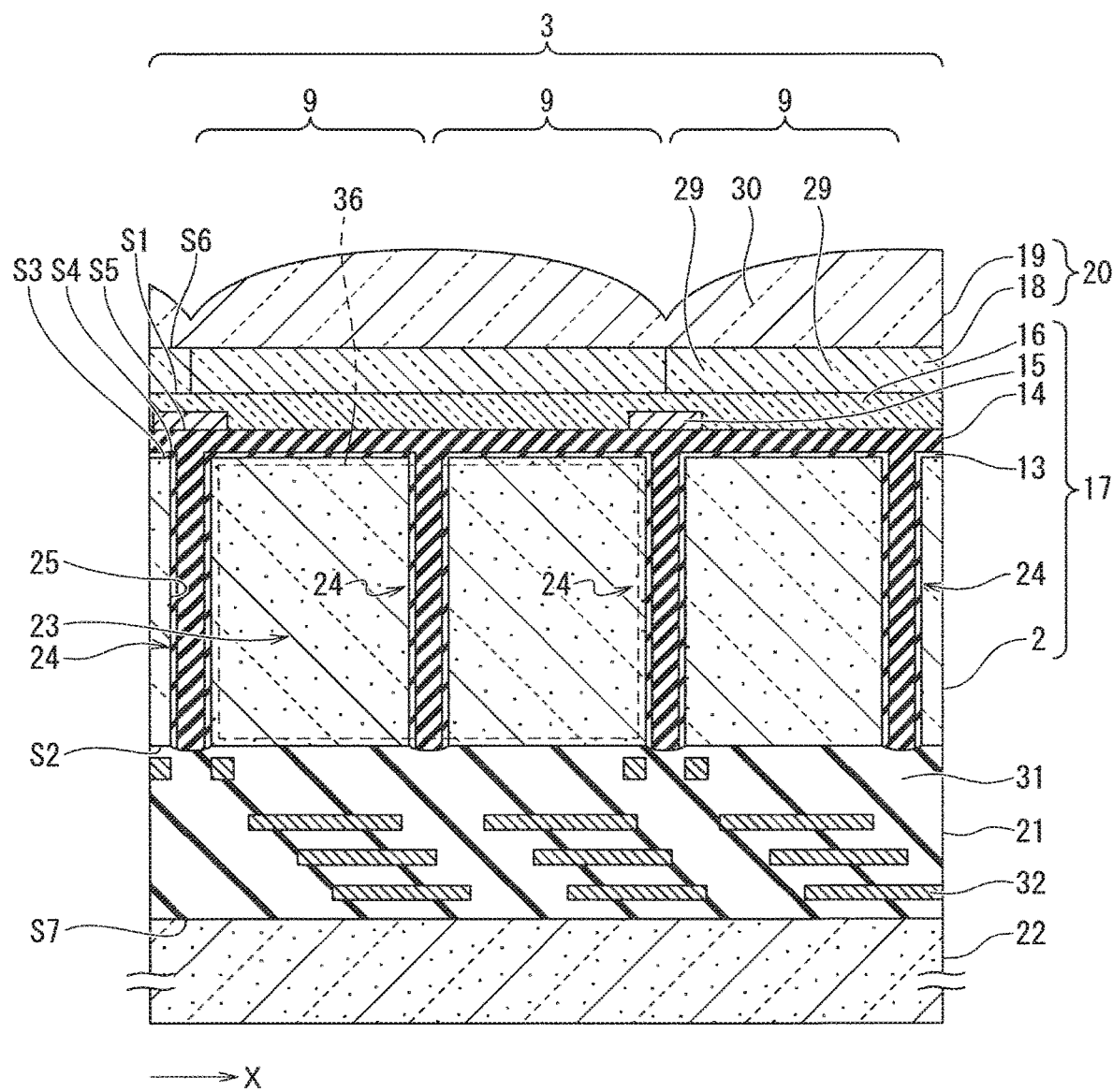
FIG. 16 is a view illustrating a cross-sectional configuration of a pixel region of a solid-state imaging device according to a modification.

(4) Furthermore, in the first embodiment, an example has been described in which the microlens 30 is formed for each photoelectric conversion unit 23, but other configurations can also be adopted. For example, as illustrated in FIG. 16, a configuration may also be adopted in which the microlens 30 is formed for each photoelectric conversion unit group 36 including the photoelectric conversion units 23 disposed in a 2×2 matrix shape when viewed from the back surface S3 side of the substrate 2. Here, in the case of the configuration in which the microlens 30 is formed for each photoelectric conversion unit group 36, since incident light is condensed on the intersection part 27 of the trench part 25, vignetting of incident light easily occurs. On the other hand, in the solid-state imaging device 1 according to the first embodiment, since the corner part 23a of the intersection part 27 of the trench part 25 is suppressed from being rounded, an area of the corner part 23a can be increased, and vignetting of incident light can be suppressed. Note that the configuration in which the microlens 30 is formed for each photoelectric conversion unit group 36 may be applied to all the photoelectric conversion units 23 in the pixel region 3, or may be applied only to some of the photoelectric conversion units 23.

Figure 17:
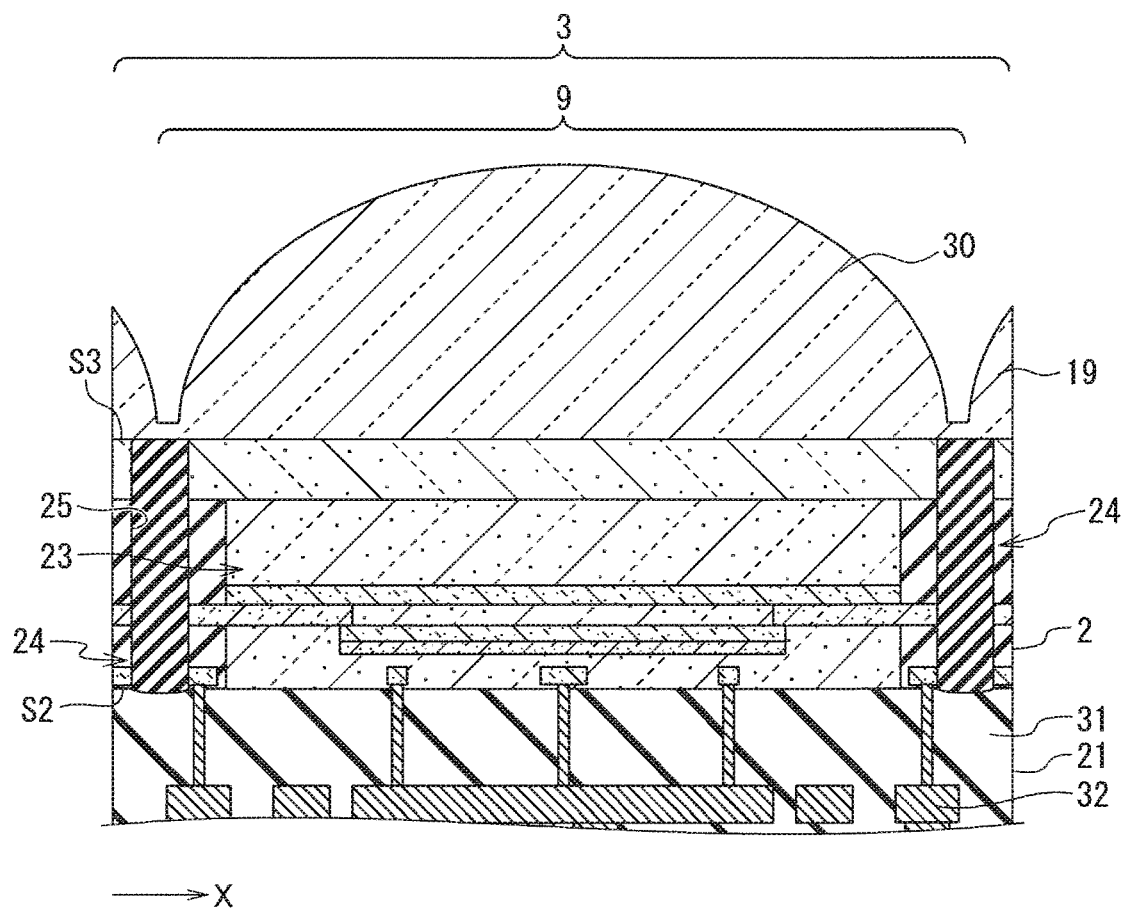
FIG. 17 is a view illustrating a cross-sectional configuration of a pixel region of a solid-state imaging device according to a modification.

(5) Furthermore, in the first embodiment, an example has been described in which the solid-state imaging device 1 (a CMOS image sensor) is used as the light detection device, but other configurations can also be adopted. For example, as illustrated in FIG. 17, a distance measuring sensor may be used in which the microlens array 19 is layered on the back surface S3 side (the light incident surface side) of the substrate 2 without interposing the color filter layer 18 (the plurality of color filters 29). In the distance measuring sensor, since the color filter 29 is omitted unlike the CMOS image sensor, infrared light is incident on the photoelectric conversion unit 23 as incident light. As the distance measuring sensor, for example, a distance image sensor such as a single photon avalanche diode (SPAD) sensor used for distance measurement by a time of flight (ToF) method can be adopted. Here, in a case where the light detection device is a distance measuring sensor, incident light (infrared light) is less likely to be absorbed by the photoelectric conversion unit 23 as compared with a case where the light detection device is the solid-state imaging device 1 (the CMOS image sensor). On the other hand, in the first embodiment, since an optical path length of incident light (infrared light) is extended by the photoelectric conversion unit 23, incident light (infrared light) is easily absorbed by the photoelectric conversion unit 23, and decrease in sensitivity can be suppressed.

Figure 18:
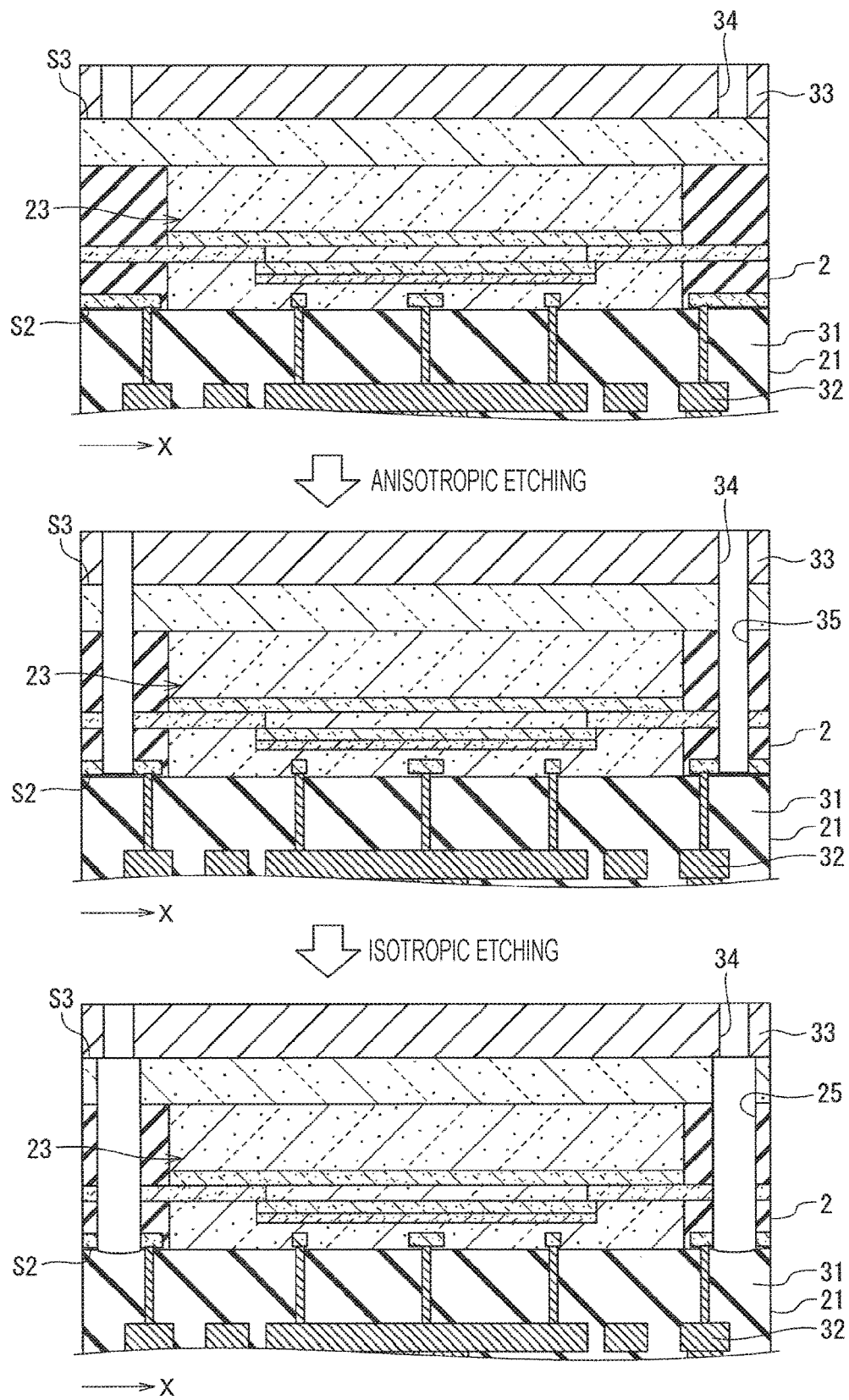
FIG. 18 is a view illustrating a flow of a manufacturing step for a solid-state imaging device according to a modification.
Figure 19:
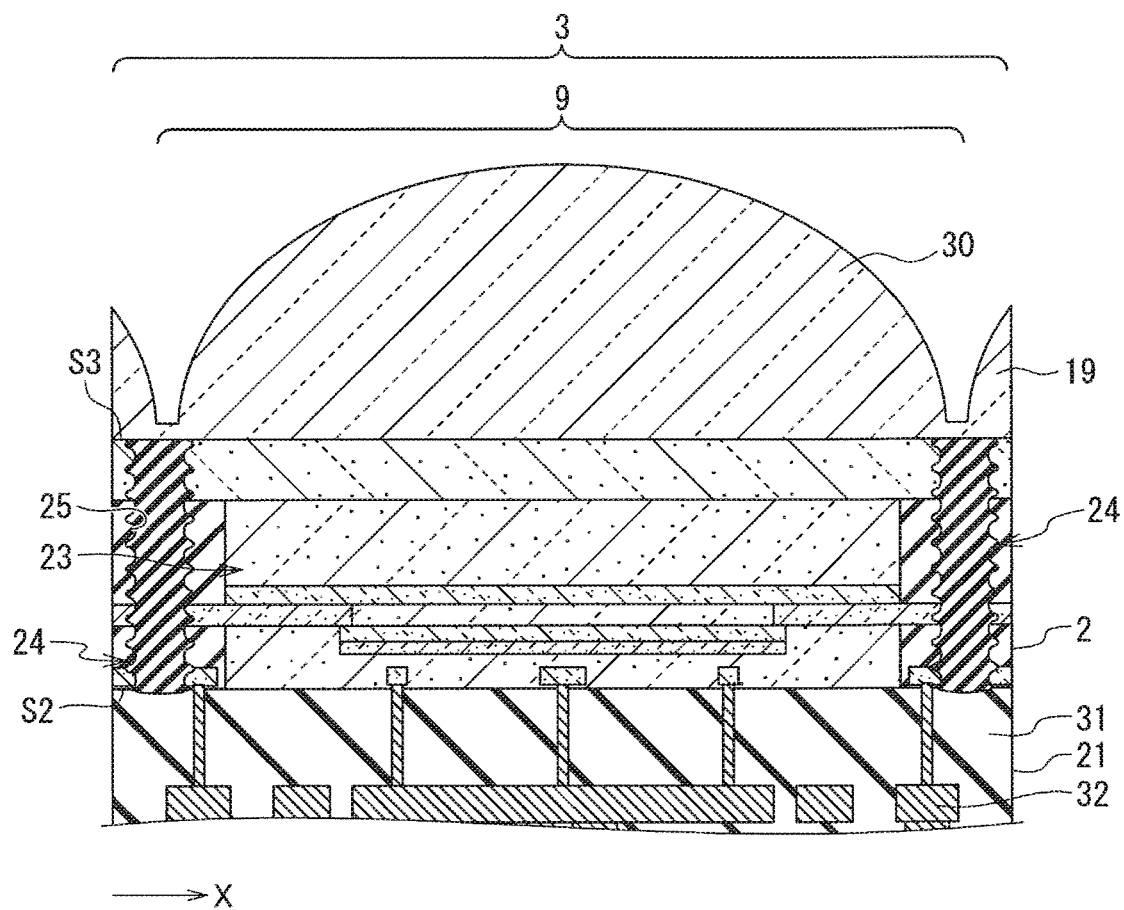
FIG. 19 is a view illustrating a cross-sectional configuration of a pixel region of a solid-state imaging device according to a modification.

Note that, also in a case where the light detection device is a distance measuring sensor, as illustrated in FIG. 18, the trench part 25 can be formed on the substrate 2 by performing the anisotropic etching to form the openings 35 on the substrate 2 and then performing the isotropic etching to connect the openings 35, similarly to a case where the light detection device is a CMOS image sensor. Furthermore, as illustrated in FIG. 19, by forming the cross-sectional shape of the side wall surface of the trench part 25 in the cross section perpendicular to the light incident surface (the back surface S3) of the substrate 2 into a concavo-convex shape in which concavity and convexity are repeated along the depth direction of the trench part 25, a reflection direction of incident light by the side wall surface of the trench part 25 can be made further complicated, and an optical path length of incident light can be further extended.

Figure 20:
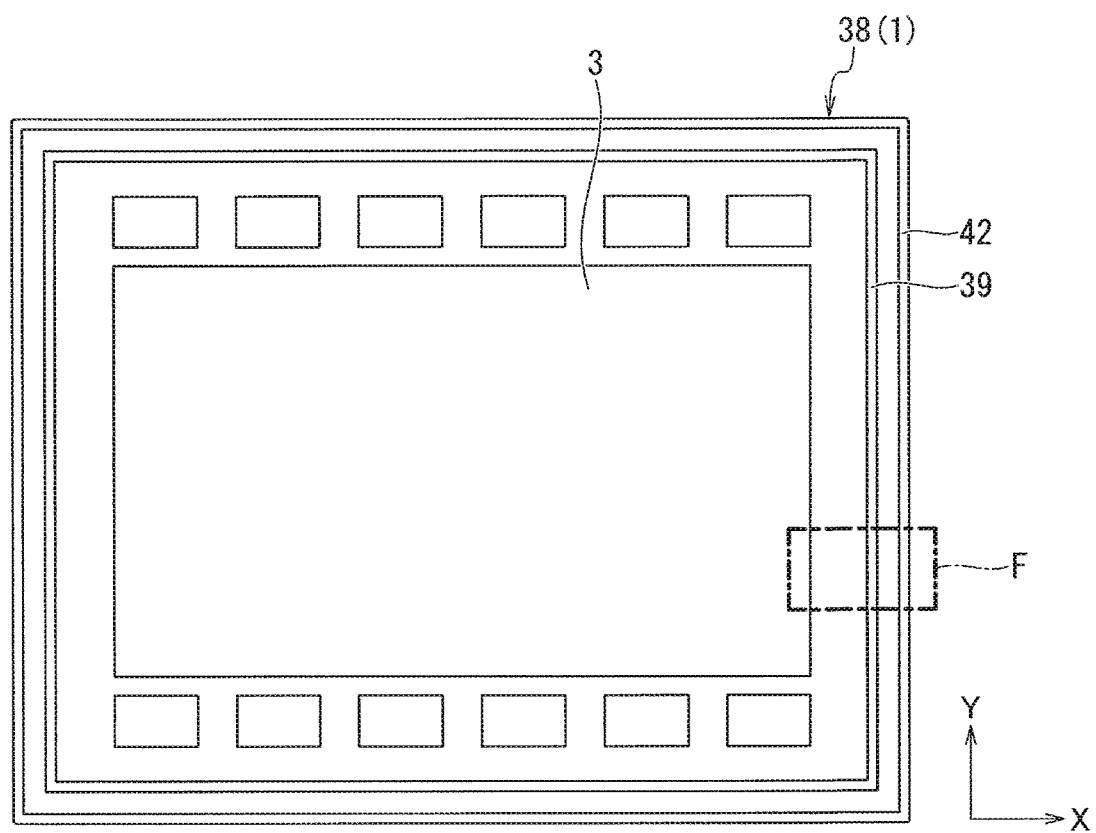
FIG. 20 is a view illustrating an overall configuration of a chip in which a solid-state imaging device according to a second embodiment is formed.
Figure 21A:
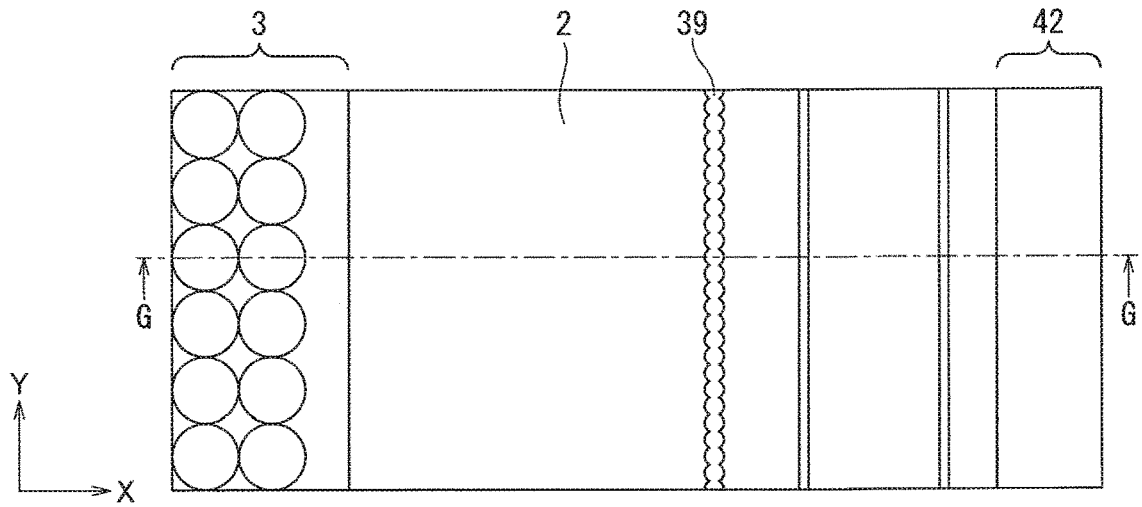
FIG. 21A is a view illustrating a planar configuration of the chip in a case where a region F in FIG. 20 is enlarged.
Figure 21B:
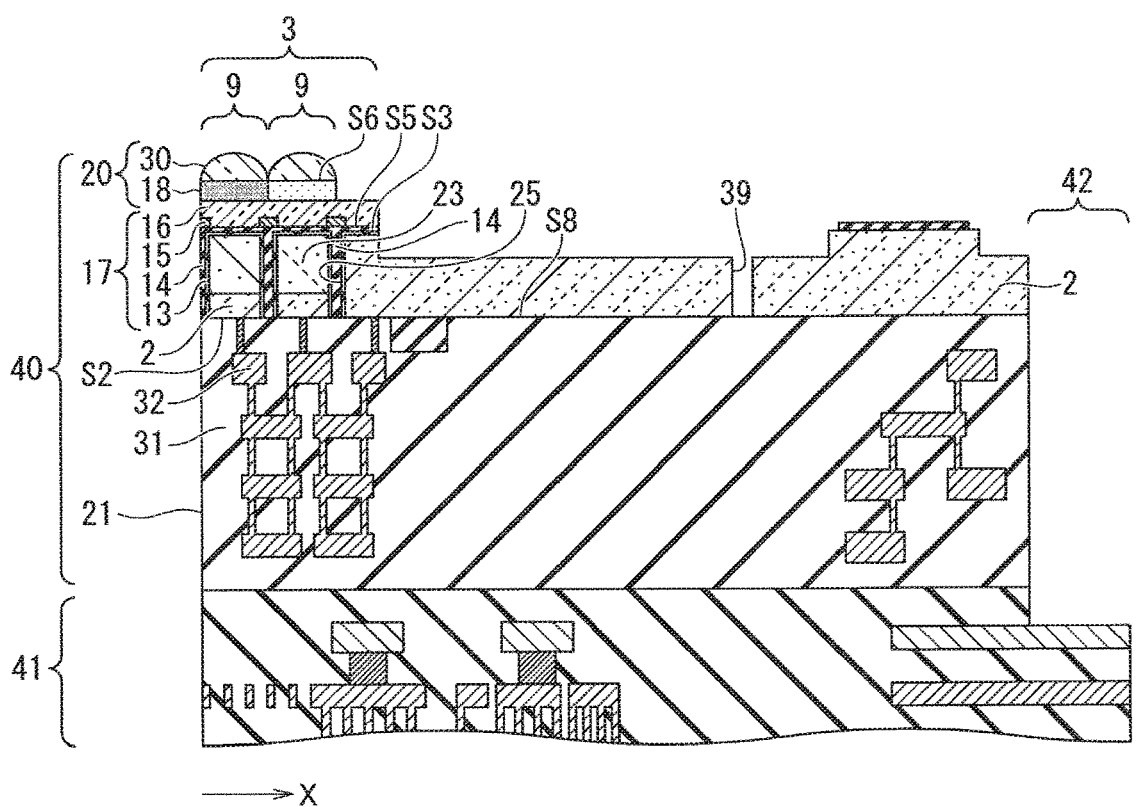
FIG. 21B is a view illustrating a cross-sectional configuration of the chip in a case of being cut along line G-G in FIG. 21A.

<2. Second embodiment: solid-state imaging device>[2-1 Configuration of main part] Next, a solid-state imaging device according to a second embodiment of the present disclosure will be described. An overall configuration of the solid-state imaging device according to the second embodiment is similar to that in FIG. 1, and thus illustration thereof is omitted. FIG. 20 is a view illustrating an overall configuration of a chip 38 in which a solid-state imaging device 1 is formed. FIG. 21A is an enlarged view of a region F in FIG. 20. FIG. 21B is a view illustrating a cross-sectional configuration of the solid-state imaging device 1 (the chip 38) in a case of being cut along line G-G in FIG. 21A. In FIGS. 20, 21A, and 21B, portions corresponding to FIGS. 1, 2, 3, 4A, 4B, 5A, 5B, 6A, 6B, 7, 8A, 8B, 9, 10, 11A, 11B, 12A, 12B, 13A, 13B, 14A, 14B, 15, 16, 17, 18, and 19 are denoted by the same reference numerals, and redundant description is omitted.

As illustrated in FIG. 20, the solid-state imaging device 1 according to the second embodiment is different from that of the first embodiment in that a groove 39 is formed so as to surround a pixel region 3. Furthermore, as illustrated in FIG. 21B, the chip 38 formed with the solid-state imaging device 1 includes a sensor substrate 40 and a logic substrate 41 bonded to the sensor substrate 40. The sensor substrate 40 includes a light receiving layer 17, a light condensing layer 20, and a wiring layer 21, and a configuration of a trench part 25 is the same as that of the first embodiment (the configuration illustrated in FIGS. 1, 2, 3, 4A, 4B, 5A, 5B, 6A, 6B, 7, 8A, 8B, 9, 10, 11A, 11B, 12A, 12B, 13A, 13B, 14A, 14B, 15, 16, 17, 18, and 19). Furthermore, the logic substrate 41 includes a vertical drive circuit 4, a column signal processing circuit 5, a horizontal drive circuit 6, an output circuit 7, and a control circuit 8 illustrated in FIG. 1. The chip 38 is obtained by forming a wafer in which a plurality of chips 38 is arranged in a two-dimensional matrix shape and then dicing (dividing) the wafer with a blade.

Furthermore, as illustrated in FIG. 20, on an outer peripheral side of the chip 38, a blade region 42 after dividing is formed so as to surround the pixel region 3. The blade region 42 after dividing is a region formed between the individual chips 38 in the wafer and obtained by dicing, with a blade, a bottom surface of a groove-shaped region (the blade region 42 before dividing) opened on a back surface S3 side of a substrate 2. Furthermore, the groove 39 is formed between the blade region 42 after dividing and the pixel region 3 so as to surround the pixel region 3. The groove 39 penetrates the substrate 2 in a thickness direction, and a surface S8 (hereinafter, also referred to as a "back surface S8") of the wiring layer 21 facing the substrate 2 forms a bottom surface of the groove 39.

Figure 22A:
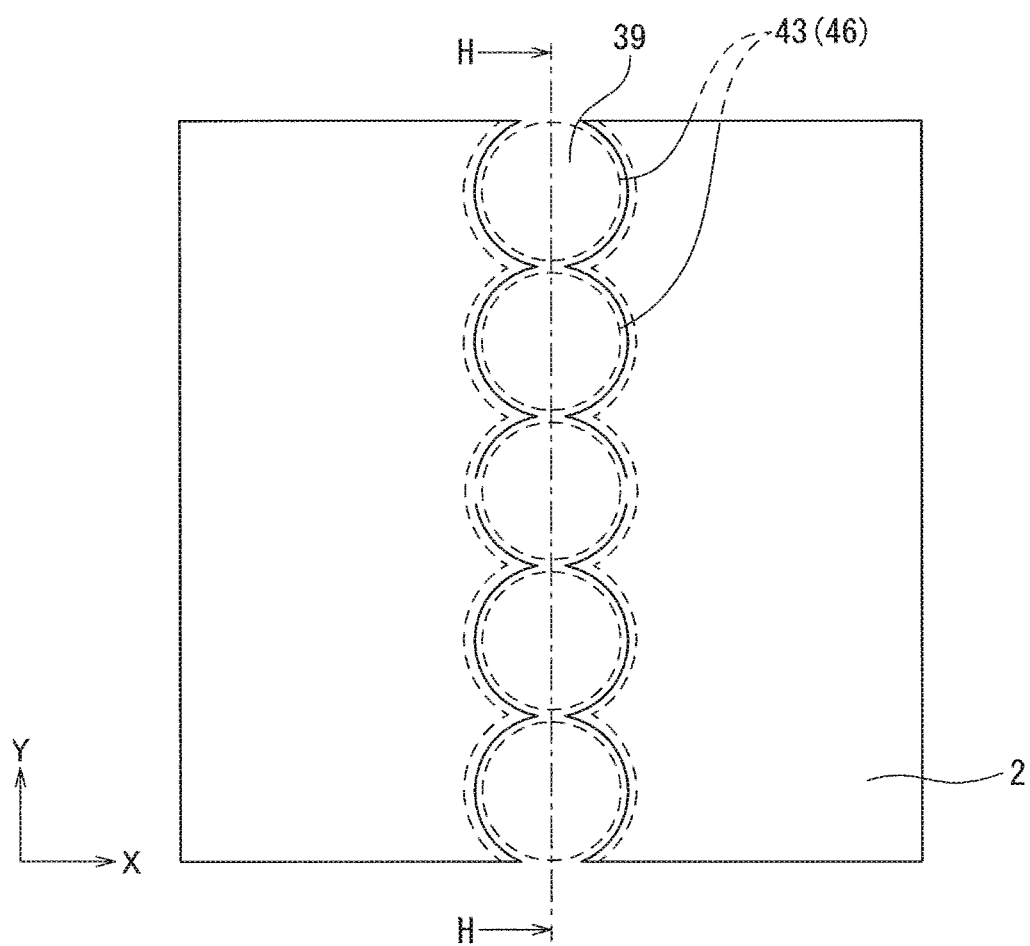
FIG. 22A is an enlarged view illustrating a planar configuration of a groove illustrated in FIG. 21A.

Similarly to the trench part 25, as illustrated in FIG. 22A, the groove 39 is formed such that a plurality of vertical holes 43 extending in the thickness direction of the substrate 2 is aligned in a direction in which the groove 39 extends (in FIG. 22A, a vertical direction), and adjacent vertical holes 43 are connected to each other. FIG. 22A is an enlarged view illustrating a linear portion constituting the groove 39 in FIG. 20. Due to the plurality of the vertical holes 43, a cross-sectional shape of a side wall surface of the groove 39 in a cross section parallel to a light incident surface (the back surface S3) of the substrate 2 is made a concavo-convex shape in which concavity and convexity are repeated along the direction in which the groove 39 extends. A maximum width of the groove 39 is preferably 500 nm or less, more preferably 400 nm or less, and still more preferably 200 nm or less. Furthermore, a lower limit of the maximum width of the groove 39 is preferably 100 nm or more.

As the vertical hole 43, for example, a cylindrical hole having a circular cross-sectional shape in the cross section parallel to the light incident surface (the back surface S3) of the substrate 2 can be adopted. In a case where the cylindrical hole is adopted, the cross-sectional shape (the concavo-convex shape) of the side wall surface of the groove 39 is to be a wave shape in which arcs are continuous. A radius of the arc is preferably, for example, 250 nm or less. By forming the wave shape in which arcs having a radius of 250 nm or less are continuous, the maximum width of the groove 39 can be set to 500 nm or less. Furthermore, a reflection direction of light by the side wall surface of the groove 39 can be made complicated, and incident light can be scattered in a case where light enters the groove 39.

Figure 22B:
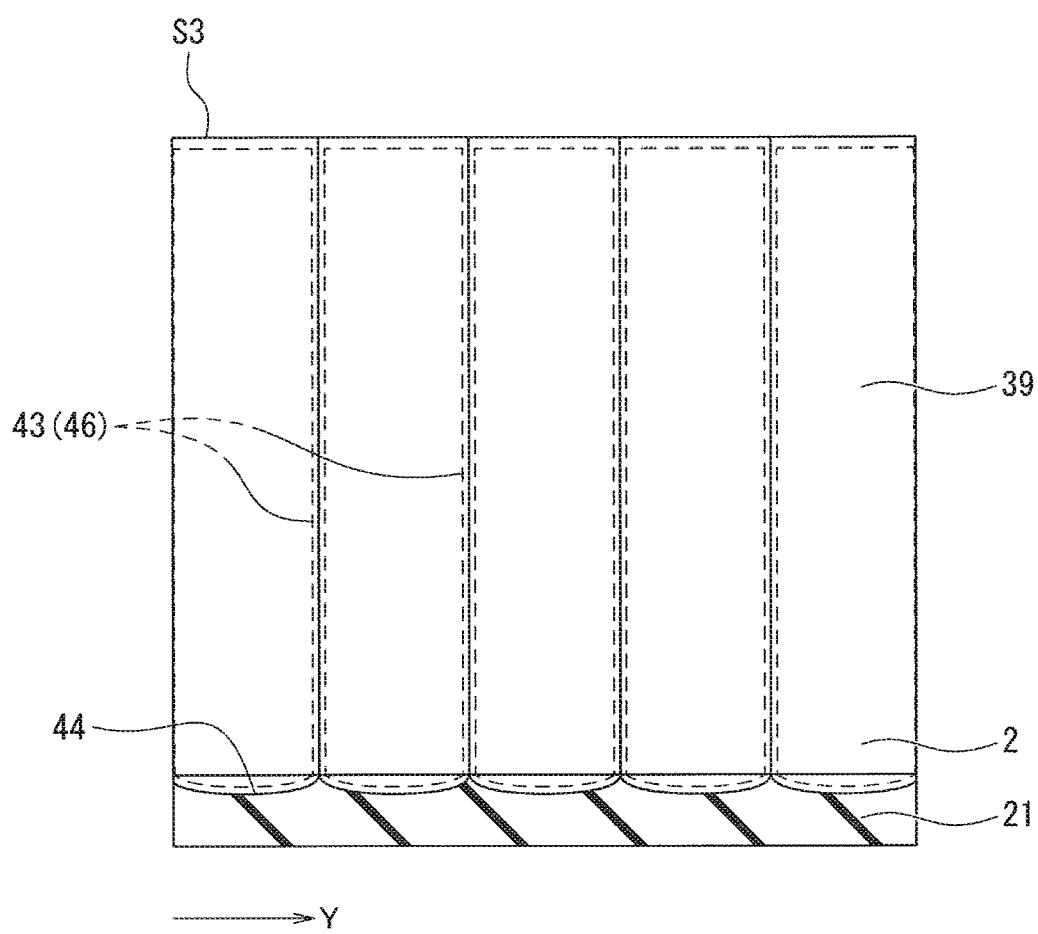
FIG. 22B is a view illustrating a cross-sectional configuration of a substrate in a case of being cut along line H-H in FIG. 22A.

Furthermore, due to the plurality of vertical holes 43, a plurality of concave part 44 is formed on the bottom surface of the groove 39 so as to be aligned in the direction in which the groove 39 extends (a horizontal direction in FIG. 22B) as illustrated in FIG. 22B. Due to the plurality of concave part 44, a cross-sectional shape of the bottom surface of the groove 39 in a cross section perpendicular to the light incident surface (the back surface S3) of the substrate 2 is made a concavo-convex shape in which concavity and convexity are repeated along the direction in which the groove 39 extends. As the concave part 28, for example, a parabolic concave part with a concave center can be adopted.

Here, for example, in the solid-state imaging device 1 that does not include the groove 39, when the wafer is diced by a blade, if the blade comes into contact with the substrate 2 and film peeling or a crack occurs in the substrate 2, the film peeling or the like of the substrate 2 progresses, and the film peeling or the like may progress into the pixel region 3.

On the other hand, in the solid-state imaging device 1 according to the second embodiment, since the groove 39 is provided between the blade region 42 after dividing and the pixel region 3, the film peeling or the like of the substrate 2 occurring at the time of dicing can be stopped by the groove 39, and progress of the film peeling or the like into the pixel region 3 can be prevented.

Furthermore, for example, in the solid-state imaging device 1 in which the groove 39 surrounding the pixel region 3 is provided but the side wall surface of the groove 39 does not have a concavo-convex shape (the side wall surface is a flat surface), when light is incident on the groove 39, there is a possibility that the light is reflected by the bottom surface of the groove 39 and the side wall surface of the groove 39 and travels toward the pixel region 3. Then, unnecessary light may be incident on the pixel region 3 to cause flare.

On the other hand, the inventor of the present disclosure has found from daily research that such flare is suppressed by narrowing a width of the groove 39. Then, on the basis of this finding, the inventor has found that no flare problem occurs by setting the width of the groove 39 to 500 nm or less. Note that, from the viewpoint of improving productivity, a current minimum width of the groove 39 is 1800 nm. On the basis of such a finding, in the solid-state imaging device 1 according to the second embodiment, the maximum width of the groove 39 has been set to 500 nm or less. Therefore, it is possible to suppress an occurrence of flare due to light incident into the groove 39.

Furthermore, in the solid-state imaging device 1 according to the second embodiment, the cross-sectional shape of the side wall surface of the groove 39 in the cross section parallel to the back surface S3 of the substrate 2 is made a concavo-convex shape in which concavity and convexity are repeated along the direction in which the groove 39 extends. Therefore, light incident into the groove 39 can be scattered, incident light reflected by the side wall surface of the groove 39 can be suppressed from returning to the pixel region 3 side, and an occurrence of flare can be further suppressed.

Furthermore, the cross-sectional shape of the bottom surface of the groove 39 in the cross section perpendicular to the back surface S3 (the light incident surface) of the substrate 2 has been made a concavo-convex shape in which concavity and convexity are repeated along the direction in which the groove 39 extends. As a result, light incident into the groove 39 can be scattered more strongly, light reflected by the side wall surface of the groove 39 can be suppressed from returning to the pixel region 3 side, and an occurrence of flare can be further suppressed. Furthermore, as described in the first embodiment, an occurrence of flare can be further suppressed by embedding a metal film (tungsten (W) or aluminum (AL)) inside the trench part 25 between the photoelectric conversion units 23.

2-2 Method for Manufacturing Solid-State Imaging Device

Next, a method for manufacturing the solid-state imaging device 1 according to the second embodiment will be described. Here, only a step of forming the groove 39, which is not included in the manufacturing method described in the first embodiment, will be described.

Figure 23:
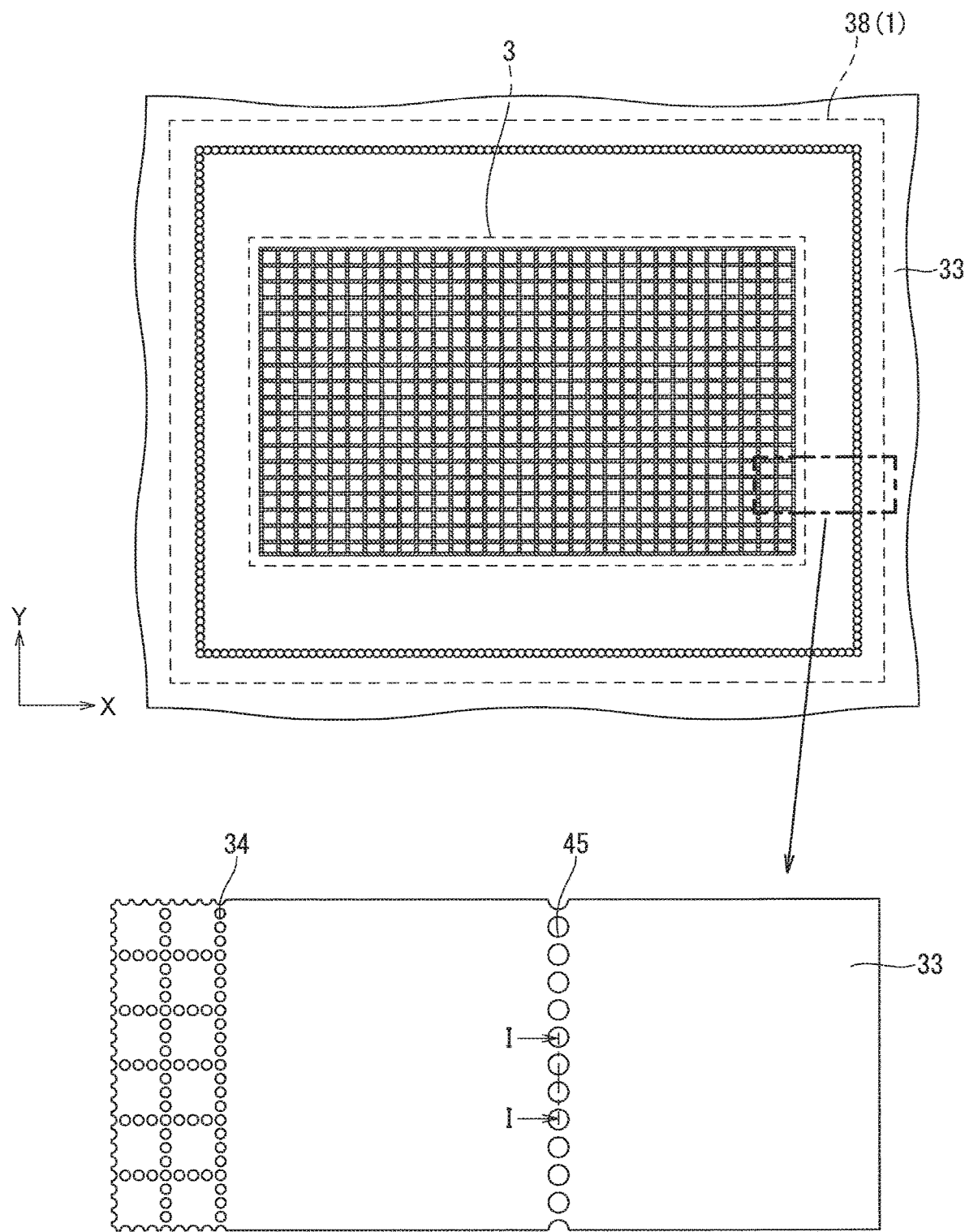
FIG. 23 is a view illustrating a planar configuration of an etching mask formed on a back surface of the substrate.
Figure 24:
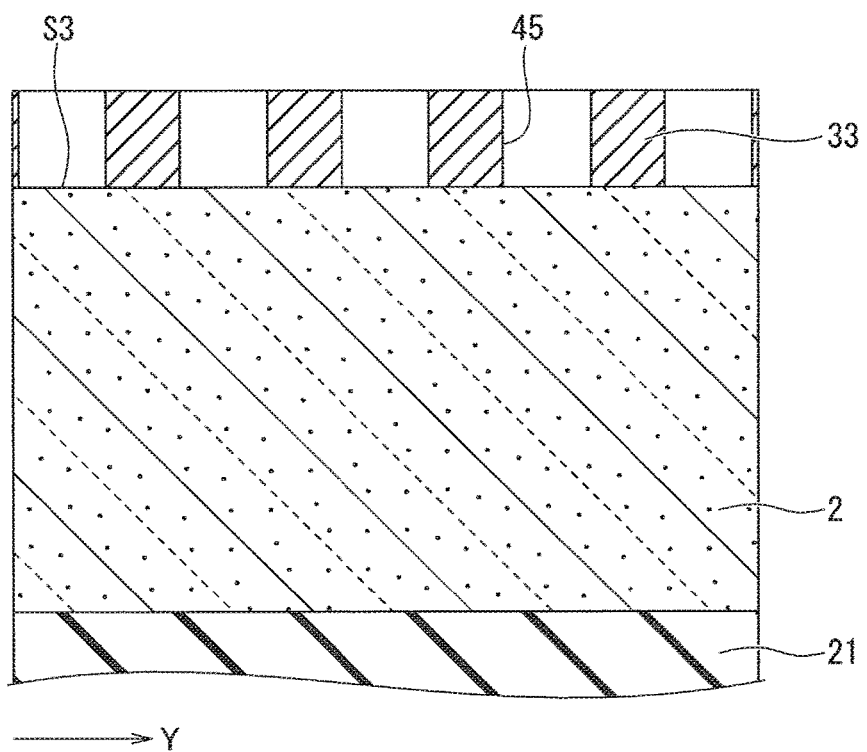
FIG. 24 is a view illustrating a cross-sectional configuration of the substrate in a case of being cut along line I-I in FIG. 23.

The groove 39 is formed simultaneously with the trench part 25 surrounding the photoelectric conversion units 23. That is, the groove 39 is formed in the same step as the step of forming the trench part 25. Specifically, first, in a step of forming a pattern on a resist film 33, on the resist film 33, the plurality of openings 34 is formed at intervals from one another along a position where the trench part 25 is formed as illustrated in FIGS. 6A, 6B, and 23, and a plurality of openings 45 is formed at intervals from one another along a position where the groove 39 is formed as illustrated in FIGS. 23 and 24. That is, when viewed from the back surface S3 side of the substrate 2, on the resist film 33, the plurality of openings 34 arranged in a lattice shape at predetermined intervals is formed so as to surround the individual photoelectric conversion units 23, and the plurality of openings 45 arranged in a lattice shape at predetermined intervals is formed so as to surround each pixel region 3. FIG. 6A is a view illustrating a region where the opening 34 is formed.

Figure 25:
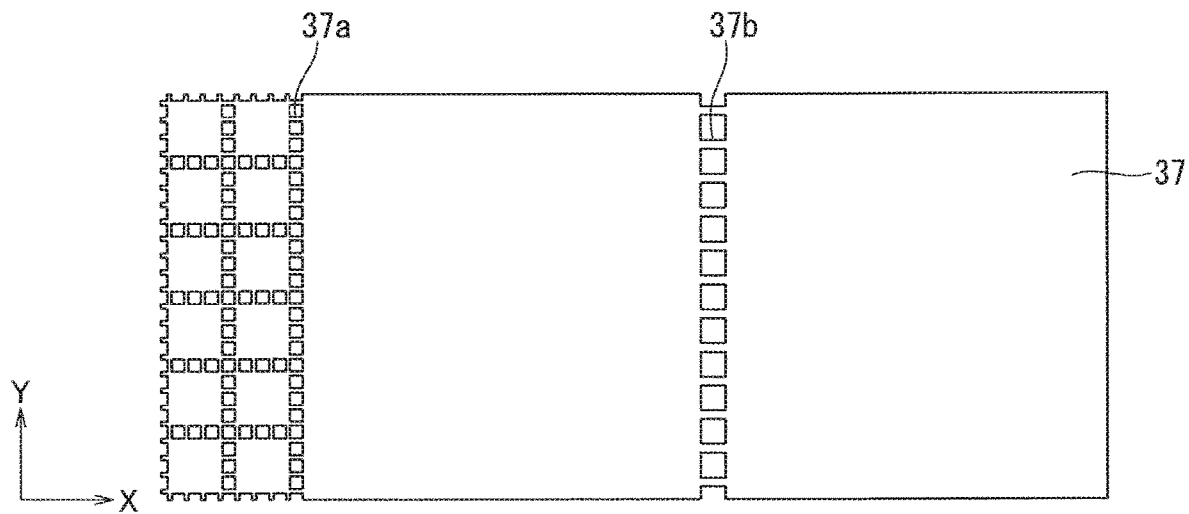
FIG. 25 is a view illustrating a photomask for forming a resist mask illustrated in FIG. 23.

In FIGS. 6A and 23, a case where shapes of the openings 34 and 45 are made circular is exemplified. In a case where the openings 34 and 45 of the resist film 33 are circular, as illustrated in FIG. 25, the resist film 33 is exposed by using a photomask having polygonal patterns 37a and 37b as a photomask 37. In FIG. 25, a case is exemplified in which a square pattern is used as the polygonal patterns 37a and 37b, and the polygonal pattern 37b (the square pattern) corresponding to the opening 45 is slightly larger than the polygonal pattern 37a (the square pattern) corresponding to the opening 34. In a case where exposure is performed using the photomask 37 having the polygonal patterns 37a and 37b, a circular pattern in which corner parts of the polygonal patterns 37a and 37b are rounded is transferred to the resist film 33.

Figure 26A:
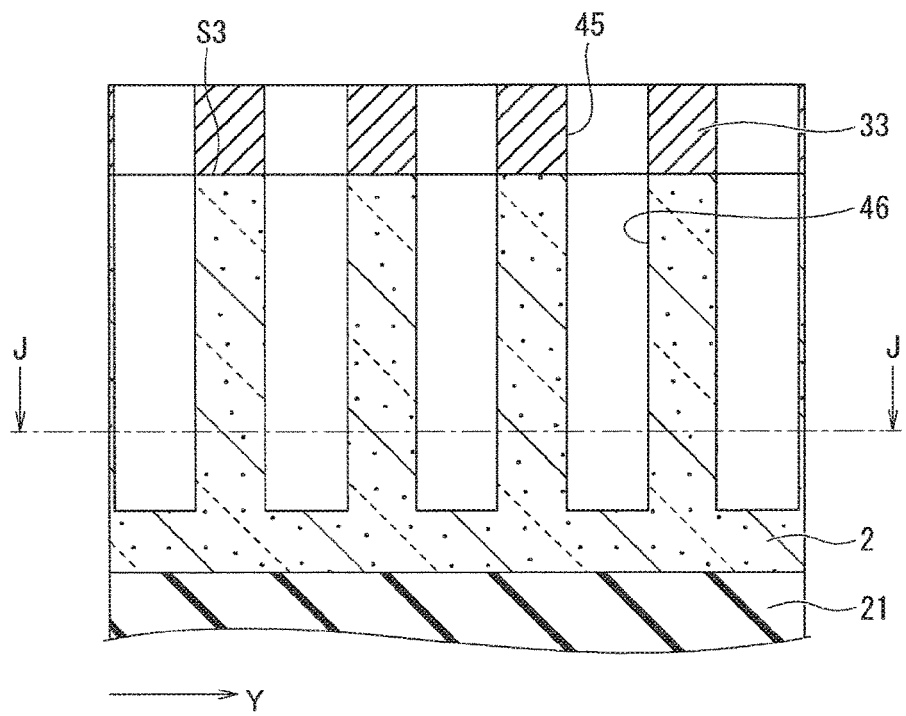
FIG. 26A is a view illustrating a cross-sectional configuration of the substrate after anisotropic etching.
Figure 26B:
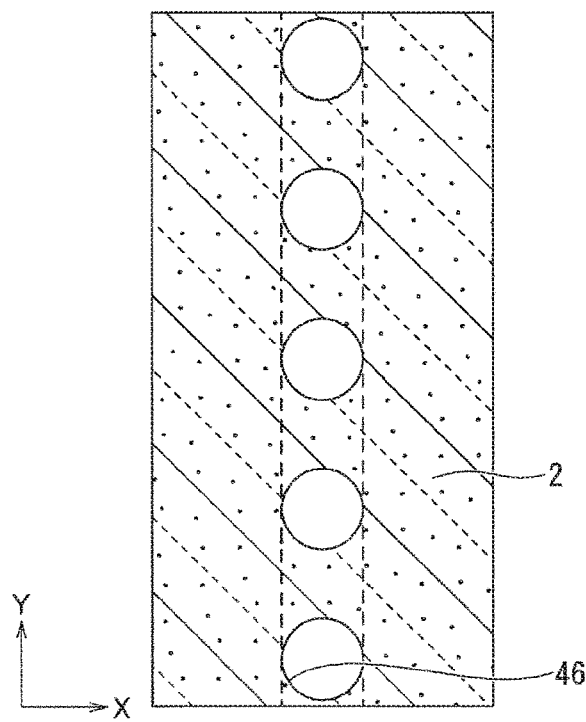
FIG. 26B is a view illustrating a cross-sectional configuration of the substrate in a case of being cut along line J-J in FIG. 26A.

Subsequently, as illustrated in FIGS. 8A and 26A, anisotropic etching (RIE or the like) is performed on the substrate 2 from the back surface S3 side of the substrate 2 by using, as an etching mask, the resist film 33 in which the plurality of openings 34 and 45 is formed. By the anisotropic etching, openings 35 and 46 (cylindrical openings 35 and 46) having the same cross-sectional shape as the shapes of the openings 34 and 45 of the etching mask (the resist film 33) are formed on the substrate 2. As a result, as illustrated in FIG. 8B, a plurality of openings 35 ("first openings" in a broad sense) arranged in a lattice shape at predetermined intervals is formed on the substrate 2 so as to surround the individual photoelectric conversion units 23. At the same time, as illustrated in FIG. 26B, a plurality of openings 46 ("second openings" in a broad sense) arranged at predetermined intervals is formed on the substrate 2 so as to surround each pixel region 3. In FIG. 23, a case is exemplified in which the interval between the openings 35 and the interval between the openings 46 are the same. Furthermore, FIG. 26B is a view illustrating a cross section of the substrate 2 cut along line J-J in FIG. 26A.

Figure 27:
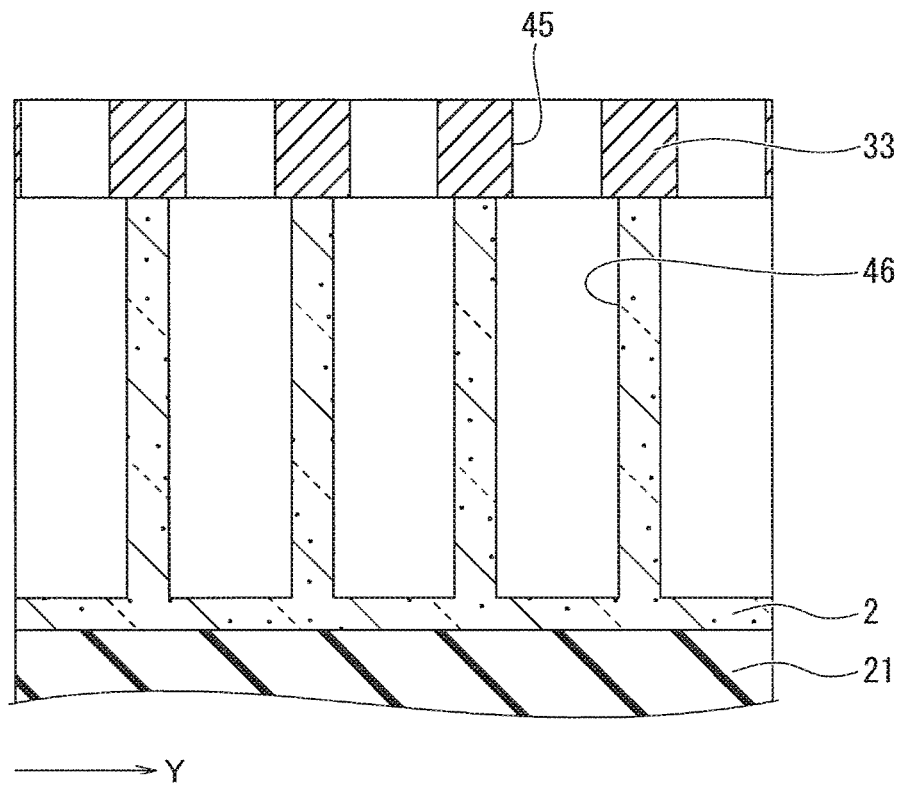
FIG. 27 is a view illustrating a cross-sectional configuration of the substrate after isotropic etching.

Subsequently, as illustrated in FIGS. 9 and 27, isotropic etching is performed on the substrate 2 from the back surface S3 side of the substrate 2, by using, as an etching mask, the etching mask (the resist film 33) used for the anisotropic etching as it is. As an etching agent for isotropic etching, for example, hydrofluoric acid can be adopted. By the isotropic etching, a side wall surface and a bottom surface of the opening 35 and a side wall surface and a bottom surface of the opening 46 are etched in the substrate 2. As a result, as illustrated in FIGS. 4A and 4B, adjacent openings 35 (vertical holes 26) are connected to each other, so that the lattice-shaped trench part 25 is formed on the substrate 2 so as to surround the photoelectric conversion units 23. Similarly, as illustrated in FIGS. 22A and 22B, the groove 39 is formed on the substrate 2 so as to surround each pixel region 3 by connecting adjacent openings 46 (vertical holes 43) to each other. In the groove 39, the plurality of openings 46 (vertical holes 43) extending in the thickness direction of the substrate 2 is aligned in the direction in which the groove 39 extends, and adjacent vertical holes 43 are connected to each other. Therefore, a reflection direction of incident light by the side wall surface of the groove 39 can be made complicated, and incident light incident on the groove 39 can be scattered.

Note that the present method of etching the groove 39 simultaneously with etching of the trench part 25 can also be adopted for another light detection device such as a SPAD sensor (see FIG. 17) used for distance measurement by the ToF method, for example, as long as the light detection device is a light detection device in which the trench part 25 penetrates the substrate 2.

As described above, in the method for manufacturing the solid-state imaging device 1 according to the second embodiment, first, simultaneously with formation of the plurality of openings 35 (first openings) arranged so as to surround each photoelectric conversion unit 23 on the substrate 2 by anisotropic etching, the plurality of openings 46 (second openings) arranged at predetermined intervals is formed so as to surround the pixel region 3 having the plurality of photoelectric conversion units 23. Subsequently, simultaneously with formation of the trench part 25 on the substrate 2 by connecting adjacent openings 35 to each other by isotropic etching, adjacent openings 46 are connected to each other to form the groove 39 so as to surround the pixel region 3.

In other words, it can be said that the anisotropic etching is performed from one surface side of the substrate 2 to form the plurality of openings 35 arranged at predetermined intervals from one another on the substrate 2, and then isotropic etching is performed from one surface side of the substrate 2 to connect adjacent openings 35, to form the groove 39 on the substrate 2 along the arrangement direction of the openings 35.

As a result, it is possible to provide the solid-state imaging device 1 in which the groove 39 can be simultaneously formed in the step of forming the trench part 25, the width of the groove 39 can be made equal to or less than a threshold value at which a flare problem does not occur while suppressing decrease in productivity, and an occurrence of flare due to light incident in the groove 39 can be suppressed. That is, it is possible to manufacture the solid-state imaging device 1 capable of improving characteristics such as image quality improvement by suppressing flare.

Figure 28:
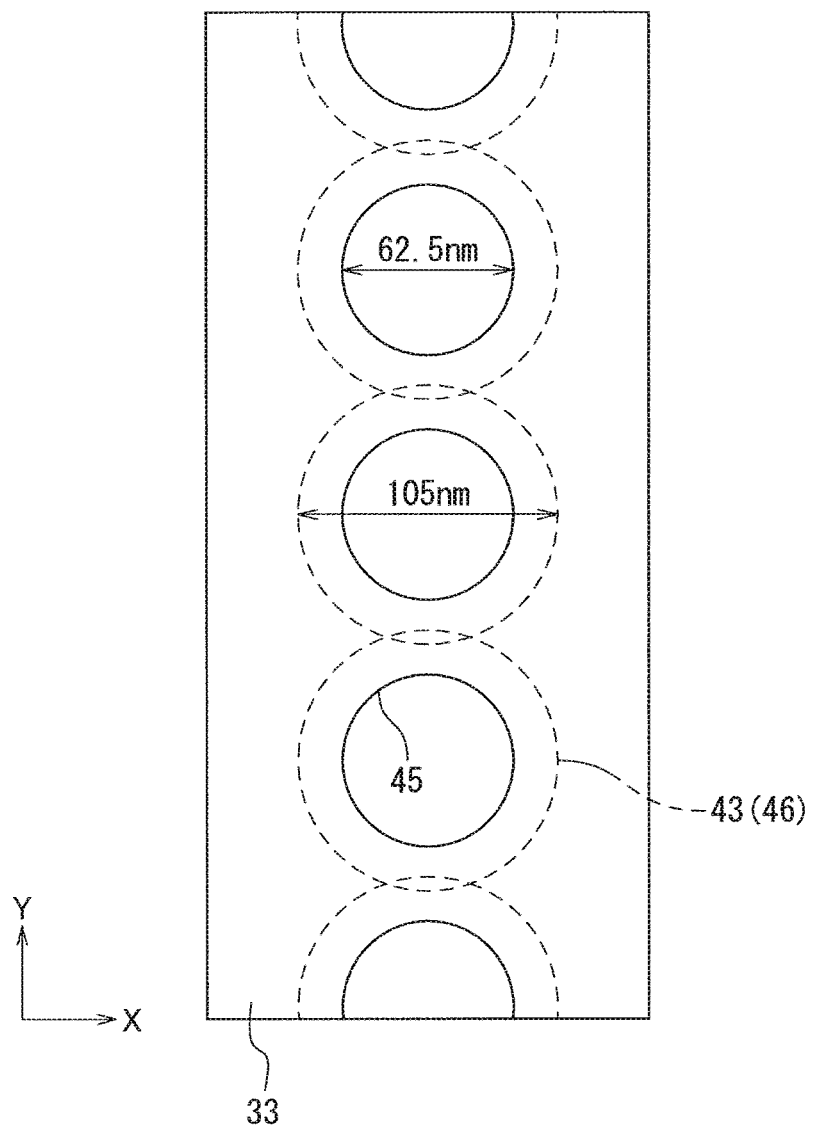
FIG. 28 is a view illustrating a width of a groove obtained by a method for manufacturing a solid-state imaging device according to the second embodiment.

Specifically, first, a current minimum line width is a line of 35 nm and a hole of 62.5 nm in a case where immersion is used. Therefore, in the method for manufacturing the solid-state imaging device 1 according to the second embodiment, in a case where the width of the groove 39 is minimized, as illustrated in FIG. 28, an etching mask (the resist film 33) is used in which the opening 45 is a hole (a circle) having a diameter of 62.5 nm and a distance between the openings 45 is 35 nm. In this case, when the openings 46 of the substrate 2 come into contact with each other by the isotropic etching, the diameter of the opening 46 is to be 97.5 nm. Furthermore, when over-etching of 20% is finished, the diameter of the opening 46 is to be about 105 nm. In FIG. 28, the opening 35 after the over-etching of 20% is finished is indicated by a broken line. Therefore, according to the solid-state imaging device 1 according to the second embodiment, the width of the groove 39 can be set to ⅕ of a threshold value (500 nm) at which a flare problem does not occur, and an occurrence of flare can be suppressed.

Figure 29:
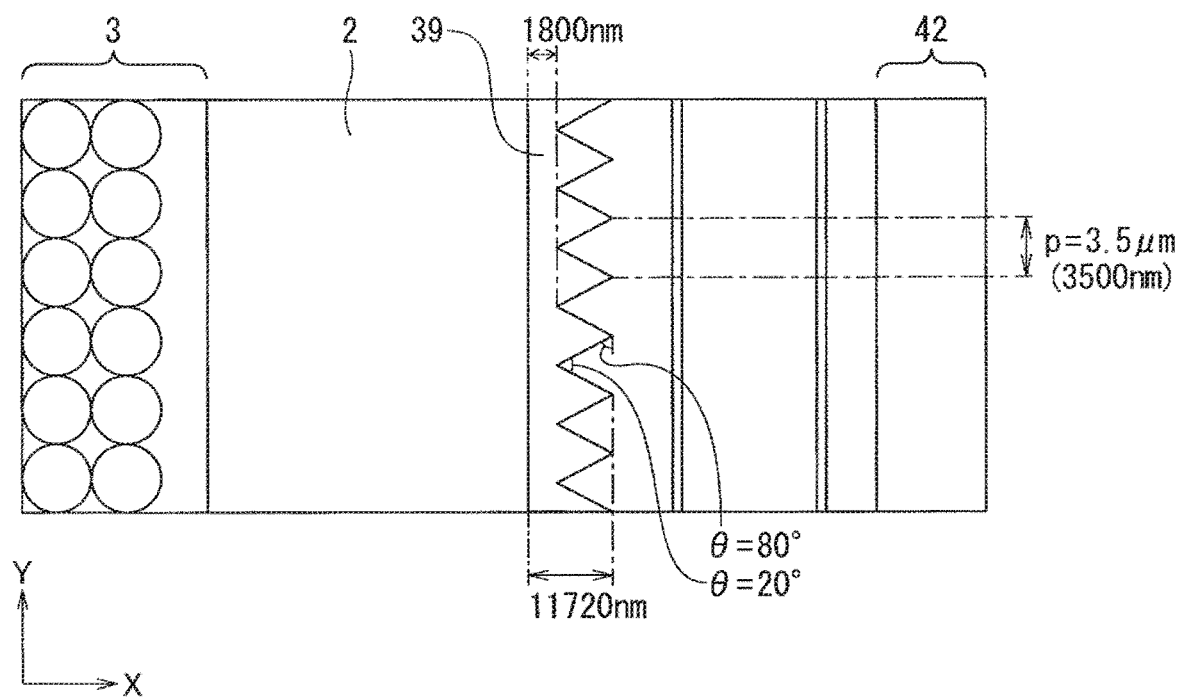
FIG. 29 is a view illustrating a planar configuration of the chip in which one of side wall surfaces of the groove has a sawtooth shape.

Here, for example, in a case where one of the side wall surfaces of the groove 39 has a saw-tooth shape as illustrated in FIG. 29 in order to suppress an occurrence of flare, the width of the groove 39 is to be 11720 nm when a width of each tooth is 3.5 µm, a tip angle is 20°, and a distance between a tip end of the sawtooth shape and another side wall surface is 1800 nm. Therefore, for example, since a region of the groove 39 is larger than that of a case where the side wall surface of the groove 39 does not have a sawtooth shape, it is necessary to change a wiring design under the region of the groove 39.

On the other hand, in the method for manufacturing the solid-state imaging device 1 according to the second embodiment, the width of the groove 39 can be narrowed, and the region of the groove 39 can be reduced. Therefore, the groove 39 can be accommodated within a margin area, and a wiring design under the region of the groove 39 does not need to be changed.

Furthermore, according to the sawtooth shape illustrated in FIG. 29, an occurrence of flare can be suppressed, but the photomask 37 deviates from a mask quality assurance standard.

Therefore, for example, in a case where manufacturing is requested to a mask shop (a reticle maker), there is a possibility that, even if the photomask 37 has a defect, a guarantee such as recreating of the photomask 37 may not be given by the mask shop.

On the other hand, in the solid-state imaging device 1 according to the second embodiment, the photomask 37 can be designed with a pattern such as a square pattern that does not deviate from the mask quality assurance standard. Therefore, if the photomask 37 has a defect, the guarantee can be received from the mask shop.

Furthermore, in the method for manufacturing the solid-state imaging device 1 according to the second embodiment, anisotropic etching and isotropic etching have been performed by using the etching mask (the resist film 33) formed on the back surface S3 (one surface) of the substrate 2 and having the plurality of openings 45 arranged at predetermined intervals so as to surround the pixel region 3 when viewed from the one surface side of the substrate 2. As a result, a photolithography step and an etching step (a step including both anisotropic etching and isotropic etching) only need to be performed once, so that an increase in the number of steps can be suppressed.

2-3 Modification (1) Note that, in the second embodiment, an example has been described in which the etching of the trench part 25 and the etching of the groove 39 are simultaneously performed, but other configurations can also be adopted. For example, in a case of manufacturing the solid-state imaging device 1 (a CMOS image sensor or the like) in which the trench part 25 does not penetrate the substrate 2, an etching depth of the substrate 2 is different between the position where the trench part 25 is formed and the position where the groove 39 is formed. Therefore, it is necessary to perform etching of the trench part 25 and etching of the groove 39 in separate steps. That is, in a step different from the step of forming the trench part 25, the groove 39 is formed so as to surround the pixel region 3 by performing anisotropic etching on the substrate 2 from one surface side of the substrate 2 to form the plurality of openings 46 (second openings) arranged at predetermined intervals on the substrate 2 so as to surround the pixel region 3, and then performing isotropic etching on the substrate 2 from one surface side of the substrate 2 to connect adjacent openings 46 to each other.

Figure 30:
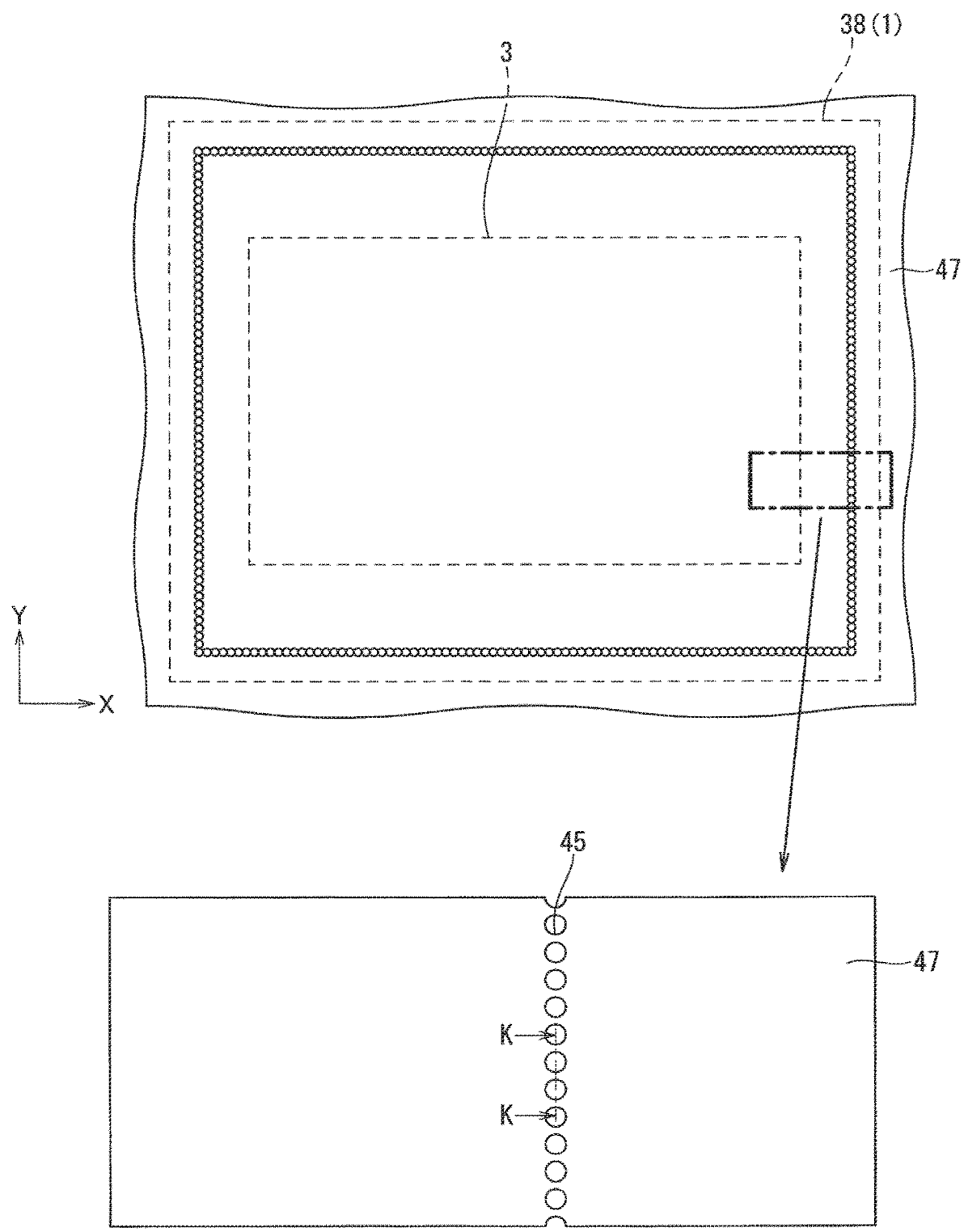
FIG. 30 is a view illustrating a planar configuration of an etching mask used in a manufacturing step for a solid-state imaging device according to a modification.
Figure 31A:
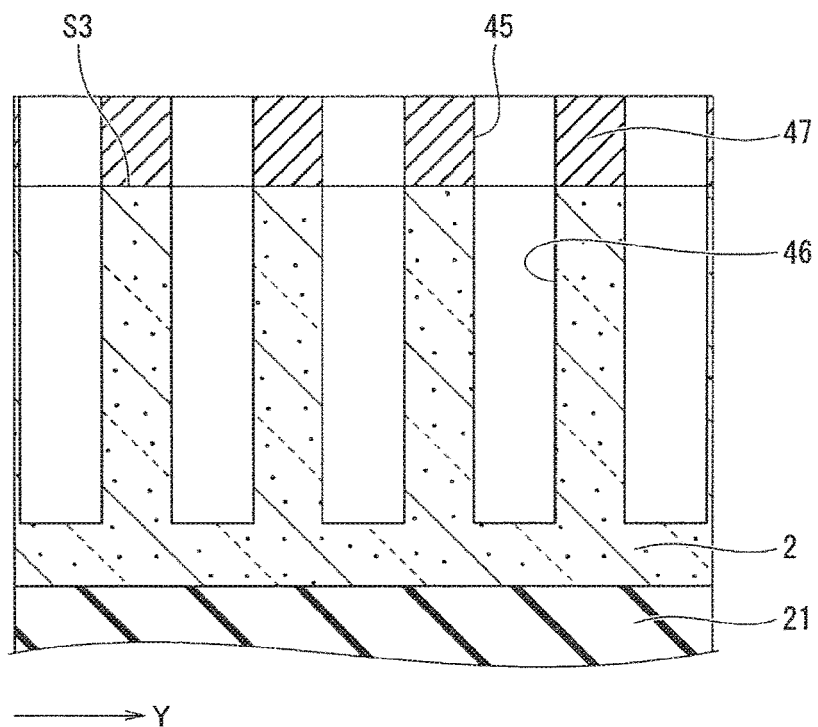
FIG. 31A is a view illustrating a cross-sectional configuration of the substrate in a case of being cut along line K-K in FIG. 30.
Figure 31B:
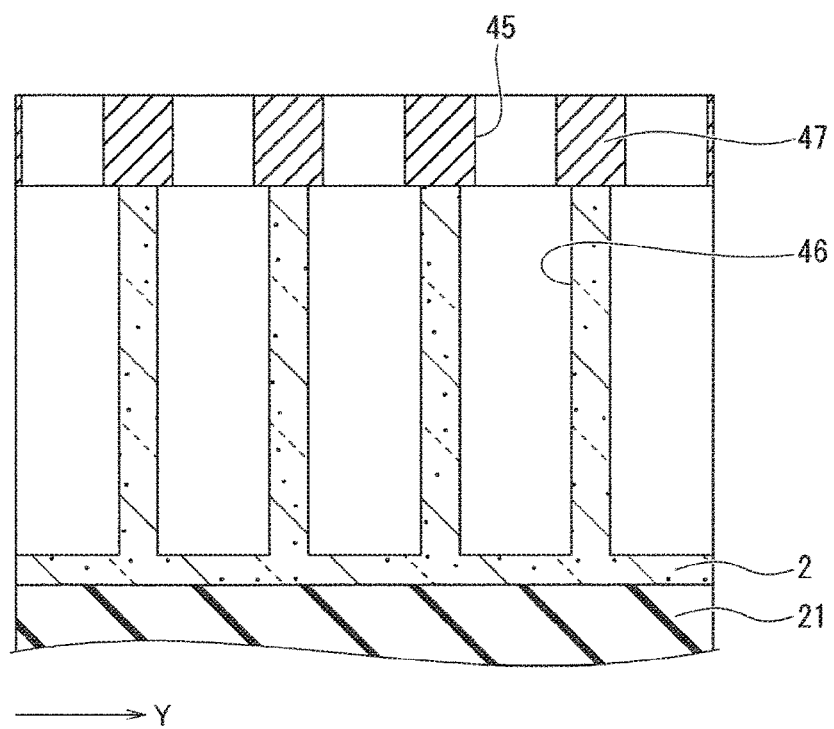
FIG. 31B is a view illustrating a cross-sectional configuration of the substrate after isotropic etching.

For example, after the step of forming the trench part 25, the step of forming the groove 39 is performed. Specifically, first, a resist film 47 is formed on the back surface S3 of the substrate 2 after formation of the trench part 25, and the plurality of openings 45 is formed at intervals from one another along the position where the groove 39 is formed, as illustrated in FIG. 30. That is, when viewed from the back surface S3 side of the substrate 2, the plurality of openings 45 arranged in a lattice shape at predetermined intervals is formed on the resist film 47 so as to surround each pixel region 3. Subsequently, as illustrated in FIG. 31A, anisotropic etching is performed on the substrate 2 from the back surface S3 side of the substrate 2, by using, as an etching mask, the resist film 47 in which the plurality of openings 45 is formed. By the anisotropic etching, the plurality of openings 46 arranged at predetermined intervals is formed on the substrate 2 so as to surround each pixel region 3. Subsequently, as illustrated in FIG. 31B, isotropic etching is performed on the substrate 2 from the back surface S3 side of the substrate 2, by using the etching mask (the resist film 47) used for the anisotropic etching as it is. By the isotropic etching, as illustrated in FIGS. 22A and 22B, the groove 39 is formed on the substrate 2 so as to surround each pixel region 3 by connecting adjacent openings 46 (vertical holes 43) to each other.

Figure 32A:
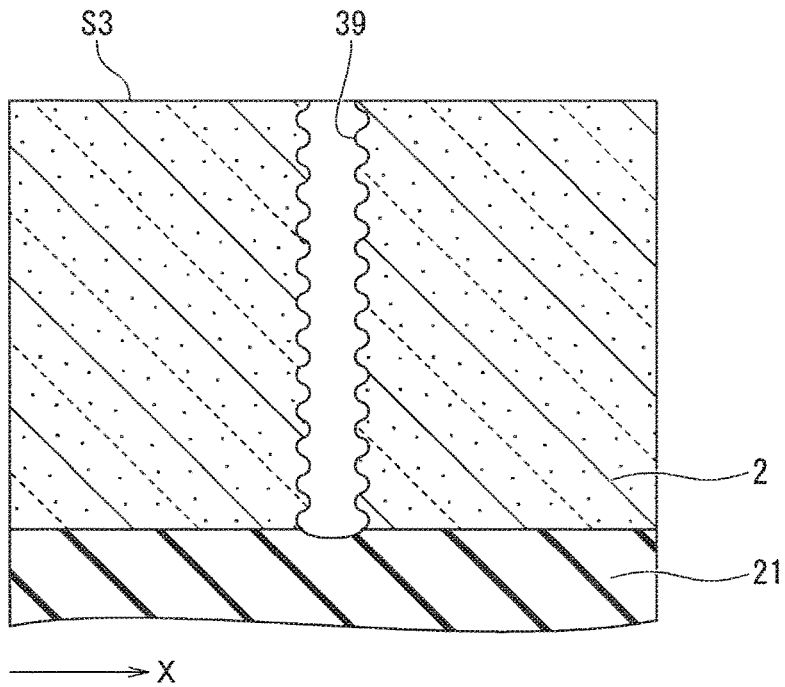
FIG. 32A is a view illustrating a cross-sectional configuration of a groove of a solid-state imaging device according to a modification.

(2) Furthermore, in the second embodiment, an example has been described in which the cross-sectional shape of the side wall surface of the groove 39 in the cross section parallel to the light incident surface (the back surface S3) of the substrate 2 is made a concavo-convex shape (hereinafter also referred to as a "third concavo-convex shape") in which concavity and convexity are repeated along the direction in which the groove 39 extends, but other configurations may also be adopted. For example, in addition to the third concavo-convex shape, as illustrated in FIG. 32A, the cross-sectional shape of the side wall surface of the groove 39 in the cross section perpendicular to the light incident surface (the back surface S3) of the substrate 2 may be made a concavo-convex shape (hereinafter, also referred to as a "fourth concavo-convex shape") in which concavity and convexity are repeated along a depth direction of the groove 39. By having the fourth concavo-convex shape, a reflection direction of light by the side wall surface of the groove 39 can be made further complicated, light incident on the groove 39 can be more strongly scattered, incident light reflected by the side wall surface of the groove 39 can be suppressed from returning to the pixel region 3 side, and an occurrence of flare can be further suppressed.

Figure 32B:
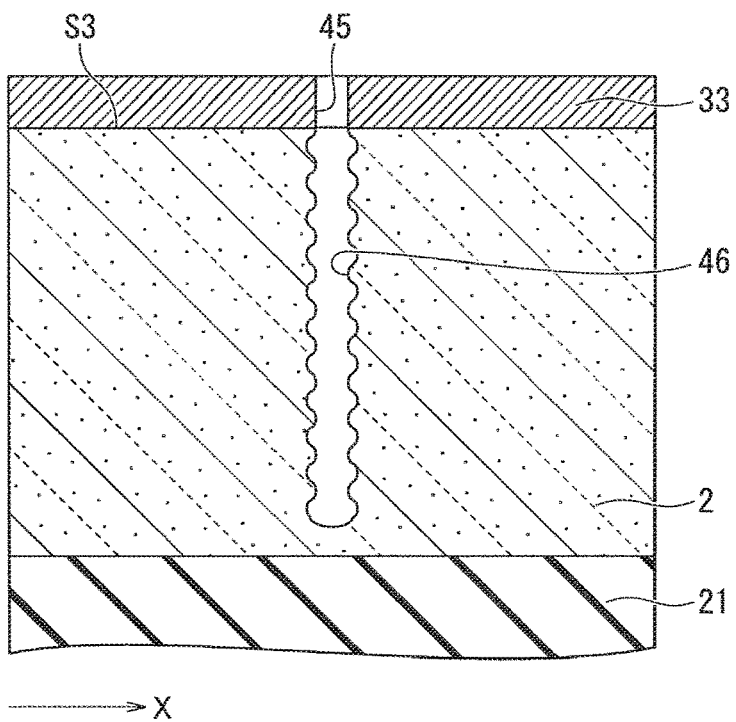
FIG. 32B is a view illustrating a step of forming the groove illustrated in FIG. 32A.

As a method of forming the fourth concavo-convex shape, for example, a method can be adopted in which a concave part called a scallop is formed on the side wall surface of the opening 46 as illustrated in FIG. 32B, by performing anisotropic etching performed on the step of forming the groove 39 by using a Bosch process. By forming the scallop on the side wall surface of the opening 46, the opening 46 is widened while concavity and convexity of the scallop are maintained in the isotropic etching, and the fourth concavo-convex shape can be formed on the side wall surface of the groove 39 as illustrated in FIG. 32A. As a result, the formation of the groove 39 and the formation of the fourth concavo-convex shape on the side wall surface of the groove 39 can be simultaneously performed, and an increase in the number of steps can be suppressed.

Figure 33:
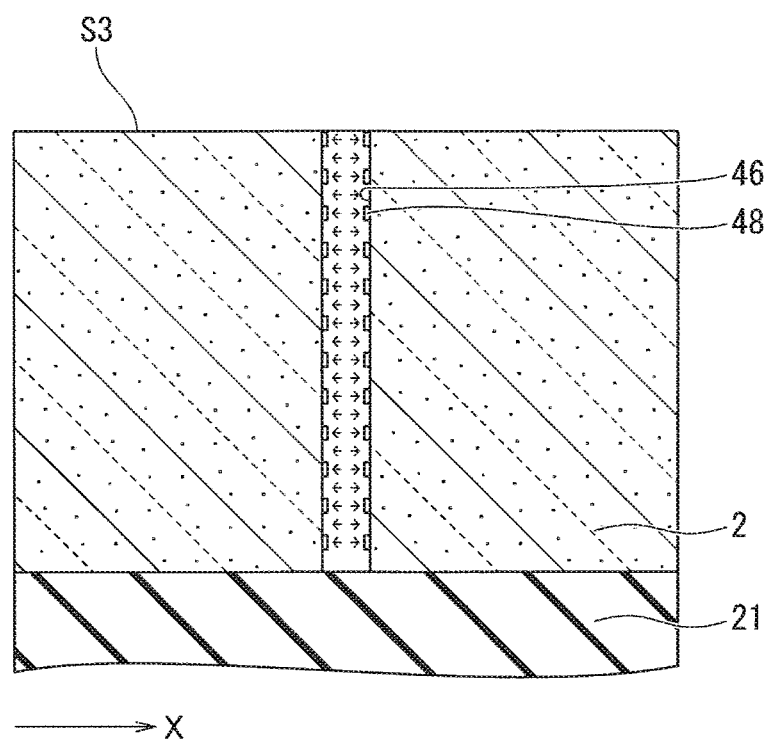
FIG. 33 is a view illustrating a method for forming a concavo-convex shape of the groove.

In this regard, for example, as illustrated in FIG. 33, in a method of forming the fourth concavo-convex shape by isotropic etching using an etching mask 48 having an opening corresponding to a concave part of the fourth concavo-convex shape after forming the groove 39 not having the fourth concavo-convex shape, the number of steps increases.

Figure 34A:
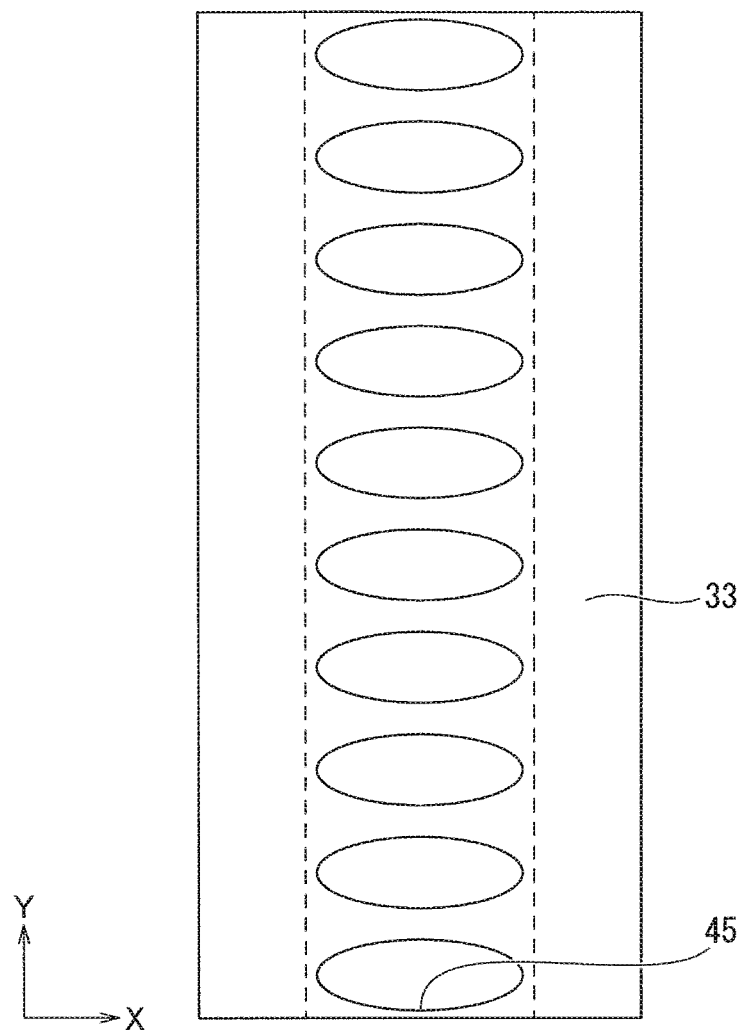
FIG. 34A is a view illustrating a planar configuration of an etching mask according to a modification.
Figure 35A:
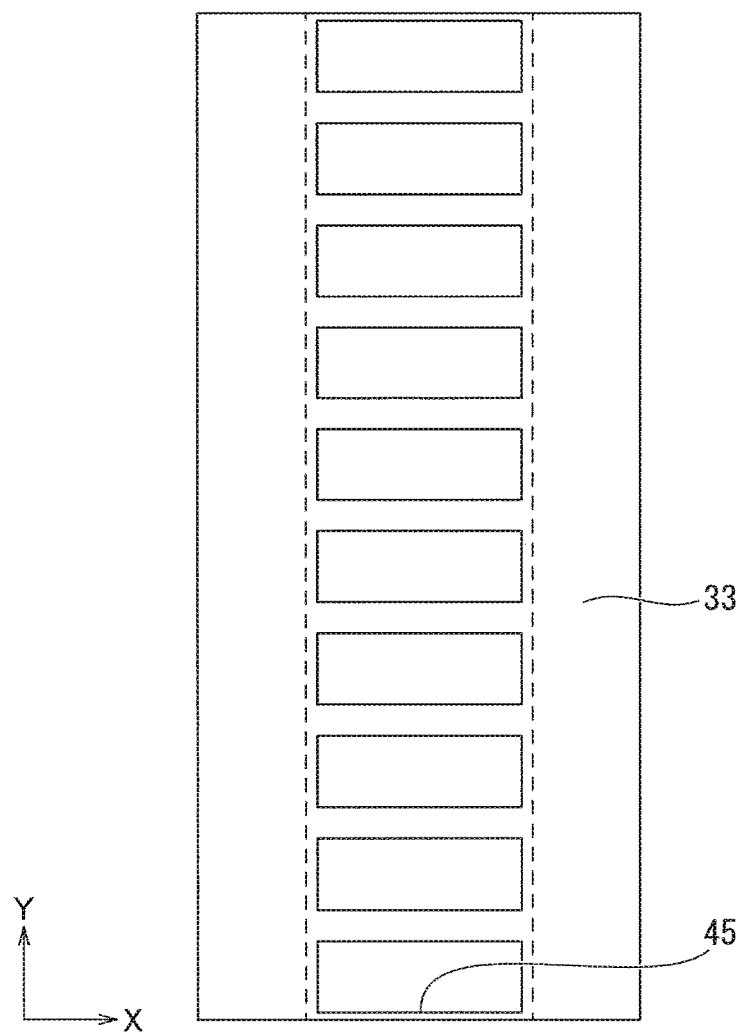
FIG. 35A is a view illustrating a planar configuration of an etching mask according to a modification.
Figure 35B:
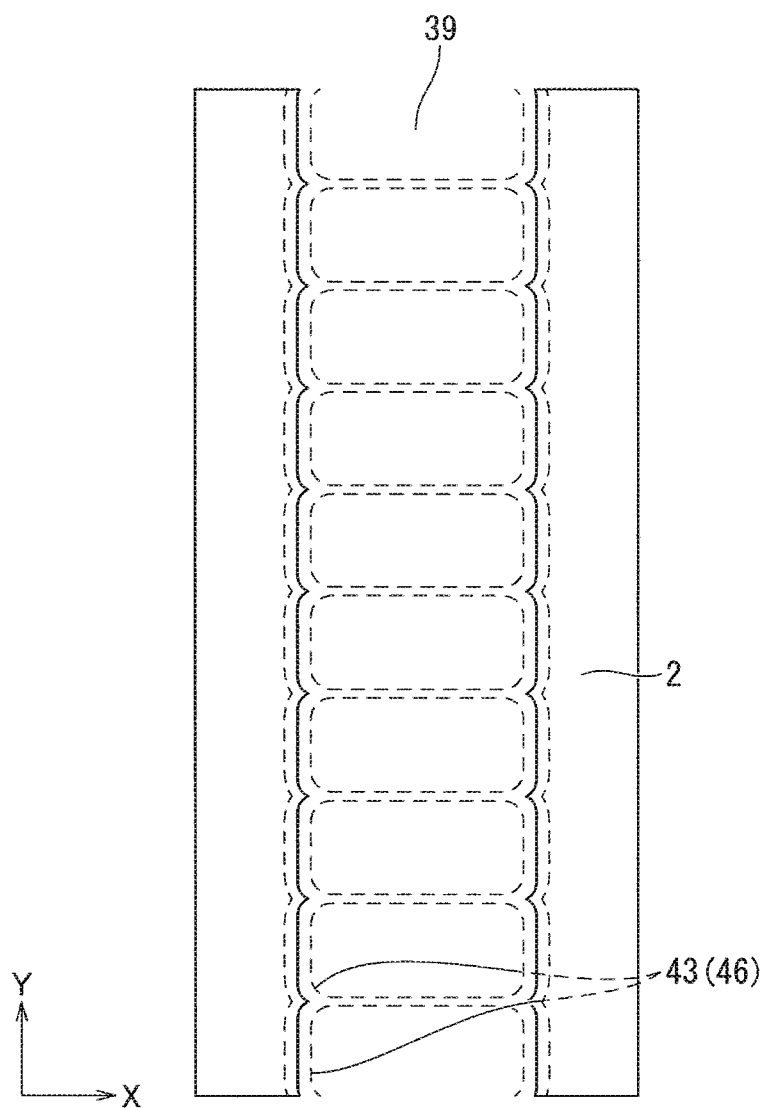
FIG. 35B is an enlarged view illustrating a planar configuration of a groove formed by the etching mask illustrated in FIG. 35A.

(3) Furthermore, in the second embodiment, an example has been described in which the shape of the opening 45 of the etching mask (the resist film 33) is made circular, but other configurations can also be adopted. For example, the shape may be an elliptical shape as illustrated in FIG. 34A, or may be a polygonal shape such as a rectangular shape or a hexagonal shape as illustrated in FIG. 35A. In FIGS. 34A and 35A, a case is exemplified in which the elliptical or polygonal opening 45 extends along a width direction of the groove 39 (a direction orthogonal to the direction in which the groove 39 extends).

Figure 34B:
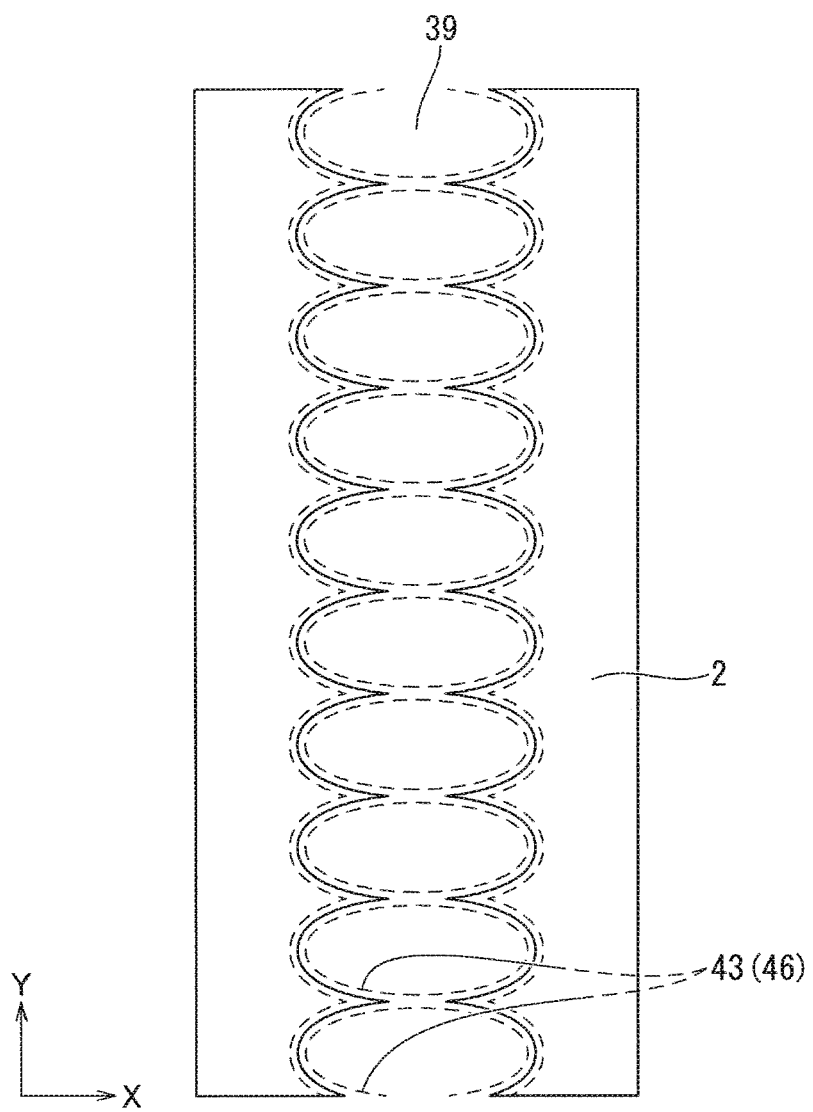
FIG. 34B is an enlarged view illustrating a planar configuration of a groove formed by the etching mask illustrated in FIG. 34A.
Figure 36:
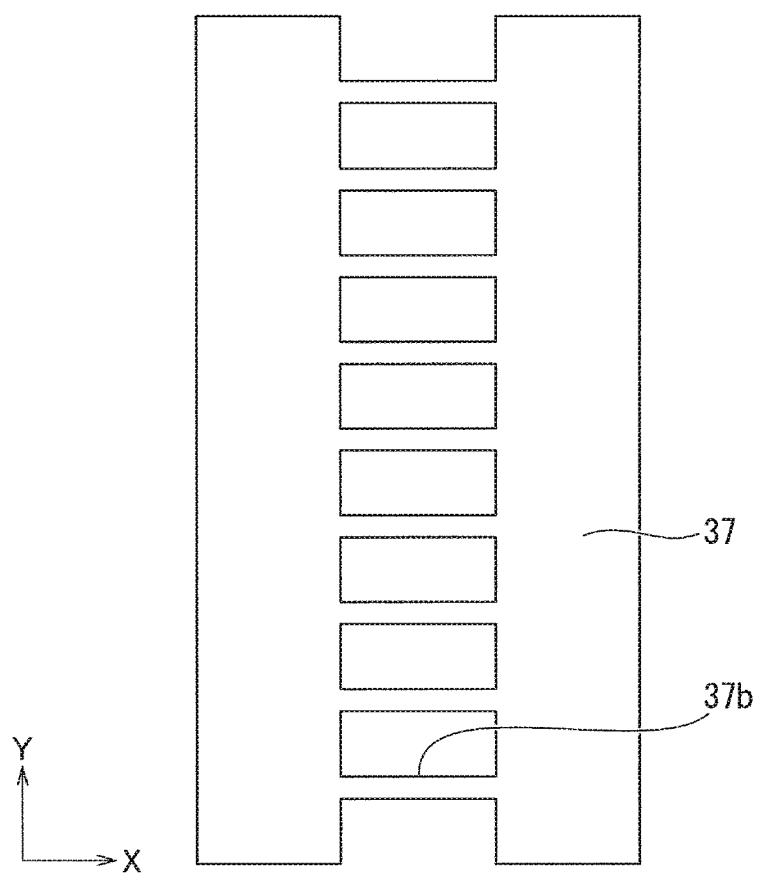
FIG. 36 is a view illustrating a photomask for forming a resist mask illustrated in FIG. 34A.

Note that, in a case where the opening 45 of the resist film 33 has an elliptical shape, the resist film 33 is exposed using a photomask 37 having a rectangular pattern as the polygonal pattern 37b, as illustrated in FIG. 36. In a case where exposure is performed using a photomask 37 having the polygonal pattern 37b (the rectangular pattern) illustrated in FIG. 36, an elliptical pattern in which corner parts of the polygonal pattern 37b (the rectangular pattern) are rounded is transferred to the resist film 33 as illustrated in FIG. 34A. Here, a guaranteed minimum line width of the opening 34 that can be formed on the resist film 33 is a line of 35 nm and a hole of 62.5 nm in a case where immersion is used. Therefore, as illustrated in FIGS. 34B and 33B, for example, when an elliptical shape or a rectangular shape is used as the shape of the opening 34 of the resist film 33, a maximum width of the groove 39 can be narrowed as compared with a case of using a circular shape.

(4) Furthermore, in the second embodiment, an example has been described in which the plurality of openings 45 is aligned in one line so as to surround the pixel region 3 in the etching mask (the resist film 33), but other configurations may also be adopted. For example, as illustrated in FIGS. 37B, 38B, and 39B, the etching mask may have a configuration in which a plurality of lines in which the plurality of openings 45 is aligned so as to surround the pixel region 3 is aligned in a width direction of the groove 39, when viewed from the back surface S3 side (one surface side) of the substrate 2.

Figure 37A:
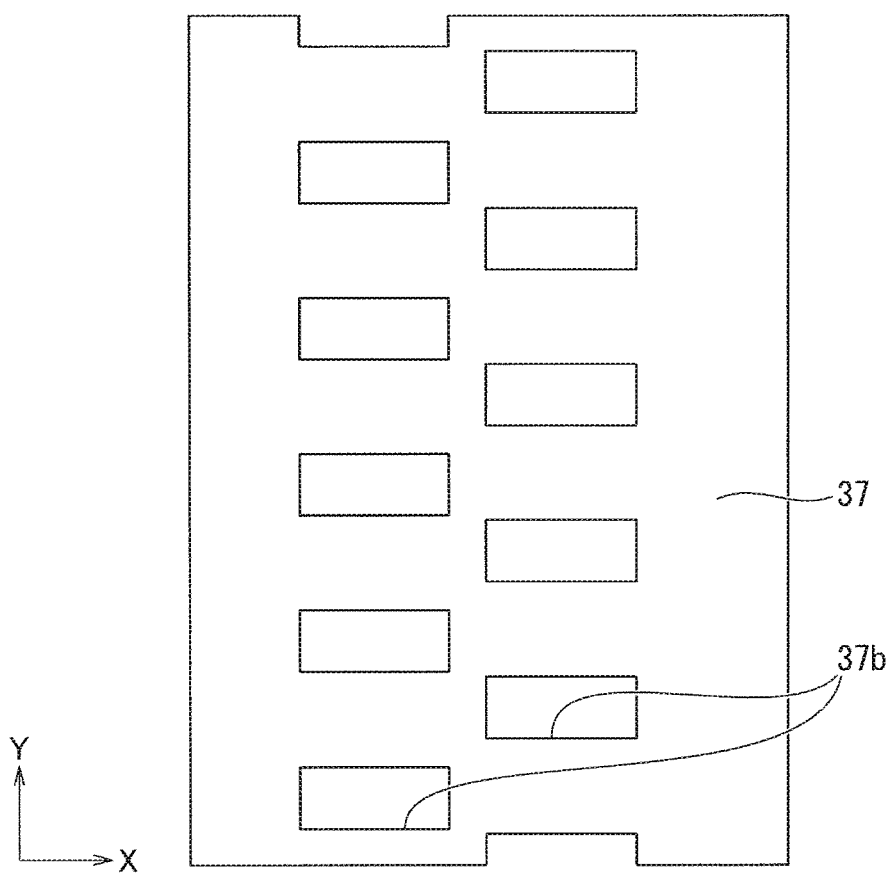
FIG. 37A is a view illustrating a photomask according to a modification.
Figure 37B:
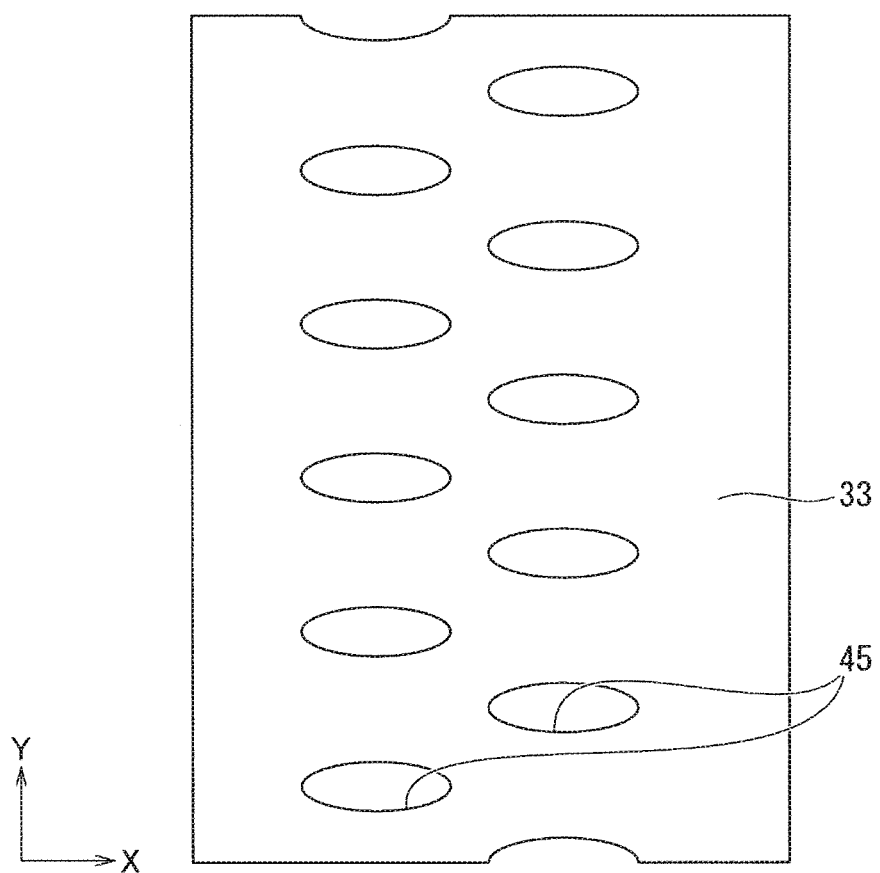
FIG. 37B is a view illustrating an etching mask formed by the photomask in FIG. 37A.
Figure 38A:
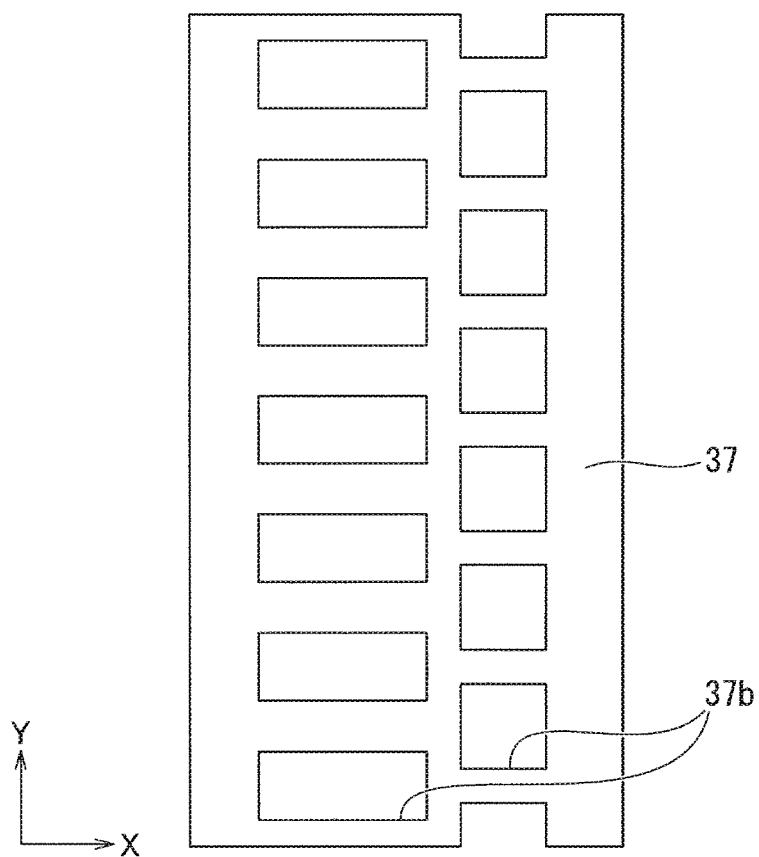
FIG. 38A is a view illustrating a photomask according to a modification.

In FIG. 37B, a case where shapes of the openings 45 are all the same is exemplified. That is, the same shape (for example, an elliptical shape) is used as the shape of each of the plurality of openings 45. In a case where an elliptical shape is used as the shape of the opening 45 of the resist film 33, for example, as illustrated in FIG. 37A, exposure is performed using a photomask 37 having a rectangular pattern as the polygonal pattern 37b. Furthermore, in FIGS. 38B and 39B, a case is exemplified in which the shapes of the openings 45 are different for every line. That is, two or more types of shapes (for example, elliptical and circular shapes) are used as the shape of each of the plurality of openings 45. In a case where two types of elliptical and circular shapes are used as the shapes of the openings 45 of the resist film 33, for example, as illustrated in FIGS. 38A and 39A, the resist film 33 is exposed using a photomask 37 having two types of a rectangular pattern and a square pattern as the polygonal pattern 37b.

Figure 38B:
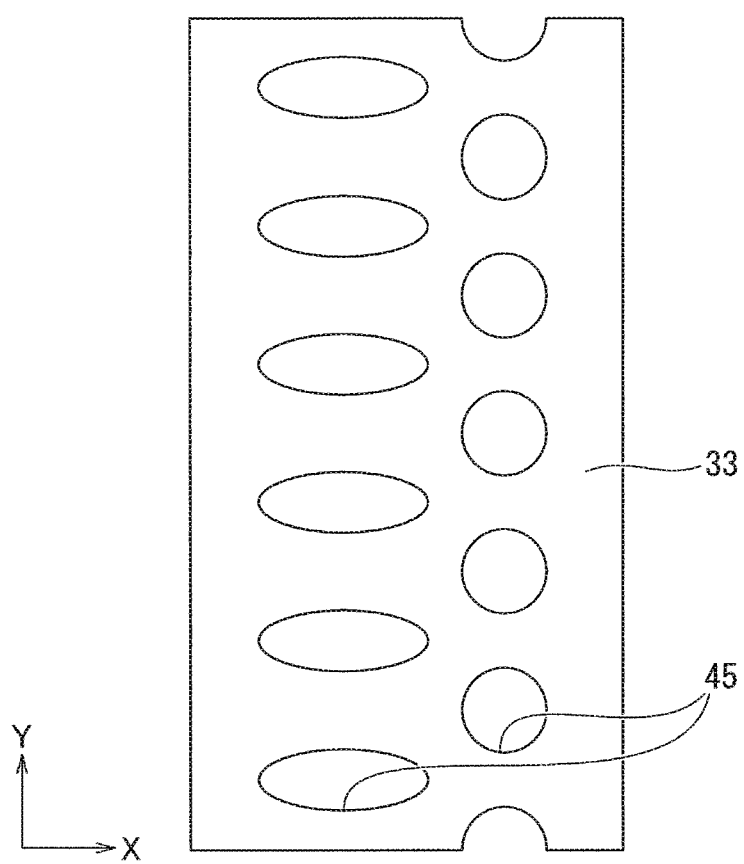
FIG. 38B is a view illustrating an etching mask formed by the photomask in FIG. 38A.
Figure 39A:
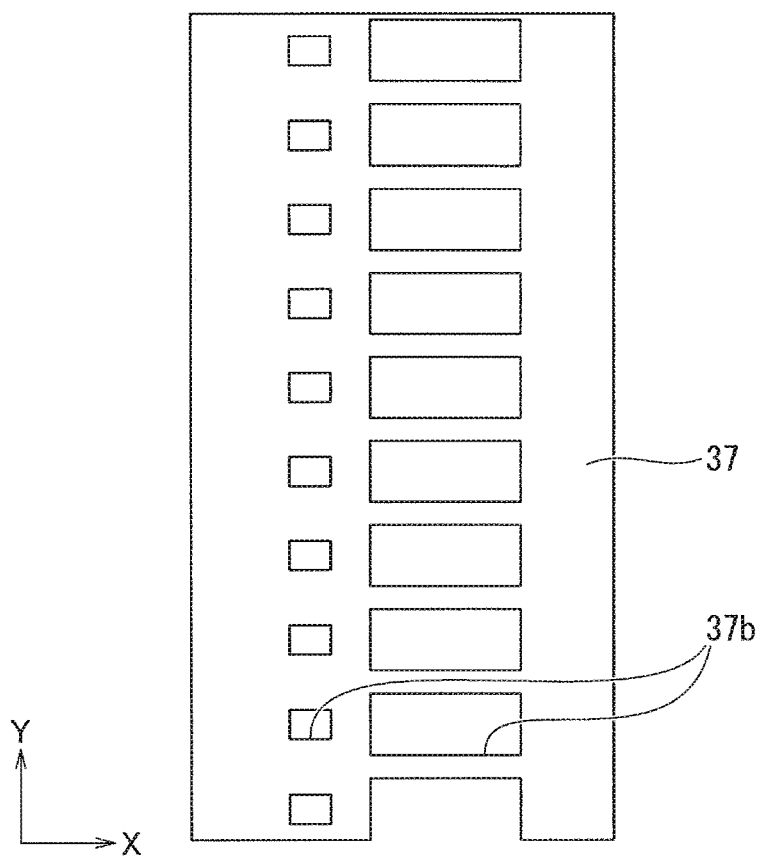
FIG. 39A is a view illustrating a photomask according to a modification.

Furthermore, in FIGS. 37B and 38B, a case is exemplified in which the openings 45 in one line and the openings 45 in another line adjacent to the one line are disposed to be shifted by a half pitch in the direction in which the groove 39 extends. Furthermore, in FIG. 39B, a case is exemplified in which the openings 45 in one line and the openings 45 in another line adjacent to the one line are disposed without being shifted in the direction in which the groove 39 extends.

Figure 37C:
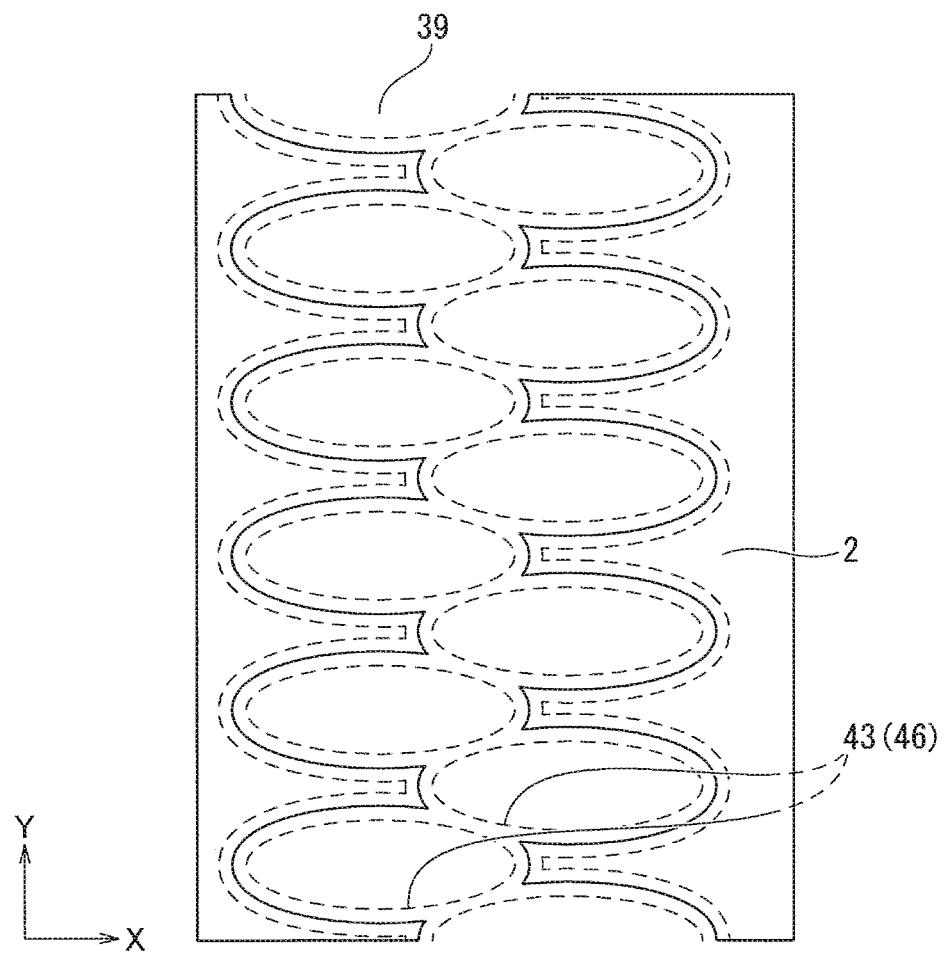
FIG. 37C is an enlarged view illustrating a planar configuration of a groove formed by the etching mask illustrated in FIG. 37B.
Figure 38C:
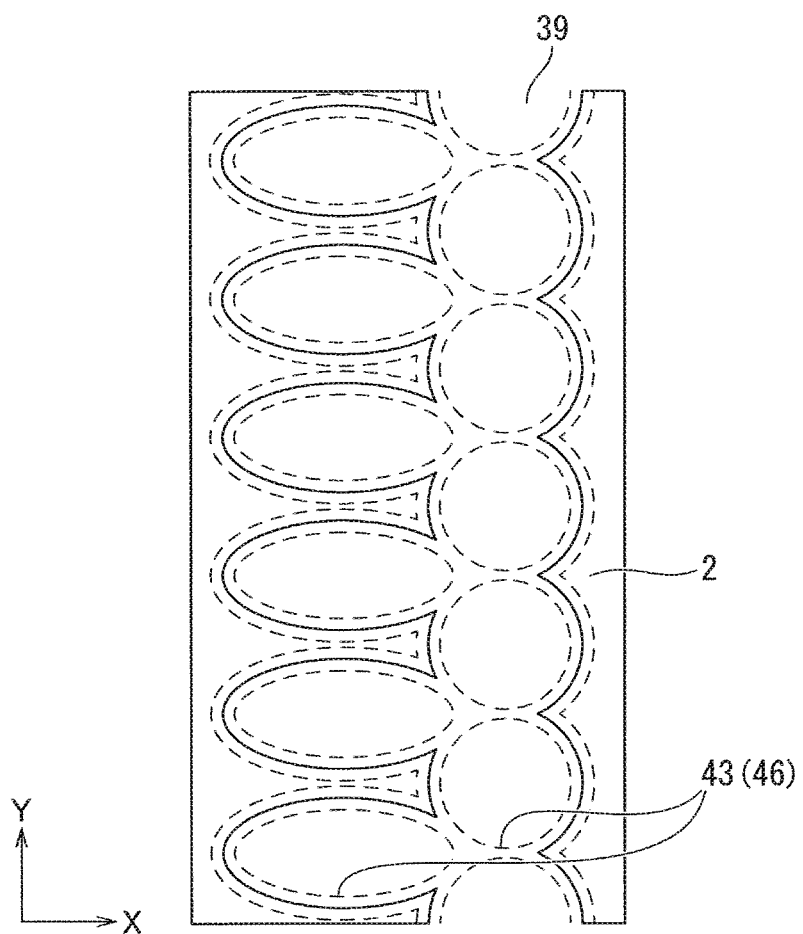
FIG. 38C is an enlarged view illustrating a planar configuration of a groove formed by the etching mask illustrated in FIG. 38B.
Figure 39B:
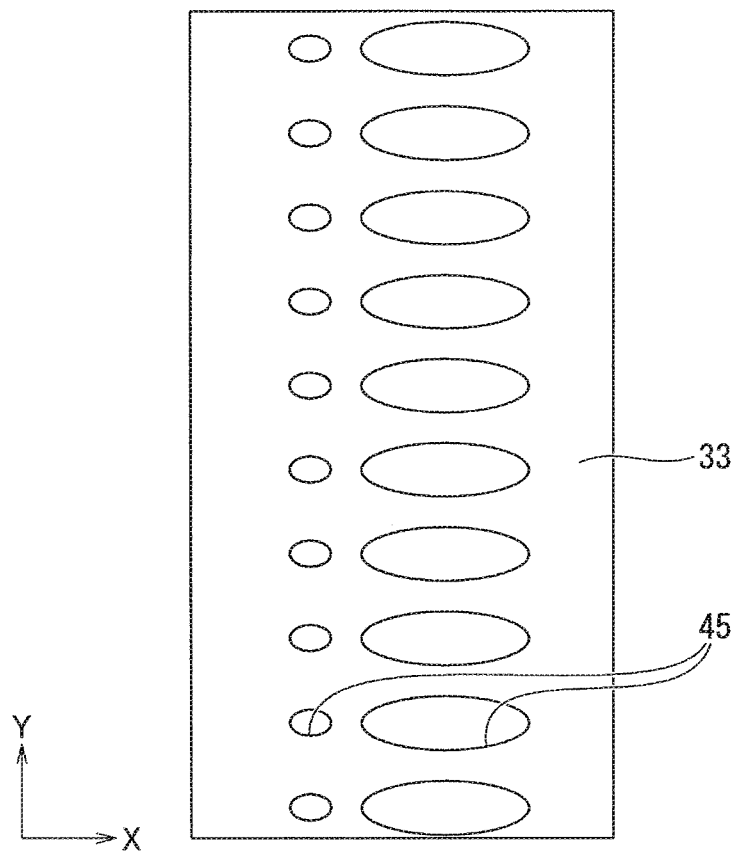
FIG. 39B is a view illustrating an etching mask formed by the photomask in FIG. 39A.
Figure 39C:
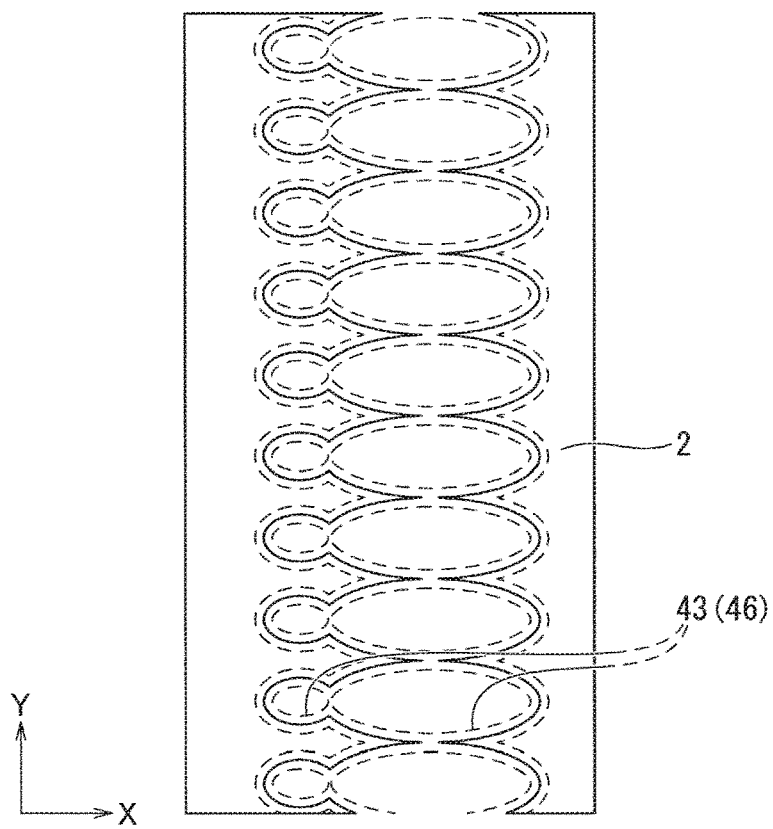
FIG. 39C is an enlarged view illustrating a planar configuration of a groove formed by the etching mask illustrated in FIG. 39B.

Then, by performing isotropic etching in the step of forming the groove 39 by using the etching mask (the resist film 33) illustrated in FIGS. 37B, 38B, and 39B, the openings 46 in one line and the openings 46 in another line adjacent to the one line are connected as illustrated in FIGS. 37C, 38C, and 39C. As a result, the shape of the side wall surface of the groove 39 can be made complicated.

3. Third Embodiment: Example of Application to Electronic Device

The technology according to the present disclosure (the present technology) may be applied to various electronic devices such as, for example, an imaging device such as a digital still camera or a digital video camera, a mobile phone having an imaging function, or other devices having an imaging function.

FIG. 40 is a diagram illustrating an example of a schematic configuration of an electronic device (for example, a camera) to which the technology according to the present disclosure (the present technology) can be applied.

As illustrated in FIG. 40, an electronic device 100 includes a solid-state imaging device 101, an optical lens 102, a shutter device 103, a drive circuit 104, and a signal processing circuit 105.

The optical lens 102 forms an image of image light (incident light 106) from a subject on an imaging surface of the solid-state imaging device 101. As a result, signal charges are accumulated in the solid-state imaging device 101 over a certain period. The shutter device 103 controls a light irradiation period and a light shielding period for the solid-state imaging device 101. The drive circuit 104 supplies a drive signal for controlling a transfer operation of the solid-state imaging device 101 and a shutter operation of the shutter device 103. A signal of the solid-state imaging device 101 is transferred by a drive signal (a timing signal) supplied from the drive circuit 104. The signal processing circuit 105 performs various types of signal processing on a signal (a pixel signal) outputted from the solid-state imaging device 101. A video signal subjected to the signal processing is stored in a storage medium such as a memory or outputted to a monitor.

Note that the electronic device 100 to which the solid-state imaging device 1 can be applied is not limited to a camera, and the solid-state imaging device 1 can also be applied to other electronic devices. For example, the solid-state imaging device 1 may be applied to an imaging device such as a camera module for a mobile device such as a mobile phone or a tablet terminal.

An example of the electronic device to which the technology according to the present disclosure can be applied has been described above. The technology according to the present disclosure can be applied to the solid-state imaging device 101 among the above-described configurations. Specifically, the solid-state imaging device 1 according to the first embodiment, the solid-state imaging device 1 according to the second embodiment, and the solid-state imaging device 1 according to the modifications thereof can be applied to the solid-state imaging device 101. By applying the technology according to the present disclosure to the solid-state imaging device 101, a better captured image can be obtained.

Note that the present technology can have the following configurations.

(1)

A method for manufacturing a light detection device, the method including:
  performing, on a substrate in which a plurality of photoelectric conversion units is formed, anisotropic etching from one surface side of the substrate to form a plurality of openings arranged in a lattice shape at predetermined intervals on the substrate to surround each of the photoelectric conversion units; and then performing isotropic etching from one surface side of the substrate to connect the openings adjacent to each other to form a trench part having a lattice shape on the substrate to surround each of the photoelectric conversion units.

(2)

The method for manufacturing the light detection device according to (2) above, in which
  the anisotropic etching and the isotropic etching are performed using an etching mask that is formed on one surface of the substrate, the etching mask having a plurality of openings arranged in a lattice shape at predetermined intervals to surround each of the photoelectric conversion units when viewed from the one surface side of the substrate.

(3)

The method for manufacturing the light detection device according to (1) or (2) above, in which
  a shape of an opening of the etching mask in a cross section parallel to a light incident surface of the substrate is a circular shape, an elliptical shape, or a polygonal shape.

(4)

The method for manufacturing the light detection device according to any one of (1) to (3) above, the method further including:
  forming a plurality of second openings arranged at predetermined intervals to surround a pixel region having a plurality of the photoelectric conversion units, simultaneously with formation of first openings that are a plurality of openings arranged to surround each of the photoelectric conversion units on the substrate by the anisotropic etching; and connecting the second openings adjacent to each other simultaneously with formation of the trench part on the substrate by connecting the first openings adjacent to each other by the isotropic etching, to form a groove to surround the pixel region.

(5)

The method for manufacturing the light detection device according to (4) above, in which
the anisotropic etching and the isotropic etching are performed using an etching mask that is formed on one surface of the substrate, the etching mask including: a plurality of openings arranged at predetermined intervals to surround the pixel region when viewed from the one surface side of the substrate; and a plurality of openings arranged in a lattice shape at predetermined intervals to surround each of the pixel region.

(6)

The method for manufacturing the light detection device according to (5) above, in which
a shape of an opening of the etching mask is a circular shape, an elliptical shape, or a polygonal shape.

(7)

The method for manufacturing the light detection device according to (5) above, in which
in the etching mask, when viewed from one surface side of the substrate, a plurality of lines in which a plurality of openings is aligned to surround the pixel region is aligned in a width direction of the groove.

(8)

The method for manufacturing the light detection device according to (7) above, in which
as individual shapes of the plurality of openings of the etching mask, shapes identical to one another are used.

(9)

The method for manufacturing the light detection device according to any one of (7) above, in which
two or more kinds of shapes are used as each shape of the plurality of openings of the etching mask.

(10)

The method for manufacturing the light detection device according to any one of (1) to (3) above, further including:
in a step different from a step of forming the trench part, performing anisotropic etching on the substrate from one surface side of the substrate to form a plurality of openings arranged at predetermined intervals on the substrate to surround a pixel region having a plurality of the photoelectric conversion units, and then performing isotropic etching from one surface side of the substrate to connect the second openings adjacent to each other, to form a groove to surround the pixel region.

(11)

The method for manufacturing the light detection device according to any one of (1) to (19) above, in which
the anisotropic etching is performed using a Bosch process.

(12)

A light detection device including:
a substrate;
a plurality of photoelectric conversion units formed in the substrate; and
a trench part having a lattice shape and formed on the substrate to surround each of the photoelectric conversion units, in which
a cross-sectional shape of a side wall surface of the trench part in a cross section parallel to a light incident surface of the substrate is a concavo-convex shape in which concavity and convexity are repeated along a longitudinal direction of a linear trench part constituting the trench part.

(13)

The light detection device according to (12) above, in which
the concavo-convex shape is a wave shape in which arcs having a radius of 50 nm or more and 150 nm or less are continuous.

(14)

The light detection device according to (12) or (13) above, in which
a cross-sectional shape of a side wall surface of the trench part in a cross section perpendicular to the light incident surface of the substrate is a concavo-convex shape in which concavity and convexity are repeated along a depth direction of the trench part.

(15)

The light detection device according to any one of (12) to (14) above, in which
the light detection device is a CMOS image sensor in which a color filter layer having a plurality of color filters and a microlens array having a plurality of microlenses are layered in this order on the light incident surface side of the substrate.

(16)

The light detection device according to (15) above, in which
the microlens is formed for each photoelectric conversion unit group including the photoelectric conversion units disposed in a 2×2 matrix shape.

(17)

The light detection device according to any one of (12) to (14) above, in which
the light detection device is a distance measuring sensor in which a microlens array including a plurality of microlenses is layered on the light incident surface side of the substrate.

(18)

The light detection device according to any one of (12) to (17) above, further including:
a groove formed to surround a pixel region including the plurality of photoelectric conversion units, the groove being formed between the pixel region and a blade region surrounding the pixel region in the substrate, in which
a cross-sectional shape of a side wall surface of the groove in a cross section parallel to the light incident surface of the substrate is a concavo-convex shape in which concavity and convexity are repeated along a direction in which the groove extends.

(19)

The light detection device according to (18) above, in which
a maximum width of the groove is 500 nm or less.

(20)

An electronic device including:
a light detection device including a substrate, a plurality of photoelectric conversion units formed in the substrate, and a trench part having a lattice shape and formed on the substrate to surround each of the photoelectric conversion units, in which a cross-sectional shape of a side wall surface of the trench part in a cross section parallel to a light incident surface of the substrate is a concavo-convex shape in which concavity and convexity are repeated along a longitudinal direction of a linear trench part constituting the trench part;
an optical lens configured to form an image of image light from a subject on an imaging surface of the light detection device; and a signal processing circuit configured to perform signal processing on a signal outputted from the light detection device.

(21) A method for manufacturing a light detection device, the method including:
performing anisotropic etching on a substrate in which a plurality of photoelectric conversion units is formed from one surface side of the substrate to form a plurality of openings arranged at predetermined intervals from one another on the substrate, and then performing isotropic etching from one surface side of the substrate to connect the openings adjacent to each other, to form a groove on the substrate along an arrangement direction of the openings.

(22) The method for manufacturing the light detection device according to (21) above, in which
each of a plurality of the openings is an opening arranged at a predetermined interval from one another to surround each of the photoelectric conversion units, and
the groove is a trench part disposed to surround each of the photoelectric conversion units.

(23) The light detection device according to (21) above, in which
each of a plurality of the openings is an opening arranged at a predetermined interval from one another to surround a pixel region including the plurality of photoelectric conversion units, and
the groove is a groove disposed to surround the pixel region.

(24) A light detection device including:
a substrate;
a plurality of photoelectric conversion units formed in the substrate; and
a trench part formed on the substrate to surround each of the photoelectric conversion units, in which
a cross-sectional shape of a side wall surface of the trench part in a cross section parallel to a light incident surface of the substrate is a concavo-convex shape in which concavity and convexity are repeated along a direction in which the trench part extends.

(25) A light detection device including:
a substrate;
a plurality of photoelectric conversion units formed in the substrate; and
a groove formed to surround a pixel region including the plurality of photoelectric conversion units, the groove being formed between the pixel region and a blade region surrounding the pixel region in the substrate, in which
a cross-sectional shape of a side wall surface of the groove in a cross section parallel to a light incident surface of the substrate is a concavo-convex shape in which concavity and convexity are repeated along a direction in which the groove extends, and
a maximum width of the groove is 500 nm or less.

(26) An electronic device including:
a light detection device including a substrate, a plurality of photoelectric conversion units formed in the substrate, and a light detection device including a groove formed to surround a pixel region including the plurality of photoelectric conversion units, the groove being formed between the pixel region and a blade region surrounding the pixel region in the substrate, in which a cross-sectional shape of a side wall surface of the groove in a cross section parallel to a light incident surface of the substrate is a concavo-convex shape in which concavity and convexity are repeated along a direction in which the groove extends, and a maximum width of the groove is 500 nm or less.

REFERENCE SIGNS LIST

1 Solid-state imaging device
2 Substrate
3 Pixel region
4 Vertical drive circuit
5 Column signal processing circuit
6 Horizontal drive circuit unit
7 Output circuit
8 Control circuit
9 Pixel
10 Pixel drive wiring
11 Vertical signal line
12 Horizontal signal line
13 Fixed charge film
14 Insulating film
15 Light shielding film
16 Planarization film
17 Light receiving layer
18 Color filter layer
19 Microlens array
20 Light condensing layer
21 Wiring layer
22 Supporting substrate
23 Photoelectric conversion unit
23a Corner part
24 Pixel separation part
25 Trench part
26 Vertical hole
27 Intersection part
28 Concave part
29 Color filter
30 Microlens
31 Interlayer insulating film
32 Wiring
33 Resist film
34 Opening
35 Opening
36 Photoelectric conversion unit group
37 Photomask
38 Chip
39 Groove
40 Sensor substrate
41 Logic substrate
42 Blade region
43 Vertical hole
44 Concave part
45 Opening
46 Opening
47 Resist film
100 Electronic device
101 Solid-state imaging device
102 Optical lens
103 Shutter device
104 Drive circuit
105 Signal processing circuit
106 Incident light

The invention claimed is:

1. A method for manufacturing a light detection device, the method comprising:
performing, on a substrate in which a plurality of photoelectric conversion units is formed, anisotropic etching from one surface side of the substrate to form a plurality of openings arranged in a lattice shape at predetermined intervals on the substrate to surround each of the photoelectric conversion units; and then performing isotropic etching from the one surface side of the substrate to connect the plurality of openings adjacent to each other to form a trench part having a lattice shape on the substrate to surround each of the photoelectric conversion units.

2. The method for manufacturing the light detection device according to claim 1, wherein
the anisotropic etching and the isotropic etching are performed using an etching mask that is formed on the one surface side of the substrate, the etching mask having a plurality of openings arranged in a lattice shape at predetermined intervals to surround each of the photoelectric conversion units when viewed from the one surface side of the substrate.

3. The method for manufacturing the light detection device according to claim 2, wherein
a shape of an opening of the plurality of openings of the etching mask in a cross section parallel to a light incident surface of the substrate includes a circular shape, an elliptical shape, or a polygonal shape.

4. The method for manufacturing the light detection device according to claim 1, further comprising:
forming a plurality of second openings arranged at predetermined intervals to surround a pixel region having a plurality of the photoelectric conversion units, simultaneously with formation of first openings that are the plurality of openings arranged to surround each of the photoelectric conversion units on the substrate by the anisotropic etching; and connecting the plurality of second openings adjacent to each other simultaneously with formation of the trench part on the substrate by connecting the first openings adjacent to each other by the isotropic etching, to form a groove to surround the pixel region.

5. The method for manufacturing the light detection device according to claim 4, wherein
the anisotropic etching and the isotropic etching are performed using an etching mask that is formed on the one surface side of the substrate, the etching mask including: a first plurality of openings arranged at predetermined intervals to surround the pixel region when viewed from the one surface side of the substrate; and a second plurality of openings arranged in a lattice shape at predetermined intervals to surround each of the pixel region.

6. The method for manufacturing the light detection device according to claim 5, wherein
a shape of an opening of the first plurality of openings or the second plurality of openings of the etching mask includes a circular shape, an elliptical shape, or a polygonal shape.

7. The method for manufacturing the light detection device according to claim 5, wherein
in the etching mask, when viewed from the one surface side of the substrate, a plurality of lines in which the second plurality of openings is aligned to surround the pixel region is aligned in a width direction of the groove.

8. The method for manufacturing the light detection device according to claim 7, wherein
as individual shapes of the first plurality of openings or the second plurality of openings of the etching mask, shapes identical to one another are used.

9. The method for manufacturing the light detection device according to claim 7, wherein
two or more kinds of shapes are used as each shape of the first plurality of openings or the second plurality of openings of the etching mask.

10. The method for manufacturing the light detection device according to claim 1, further comprising:
in a step different from a step of forming the trench part, performing anisotropic etching on the substrate from the one surface side of the substrate to form a plurality of second openings arranged at predetermined intervals on the substrate to surround a pixel region having a plurality of the photoelectric conversion units, and then performing isotropic etching from the one surface side of the substrate to connect the plurality of second openings adjacent to each other, to form a groove to surround the pixel region.

11. The method for manufacturing the light detection device according to claim 1, wherein
the anisotropic etching is performed using a Bosch process.

12. A light detection device comprising:
a substrate;
a plurality of photoelectric conversion units formed in the substrate; and
a trench part having a lattice shape and formed on the substrate to surround each of the plurality of photoelectric conversion units, wherein
a cross-sectional shape of a side wall surface of the trench part in a cross section parallel to a light incident surface of the substrate includes a concavo-convex shape in which concavity and convexity are repeated along a longitudinal direction of a linear trench part constituting the trench part.

13. The light detection device according to claim 12, wherein
the concavo-convex shape includes a wave shape in which arcs having a radius of 50 nm or more and 150 nm or less are continuous.

14. The light detection device according to claim 12, wherein
a cross-sectional shape of a side wall surface of the trench part in a cross section perpendicular to the light incident surface of the substrate includes a concavo-convex shape in which concavity and convexity are repeated along a depth direction of the trench part.

15. The light detection device according to claim 12, wherein
the light detection device further includes a CMOS image sensor in which a color filter layer having a plurality of color filters and a microlens array having a plurality of microlenses are layered in this order on a light incident surface side of the substrate.

16. The light detection device according to claim 15, wherein
the microlens array includes a microlens formed for each photoelectric conversion unit group including the plurality of photoelectric conversion units disposed in a 2×2 matrix shape.

17. The light detection device according to claim 12, wherein the light detection device further includes a distance measuring sensor in which a microlens array including a plurality of microlenses is layered on a light incident surface side of the substrate.

18. The light detection device according to claim 12, further comprising:

a groove formed to surround a pixel region including the plurality of photoelectric conversion units, the groove being formed between the pixel region and a blade region surrounding the pixel region in the substrate, wherein a cross-sectional shape of a side wall surface of the groove in a cross section parallel to the light incident surface of the substrate includes a concavo-convex shape in which concavity and convexity are repeated along a direction in which the groove extends.

19. The light detection device according to claim 18, wherein a maximum width of the groove is 500 nm or less.

20. An electronic device, comprising:

a light detection device including a substrate, a plurality of photoelectric conversion units formed in the substrate, and a trench part having a lattice shape and formed on the substrate to surround each of the plurality of photoelectric conversion units, wherein a cross-sectional shape of a side wall surface of the trench part in a cross section parallel to a light incident surface of the substrate includes a concavo-convex shape in which concavity and convexity are repeated along a longitudinal direction of a linear trench part constituting the trench part;

an optical lens configured to form an image of image light from a subject on an imaging surface of the light detection device; and a signal processing circuit configured to perform signal processing on a signal outputted from the light detection device.

* * * * *